(12) United States Patent
Eckes et al.

(10) Patent No.: US 9,644,070 B2
(45) Date of Patent: May 9, 2017

(54) CROSS-LINKABLE AND CROSS-LINKED POLYMERS, PROCESS FOR THE PREPARATION THEREOF, AND THE USE THEREOF

(71) Applicant: Merck Patent GmbH, Darmstadt (DE)

(72) Inventors: Fabrice Eckes, Darmstadt (DE); Anja Gerhard, Egelsbach (DE); Anna Hayer, Mainz (DE); Holger Heil, Frankfurt am Main (DE); Dominik Joosten, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 43 days.

(21) Appl. No.: 14/391,409

(22) PCT Filed: Apr. 12, 2013

(86) PCT No.: PCT/EP2013/001067
§ 371 (c)(1),
(2) Date: Oct. 9, 2014

(87) PCT Pub. No.: WO2013/156125
PCT Pub. Date: Oct. 24, 2013

(65) Prior Publication Data
US 2015/0108408 A1    Apr. 23, 2015

(30) Foreign Application Priority Data
Apr. 17, 2012  (EP) .................................... 12002655

(51) Int. Cl.
| | |
|---|---|
| *C08G 73/02* | (2006.01) |
| *C08G 61/12* | (2006.01) |
| *C08L 65/00* | (2006.01) |
| *C08L 79/02* | (2006.01) |
| *H01L 51/00* | (2006.01) |
| *C08G 61/10* | (2006.01) |
| *H01L 51/50* | (2006.01) |

(52) U.S. Cl.
CPC ........... *C08G 73/026* (2013.01); *C08G 61/10* (2013.01); *C08G 61/12* (2013.01); *C08G 61/128* (2013.01); *C08G 73/0273* (2013.01); *C08L 65/00* (2013.01); *C08L 79/02* (2013.01); *H01L 51/0035* (2013.01); *H01L 51/0039* (2013.01); *H01L 51/0043* (2013.01); *H01L 51/5012* (2013.01); *C08G 2261/12* (2013.01); *C08G 2261/135* (2013.01); *C08G 2261/148* (2013.01); *C08G 2261/1412* (2013.01); *C08G 2261/312* (2013.01); *C08G 2261/3142* (2013.01); *C08G 2261/3162* (2013.01); *C08G 2261/411* (2013.01); *C08G 2261/76* (2013.01); *C08G 2261/95* (2013.01); *H01L 51/0037* (2013.01); *H01L 51/0067* (2013.01); *H01L 51/0085* (2013.01); *H01L 51/50* (2013.01); *H01L 51/5056* (2013.01); *H01L 51/5072* (2013.01); *H01L 51/5088* (2013.01); *Y02E 10/549* (2013.01)

(58) Field of Classification Search
CPC ............. C08G 73/026; H01L 51/0043; H01L 51/0035; H01L 51/5012
USPC ......................................... 252/500; 528/7, 8
See application file for complete search history.

(56) References Cited

U.S. PATENT DOCUMENTS

| | | | | |
|---|---|---|---|---|
| 9,102,797 | B2* | 8/2015 | Schulte | C08G 61/12 |
| 2006/0210827 | A1* | 9/2006 | Becker | C09K 11/06 |
| | | | | 428/690 |
| 2007/0228364 | A1 | 10/2007 | Radu et al. | |
| 2011/0042661 | A1* | 2/2011 | Endo | C08G 61/12 |
| | | | | 257/40 |
| 2014/0138661 | A1* | 5/2014 | Ludemann | H01L 51/0061 |
| | | | | 257/40 |

FOREIGN PATENT DOCUMENTS

| | | |
|---|---|---|
| CN | 1946758 A | 4/2007 |
| EP | 1724294 A1 | 11/2006 |
| EP | 2272894 A1 | 1/2011 |
| TW | 200942564 A | 10/2009 |
| TW | 201006865 A | 2/2010 |
| WO | WO-2005/053056 A1 | 6/2005 |
| WO | WO-2006/043087 A1 | 4/2006 |
| WO | WO-2011/062802 A1 | 5/2011 |

OTHER PUBLICATIONS

International Search Report for PCT/EP2013/001067 mailed Jul. 19, 2013.

* cited by examiner

*Primary Examiner* — Douglas McGinty

(57) ABSTRACT

The present invention relates to cross-linkable and cross-linked polymers, methods for the production thereof, the use of said cross-linked polymers in electronic devices, especially in OLEDs (OLED=Organic Light Emitting Diode), and to electronic devices, especially organic electroluminescent devices which contain the cross-linked polymers.

21 Claims, No Drawings

CROSS-LINKABLE AND CROSS-LINKED POLYMERS, PROCESS FOR THE PREPARATION THEREOF, AND THE USE THEREOF

CROSS-REFERENCE TO RELATED APPLICATIONS

This application is a national stage application (under 35 U.S.C. §371) of PCT/EP2013/001067, filed Apr. 12, 2013, which claims benefit of European Application No. 12002655.4, filed Apr. 17, 2012, both of which are incorporated herein by reference in their entirety.

The present invention relates to crosslinkable and cross-linked polymers, to a process for the preparation thereof, to the use of these crosslinked polymers in electronic devices, in particular in organic electroluminescent devices, so-called OLEDs (OLED=organic light-emitting diode), and to electronic devices, in particular organic electroluminescent devices, comprising these crosslinked polymers.

In electronic devices, such as OLEDs, components of various functionality are required. In OLEDs, the different functionalities are normally present in different layers. In this case, the term multilayered OLED systems is used. These multilayered OLED systems have, inter alia, charge-transporting layers, such as electron- and hole-conductor layers, and layers which comprise light-emitting components. These multilayered OLED systems are generally produced by the successive layer-by-layer application of the individual layers. The individual layers here can either be applied by vapour deposition in a high vacuum or from solution. Vapour deposition in a high vacuum is only possible for low-molecular-weight compounds, since only they can be evaporated without decomposition. In addition, application in a high vacuum is very expensive. Application from solution is therefore preferred. However, this requires that the individual materials are soluble in the corresponding solvents or solvent mixtures. A further prerequisite for the application of a plurality of layers from solution is that, on application of each individual layer, the layer applied previously is not partially or fully dissolved again by the solution of the subsequent layer. This can be achieved, for example, by each layer applied, which is, for example, a polymer layer, being crosslinked in order to make it insoluble, before the next layer is applied. Such processes for the crosslinking of polymer layers are described, for example, in EP 0 637 899 and WO 96/20253.

Crosslinkable polymers can be prepared by various processes. One possibility consists in bonding the crosslinkable group directly to a monomer, which then becomes a constituent of a crosslinkable polymer through polymerisation, optionally with further monomers. Corresponding preparation processes for crosslinkable polymers are described, for example, in WO 2006/043087, in WO 2005/049689, in WO 2005/052027 and in US 2007/0228364. Under certain circumstances, side reactions may occur in these processes caused by the crosslinkable group already reacting during the polymerisation and thus resulting in direct crosslinking of the polymer during the polymerisation.

Alternatively, it is proposed in WO 2010/097155 to bond an aldehyde group to a monomer, then to polymerise this monomer, optionally together with further monomers, and only subsequently to convert the aldehyde group of the polymer into a crosslinkable group, for example a vinyl group.

However, OLEDs comprising the crosslinkable or crosslinked materials known from the prior art do not have the desired voltages, efficiencies and/or lifetimes.

It was accordingly one of the objects of the present invention to provide crosslinkable polymers which on the one hand crosslink to an adequate extent, but on the other hand also result in an improvement in the voltage, efficiency and/or lifetime in OLEDs.

This object is achieved by the provision of a polymer which contains both triarylamine units and also aromatic or heteroaromatic diamine units, where at least one of these units contains at least one crosslinkable group.

The present invention thus relates to a polymer which contains at least one structural unit of the following formula (I):

and at least one structural unit of the following formula (II):

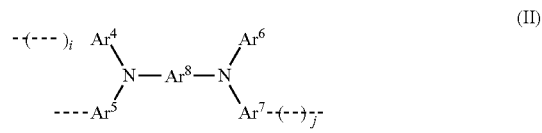

where
$Ar^1$ to $Ar^8$ is on each occurrence, in each case identically or differently, a mono- or polycyclic, aromatic or heteroaromatic ring system, which may be substituted by one or more radicals R;
i and j is each 0 or 1, where the sum (i+j)=1;
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C≡C$, $Si(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; where two or more radicals R may also form a mono- or polycyclic, aliphatic, aromatic and/or benzo-fused ring system with one another;
$R^1$ is on each occurrence, identically or differently, H, D, F or an aliphatic, aromatic and/or heteroaromatic hydrocarbon radical having 1 to 20 C atoms, in which, in addition, one or more H atoms may be replaced by F; where two or more substituents $R^1$ may also form a mono- or polycyclic, aliphatic or aromatic ring system with one another; and the dashed lines represent bonds to adjacent structural units in the polymer and the dashed lines which are located in brackets represent possible bonds to adjacent structural units; which is characterised in that at least one of the structural units of the formula (I) and/or (II) contains at least one crosslinkable group Q.

The structural unit of the formula (II) accordingly has 2 bonds to adjacent structural units in the polymer. It is possible here for i to be 1 and j to be 0, or for i to be 0 and j to be 1. Preferably, i=0 and j=1.

The structural unit of the formula (II) thus corresponds either to the structural unit of the following formula (IIa):

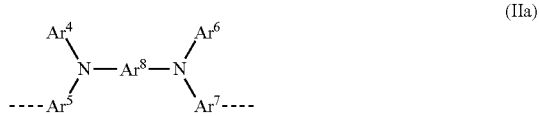

(IIa)

or to the structural unit of the following formula (IIb):

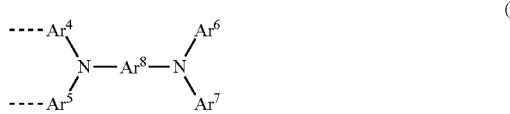

(IIb)

where the structural unit of the formula (IIa) is preferred.

In a first preferred embodiment, the proportion of structural units of the formulae (I) and (II) in the polymer is 100 mol %, i.e. the polymer consists exclusively of structural units of the formulae (I) and (II).

In a second preferred embodiment, the proportion of structural units of the formulae (I) and (II) in the polymer is in the range from 25 to 75 mol %, i.e. the polymer contains at least one further structural unit which is different from the structural units of the formulae (I) and (II).

The polymer preferably contains at least one further structural unit of the following formula (III) which is different from structural units (I) and (II):

(III)

where $Ar^9$ is a mono- or polycyclic, aromatic or heteroaromatic ring system, which may be substituted by one or more radicals R.

In a further embodiment, the polymer may, besides structural units of the formulae (I), (II) and optionally (III), also contain further structural units which are different from the structural units of the formulae (I), (II) and optionally (III).

In the present application, the term polymer is taken to mean both polymeric compounds, oligomeric compounds and dendrimers. The polymeric compounds according to the invention preferably contain 10 to 10000, particularly preferably 20 to 5000 and very particularly preferably 50 to 2000 structural units (i.e. recurring units). The oligomeric compounds according to the invention preferably contain 3 to 9 structural units. The branching factor of the polymers here is between 0 (linear polymer, no branching points) and 1 (fully branched dendrimer).

The polymers according to the invention preferably have a molecular weight $M_w$ in the range from 1,000 to 2,000,000 g/mol, particularly preferably a molecular weight $M_w$ in the range from 10,000 to 1,500,000 g/mol and very particularly preferably a molecular weight $M_w$ in the range from 50,000 to 1,000,000 g/mol. The molecular weight $M_w$ is determined by means of GPC (=gel permeation chromatography) against an internal polystyrene standard.

The polymers according to the invention are either conjugated, partially conjugated or non-conjugated polymers. Preference is given to conjugated or partially conjugated polymers.

The structural units of the formulae (I) and (II) can in accordance with the invention be incorporated into the main chain or into the side chain of the polymer. However, the structural units of the formulae (I) and (II) are preferably incorporated into the main chain of the polymer.

"Conjugated polymers" in the sense of the present application are polymers which contain principally $sp^2$-hybridised (or optionally also sp-hybridised) carbon atoms in the main chain, which may also be replaced by correspondingly hybridised heteroatoms. In the simplest case, this means the alternating presence of double and single bonds in the main chain, but polymers containing units such as, for example, a meta-linked phenylene are also intended to be regarded as conjugated polymers in the sense of this application. "Principally" means that naturally (spontaneously) occurring defects which result in conjugation interruptions do not devalue the term "conjugated polymer". The term conjugated polymers is likewise applied to polymers having a conjugated main chain and non-conjugated side chains. Furthermore, the term conjugated is likewise used in the present application if the main chain contains, for example, arylamine units, arylphosphine units, certain heterocycles (i.e. conjugation via N, O or S atoms) and/or organometallic complexes (i.e. conjugation via the metal atom). An analogous situation applies to conjugated dendrimers. By contrast, units such as, for example, simple alkyl bridges, (thio)ether, ester, amide or imide links are clearly defined as non-conjugated segments.

A partially conjugated polymer in the present application is intended to be taken to mean a polymer which contains conjugated regions which are separated from one another by non-conjugated sections, specific conjugation interrupters (for example spacer groups) or branches, for example in which relatively long conjugated sections in the main chain are interrupted by non-conjugated sections, or which contains relatively long conjugated sections in the side chains of a polymer which is non-conjugated in the main chain. Conjugated and partially conjugated polymers may also contain conjugated, partially conjugated or other dendrimers.

The term "dendrimer" in the present application is intended to be taken to mean a highly branched compound built up from a multifunctional centre (core), to which branched monomers are bonded in a regular structure, so that a tree-like structure is obtained. Both the core and also the monomers here can adopt any desired branched structures which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

In the present application, the term "structural unit" is taken to mean a unit which, starting from a monomer unit which contains at least two, preferably two, reactive groups, is incorporated into the polymer backbone as a part thereof by reaction with bond formation and is thus present in the polymer prepared as linked recurring unit.

"Crosslinkable group Q" in the sense of the present application denotes a functional group which is capable of undergoing a reaction and thus forming an insoluble compound. The reaction here can take place with a further, identical group Q, a further, different group Q or any desired other part thereof or another polymer chain. The crosslinkable group is thus a reactive group. The result of the reaction of the crosslinkable group is a correspondingly crosslinked compound. The chemical reaction can also be carried out in the layer, where an insoluble layer forms. The crosslinking can usually be supported by heat or by UV, microwave, X-ray or electron radiation, optionally in the presence of an initiator. "Insoluble" in the sense of the present application preferably means that the polymer according to the invention, after the crosslinking reaction, i.e. after the reaction of the crosslinkable groups, has a solubility in an organic solvent at room temperature which is at least a factor of 3, preferably at least a factor of 10, lower than that of the corresponding uncrosslinked polymer according to the invention in the same organic solvent.

The term "mono- or polycyclic, aromatic ring system" in the present application is taken to mean an aromatic ring system having 6 to 60, preferably 6 to 30 and particularly preferably 6 to 24 aromatic ring atoms, which does not necessarily contain only aromatic groups, but instead in which a plurality of aromatic units may also be interrupted by a short non-aromatic unit (<10% of the atoms other than H, preferably <5% of the atoms other than H), such as, for example, sp$^3$-hybridised C atom or O or N atom, CO group, etc. Thus, for example, systems such as, for example, 9,9'-spirobifluorene and 9,9-diarylfluorene are also intended to be taken to be aromatic ring systems.

The aromatic ring systems may be mono- or polycyclic, i.e. they may contain one ring (for example phenyl) or a plurality of rings, which may also be condensed (for example naphthyl) or covalently linked (for example biphenyl), or contain a combination of condensed and linked rings.

Preferred aromatic ring systems are, for example, phenyl, biphenyl, terphenyl, [1,1':3',1"]terphenyl-2'-yl, quaterphenyl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

The term "mono- or polycyclic, heteroaromatic ring system" in the present application is taken to mean an aromatic ring system having 5 to 60, preferably 5 to 30 and particularly preferably 5 to 24 aromatic ring atoms, where one or more of these atoms is (are) a heteroatom. The "mono- or polycyclic, heteroaromatic ring system" does not necessarily contain only aromatic groups, but instead may also be interrupted by a short non-aromatic unit (<10% of the atoms other than H, preferably <5% of the atoms other than H), such as, for example, sp$^3$-hybridised C atom or O or N atom, CO group, etc.

The heteroaromatic ring systems may be mono- or polycyclic, i.e. they may contain one ring or a plurality of rings, which may also be condensed or covalently linked (for example pyridylphenyl), or contain a combination of condensed and linked rings. Preference is given to fully conjugated heteroaryl groups.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups.

The mono- or polycyclic, aromatic or heteroaromatic ring system may be unsubstituted or substituted. Substituted in the present application means that the mono- or polycyclic, aromatic or heteroaromatic ring system contains one or more substituents R.

R is on each occurrence preferably, identically or differently, H, D, F, Cl, Br, I N(R$^1$)$_2$, CN, NO$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals R$^1$, where one or more non-adjacent CH$_2$ groups may be replaced by R$^1$C=CR$^1$, C≡C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or an aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$; two or more radicals R here may also form a mono- or polycyclic, aliphatic, aromatic and/or benzo-fused ring system with one another.

R is on each occurrence particularly preferably, identically or differently, H, F, Cl, Br, I, N(R$^1$)$_2$, Si(R$^1$)$_3$, B(OR$^1$)$_2$, C(=O)R$^1$, P(=O)(R$^1$)$_2$, a straight-chain alkyl or alkoxy group having 1 to 20 C atoms or an alkenyl or alkynyl group having 2 to 20 C atoms or a branched or cyclic alkyl or alkoxy group having 3 to 20 C atoms, each of which may be substituted by one or more radicals R$^1$, where one or more non-adjacent CH$_2$ groups may be replaced by R$^1$C=CR$^1$, C≡C, Si(R$^1$)$_2$, C=O, C=NR$^1$, P(=O)(R$^1$), NR$^1$, O or CONR$^1$ and where one or more H atoms may be replaced by F, Cl, Br or I, or an aromatic or heteroaromatic ring system having 5 to 30 aromatic ring atoms, which may in each case be substituted by one or more radicals R$^1$, or an aryloxy or heteroaryloxy group having 5 to 30 aromatic ring atoms, which may be substituted by one or more radicals R$^1$, or an aralkyl or heteroaralkyl group having 5 to 30 aromatic ring atoms, which may be substituted by one or more radicals R$^1$, or a diarylamino group, diheteroarylamino group or arylheteroarylamino group having 10 to aromatic ring atoms, which may be substituted by one or more radicals R$^1$; two or more radicals R here may also form a mono- or polycyclic, aliphatic, aromatic and/or benzo-fused ring system with one another.

R is on each occurrence very particularly preferably, identically or differently, H, a straight-chain alkyl or alkoxy group having 1 to 10 C atoms or an alkenyl or alkynyl group having 2 to 10 C atoms or a branched or cyclic alkyl or alkoxy group having 3 to 10 C atoms, each of which may be substituted by one or more radicals $R^1$, where one or more non-adjacent $CH_2$ groups may be replaced by $R^1C=CR^1$, $C\equiv C$, $C=O$, $C=NR^1$, $NR^1$, O or $CONR^1$, or an aromatic or heteroaromatic ring system having 5 to 20 aromatic ring atoms, which may in each case be substituted by one or more radicals $R^1$, or an aryloxy or heteroaryloxy group having 5 to 20 aromatic ring atoms, which may be substituted by one or more radicals $R^1$, or an aralkyl or heteroaralkyl group having 5 to 20 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$; two or more radicals R here may also form a mono- or polycyclic, aliphatic, aromatic and/or benzo-fused ring system with one another.

$R^1$ is on each occurrence preferably, identically or differently, H, D, F or an aliphatic, aromatic and/or heteroaromatic hydrocarbon radical having 1 to 20 C atoms, in which, in addition, one or more H atoms may be replaced by F; two or more substituents $R^1$ here may also form a mono- or polycyclic, aliphatic or aromatic ring system with one another.

$R^1$ is on each occurrence particularly preferably, identically or differently, H or an aliphatic, aromatic and/or heteroaromatic hydrocarbon radical having 1 to C atoms; two or more substituents $R^1$ here may also form a mono- or polycyclic, aliphatic or aromatic ring system with one another.

$R^1$ is on each occurrence very particularly preferably, identically or differently, H or an aliphatic, aromatic and/or heteroaromatic hydrocarbon radical having 1 to 10 C atoms.

Preferred mono- or polycyclic, aromatic or heteroaromatic groups $Ar^1$ in formula (I), $Ar^4$ and $Ar^6$ in formula (IIa) and $Ar^6$ and $Ar^7$ in formula (IIb) are the following:

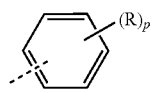

E1

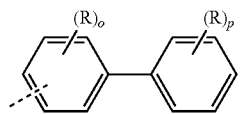

E2

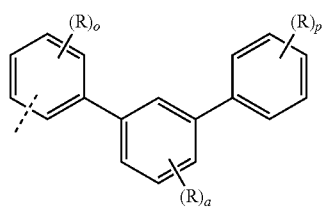

E3

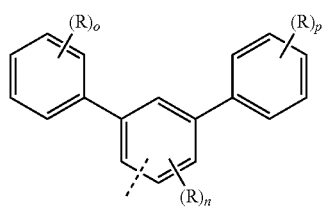

E4

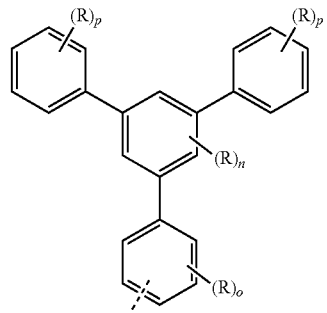

E5

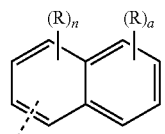

E6

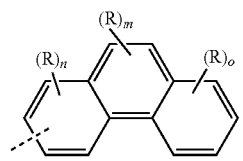

E7

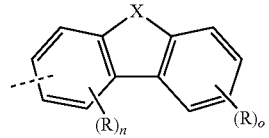

E8

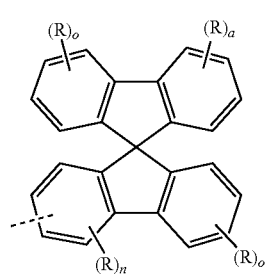

E9

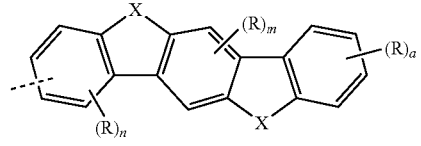

E10

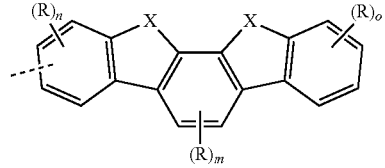

E11

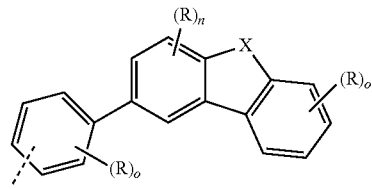

E12

The radicals R in the formulae E1 to E12 can adopt the same meaning as the radicals R in the formulae (I) and (II). X can denote $CR_2$, $SiR_2$, NR, O or S, where here too R can adopt the same meaning as the radicals R in the formulae (I) and (II).

The indices used have the following meaning:

m=0, 1 or 2;

n=0, 1, 2 or 3;

o=0, 1, 2, 3 or 4 and p=0, 1, 2, 3, 4 or 5.

Preferred mono- or polycyclic, aromatic or heteroaromatic groups $Ar^2$ and $Ar^3$ in formula (I), $Ar^5$, $Ar^7$ and $Ar^8$ in formula (IIa), $Ar^4$, $Ar^5$ and $Ar^8$ in formula (IIb), and $Ar^9$ in formula (III) are the following:

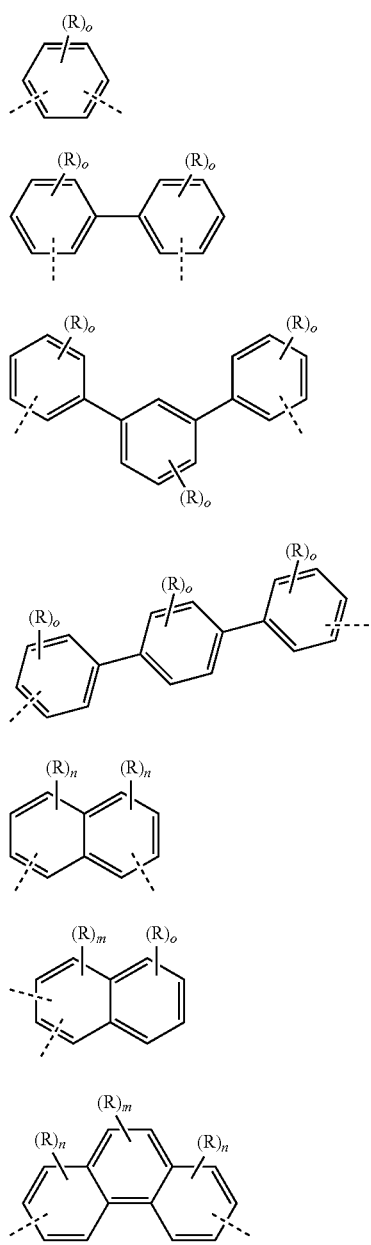

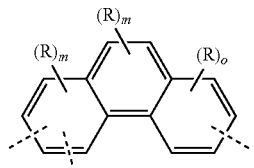

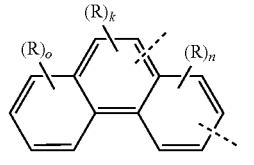

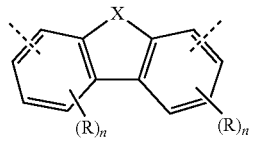

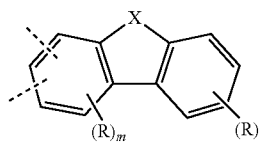

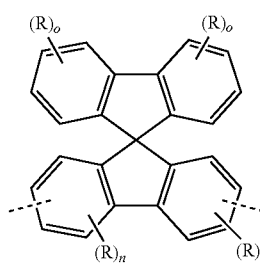

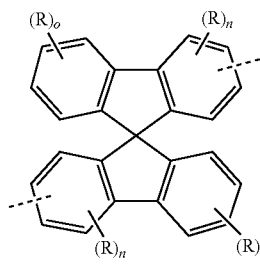

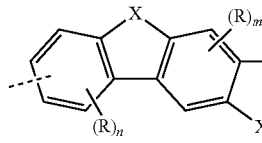

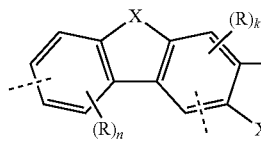

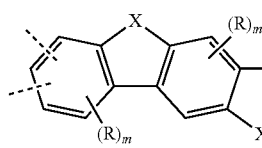

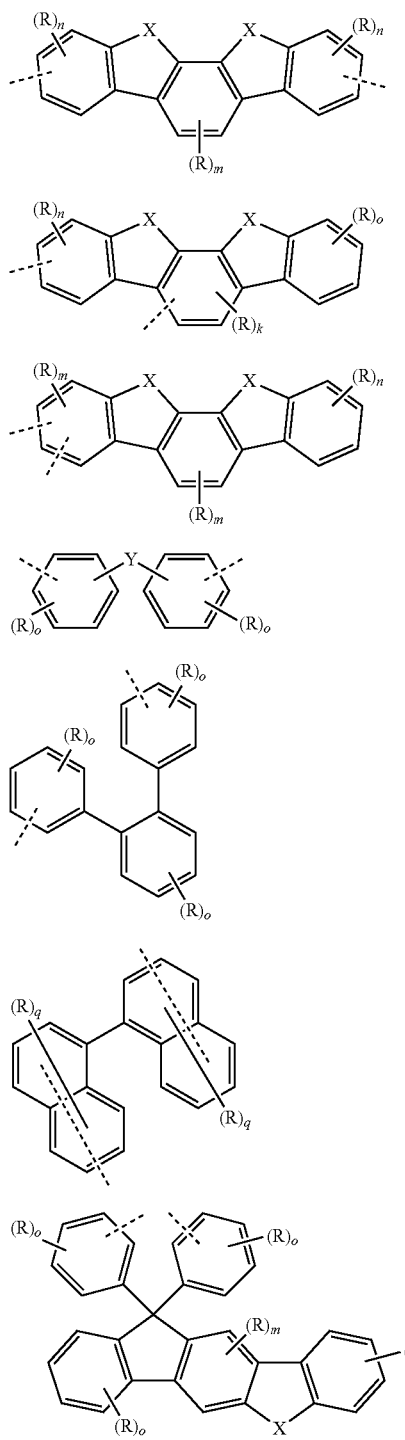

M17
M18
M19
M20
M21
M22
M23

The radicals R in the formulae M1 to M19 can adopt the same meaning as the radicals R in the formulae (I) and (II). X can denote $CR_2$, $SiR_2$, O or S, where here too R can adopt the same meaning as the radicals R in the formulae (I) and (II). Y can be $CR_2$, $SiR_2$, O, S or a straight-chain or branched alkyl group having 1 to 20 C atoms or an alkenyl or alkynyl group having 2 to 20 C atoms, each of which may be substituted by one or more radicals $R^1$, and where one or more non-adjacent $CH_2$ groups, CH groups or C atoms of the alkyl, alkenyl or alkynyl groups may be replaced by $Si(R^1)_2$, C=O, C=S, C=$NR^1$, P(=O)($R^1$), SO, $SO_2$, $NR^1$, O, S, $CONR^1$, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; where here too the radicals R and $R^1$ can adopt the same meanings as the radicals R and $R^1$ in the formulae (I) and (II).

The indices used have the following meaning:

k=0 or 1;

m=0, 1 or 2;

n=0, 1, 2 or 3;

o=0, 1, 2, 3 or 4; and q=0, 1, 2, 3, 4, 5 or 6.

Particularly preferred mono- or polycyclic, aromatic or heteroaromatic groups $Ar^1$ in formula (I), $Ar^4$ and $Ar^6$ in formula (IIa) and $Ar^6$ and $Ar^7$ in formula (IIb) are the following:

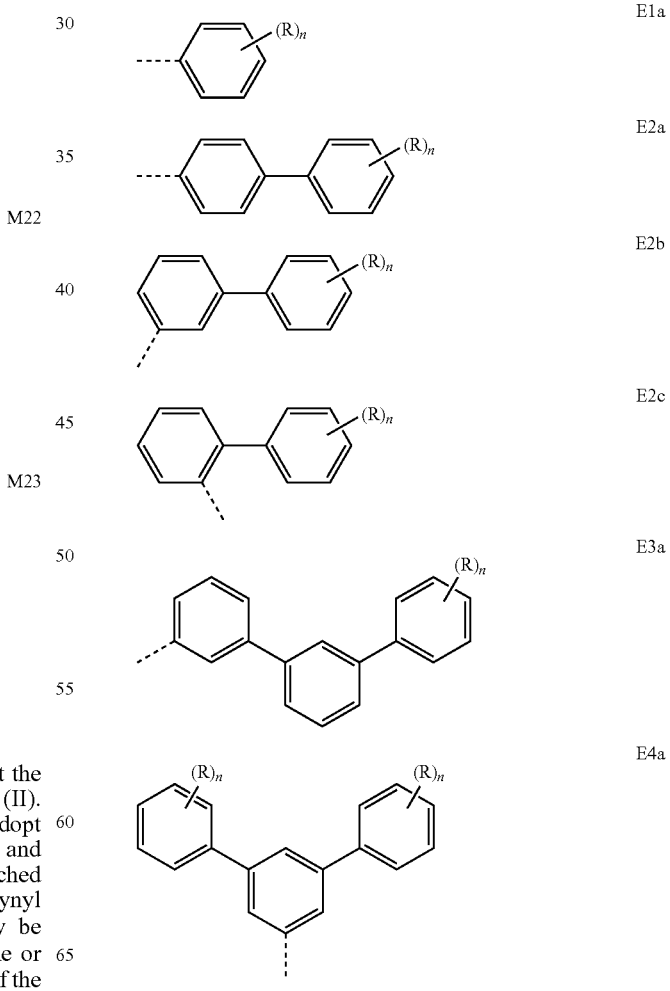

E1a
E2a
E2b
E2c
E3a
E4a

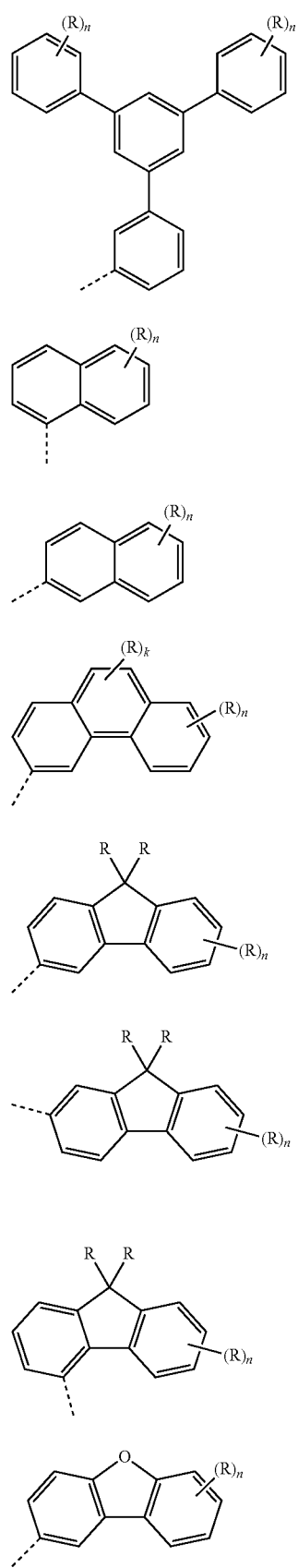
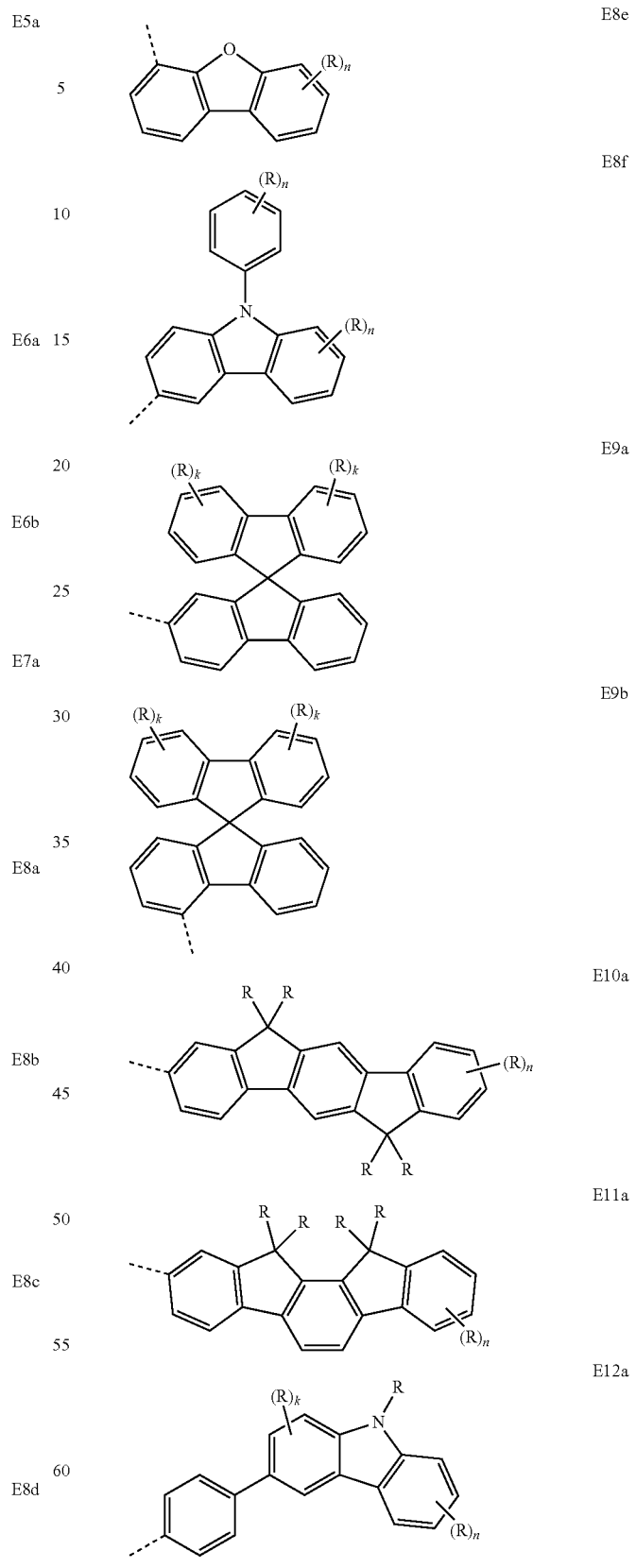
The radicals R in the formulae E1a to E12a can adopt the same meaning as the radicals R in the formulae (I) and (II).

The indices used have the following meaning:
k=0 or 1; and
n=0, 1, 2 or 3.
Particularly preferred mono- or polycyclic, aromatic or heteroaromatic groups Ar² and Ar³ in formula (I), Ar⁵, Ar⁷ and Ar⁸ in formula (IIa), Ar⁴, Ar⁵ and Ar⁸ in formula (IIb) and Ar⁹ in formula (III) are the following:
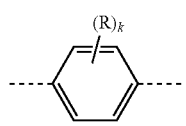
M1a
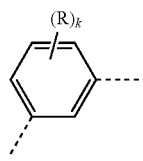
M1b
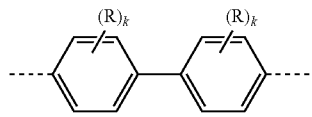
M2a
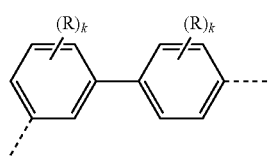
M2b
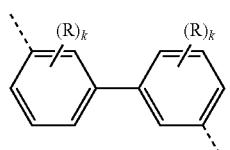
M2c
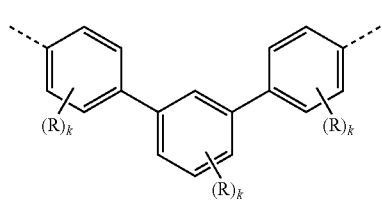
M3a
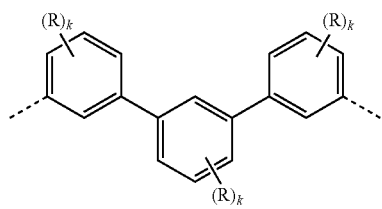
M3b
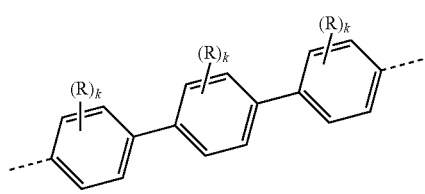
M4a
-continued
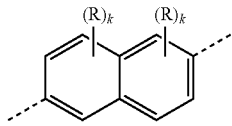
M5a
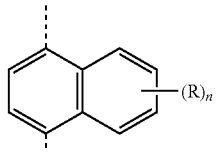
M6a
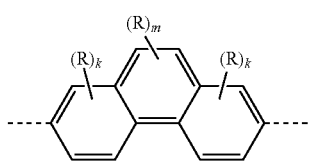
M7a
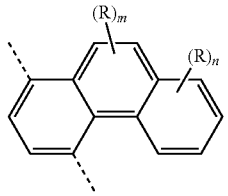
M8a
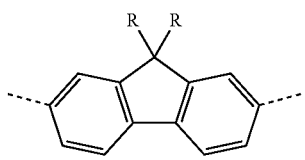
M10a
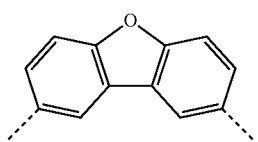
M10b
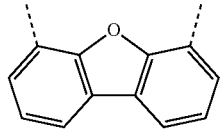
M10c
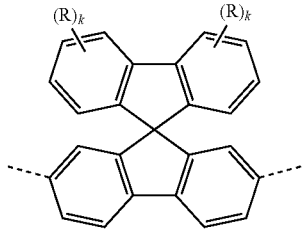
M12a

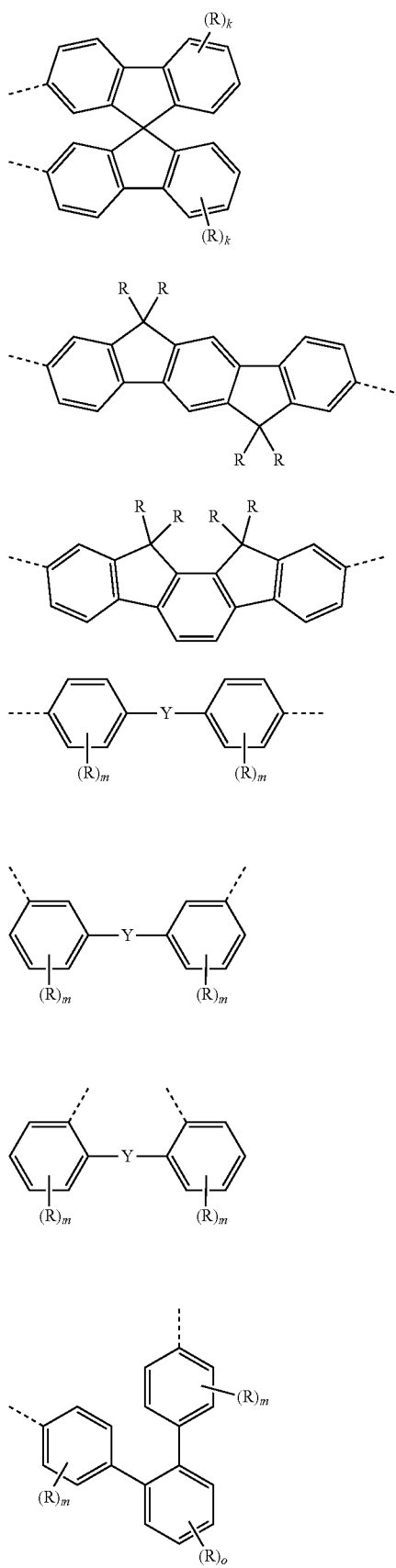
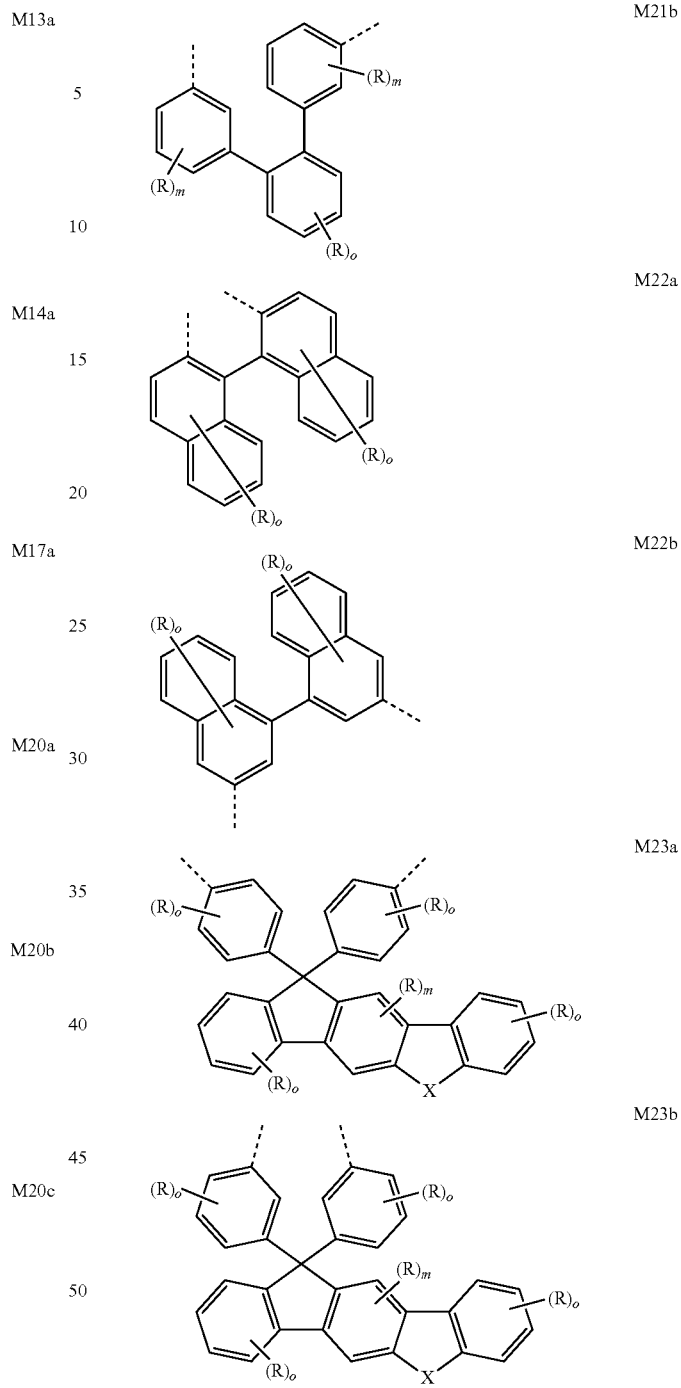

The radicals R in the formulae M1a to M17a can adopt the same meaning as the radicals R in the formulae (I) and (II). X can denote $CR_2$ or $SiR_2$, where here too R can adopt the same meaning as the radicals R in the formulae (I) and (II).

Y can be $CR_2$, $SiR_2$, O, S or a straight-chain alkyl group having 1 to 10 C atoms or an alkenyl or alkynyl group having 2 to 10 C atoms, each of which may be substituted by one or more radicals $R^1$, and where one or more non-adjacent $CH_2$ groups, CH groups or C atoms of the alkyl, alkenyl or alkynyl groups may be replaced by $Si(R^1)_2$, C=O, C=$NR^1$, P(=O)($R^1$), $NR^1$, O, $CONR^1$, or an aromatic or heteroaromatic ring system having 5 to 30 aromatic ring atoms, which may in each case be substituted by one or more radicals $R^1$, or an aryloxy or heteroaryloxy group having 5 to 30 aromatic ring atoms, which may be substituted by one or more radicals $R^1$, or an aralkyl or heteroaralkyl group having 5 to 30 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$; where here too the radicals R and $R^1$ can adopt the same meanings as the radicals R and $R^1$ in the formulae (I) and (II).

The indices used have the following meaning:
k=0 or 1;
m=0, 1 or 2;
n=0, 1, 2 or 3; and
o=0, 1, 2, 3 or 4.

Very particularly preferred mono- or polycyclic, aromatic or heteroaromatic groups $Ar^1$ in formula (I), $Ar^4$ and $Ar^6$ in formula (IIa) and $Ar^6$ and $Ar^7$ in formula (IIb) are the following:

E1b

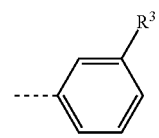
E1c

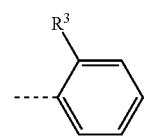
E1d

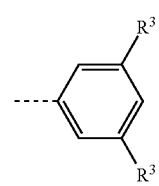
E1e

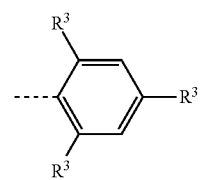
E1f

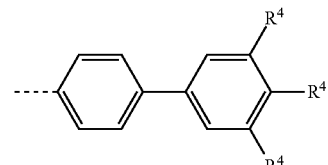
E2d

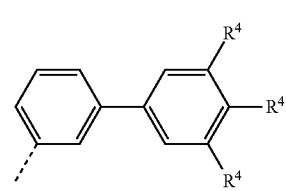
E2e

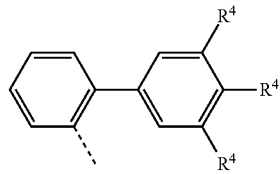
E2f

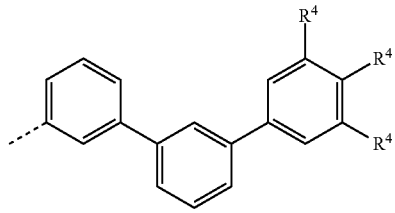
E3b

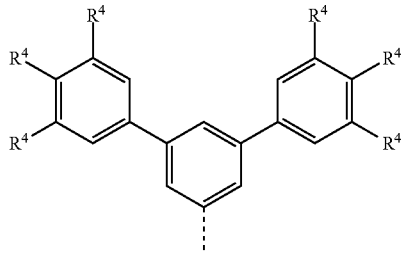
E4b

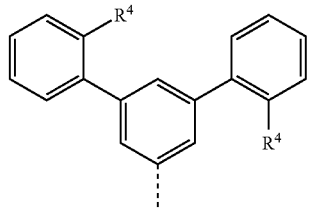
E4c

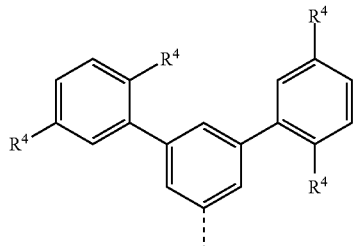
E4d

E4e

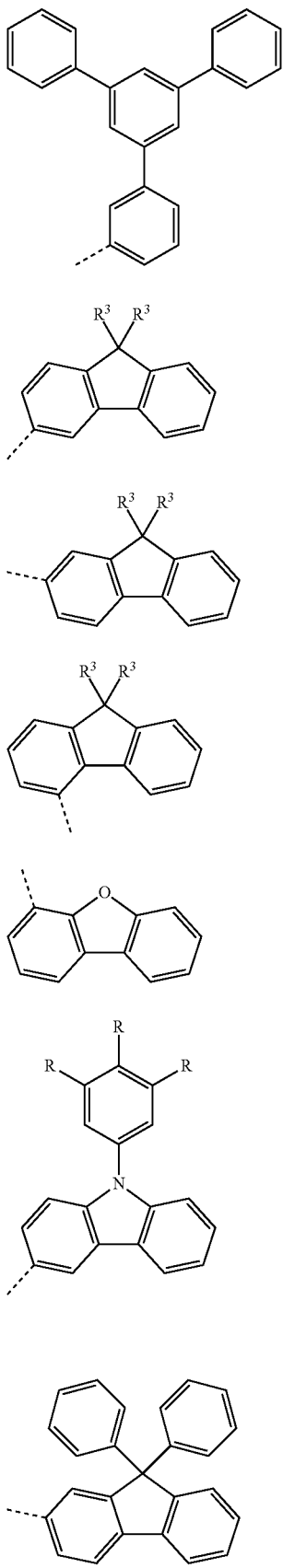
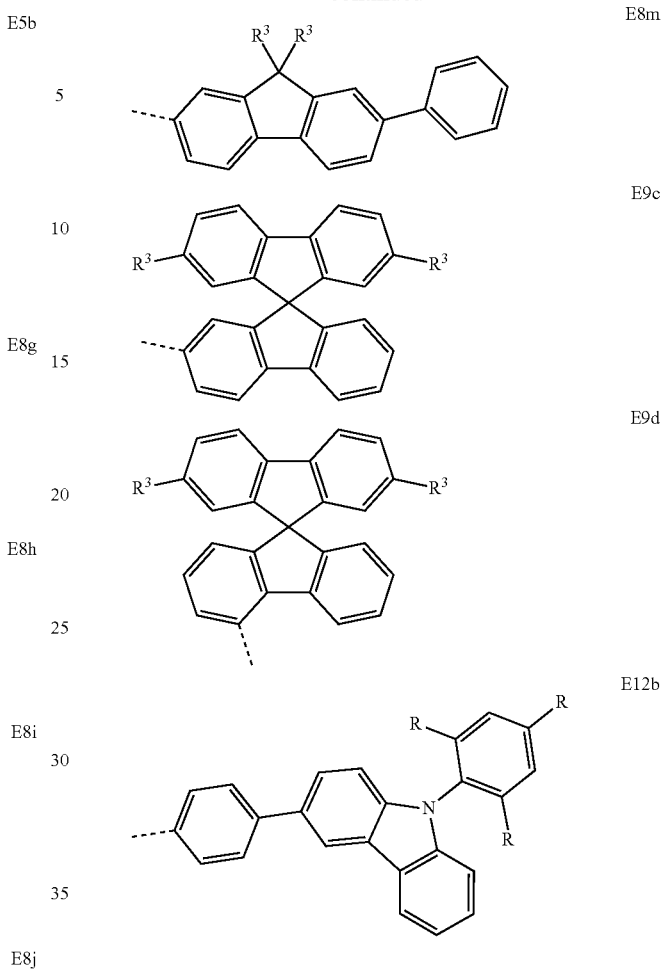

The radicals $R^3$ in the formulae E1b to E1f, E8g to E8i, E8m, E9c and E9d are on each occurrence, identically or differently, H or a straight-chain or branched alkyl group having 1 to 12 C atoms, preferably 1 to 10 C atoms. The radicals $R^3$ are particularly preferably methyl, n-butyl, sec-butyl, tert-butyl, n-hexyl or n-octyl.

The radicals $R^4$ in the formulae E2d to E2f, E3b and E4b to E4e are on each occurrence, identically or differently, H or a straight-chain or branched alkyl group having 1 to 6 C atoms, preferably 1 to 4 C atoms. The radicals $R^4$ are particularly preferably methyl, n-butyl, sec-butyl or tert-butyl.

The radicals R in the formulae E8k and E12b are identical or different on each occurrence and can adopt the same meaning as the radicals R in the formulae (I) and (II).

Very particularly preferred mono- or polycyclic, aromatic or heteroaromatic groups $Ar^2$ and $Ar^3$ in formula (I), $Ar^5$, $Ar^7$ and $Ar^8$ in formula (IIa), $Ar^4$, $Ar^5$ and $Ar^8$ in formula (IIb) and $Ar^9$ in formula (III) are the following:

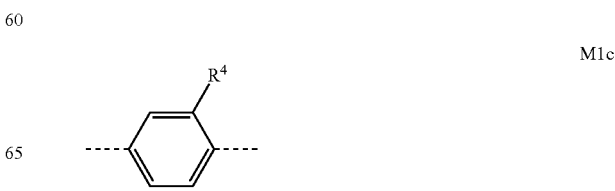

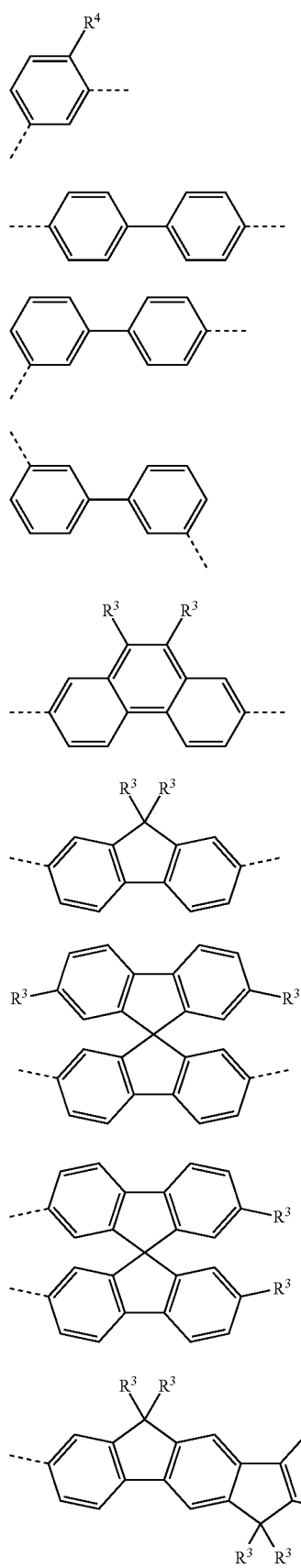
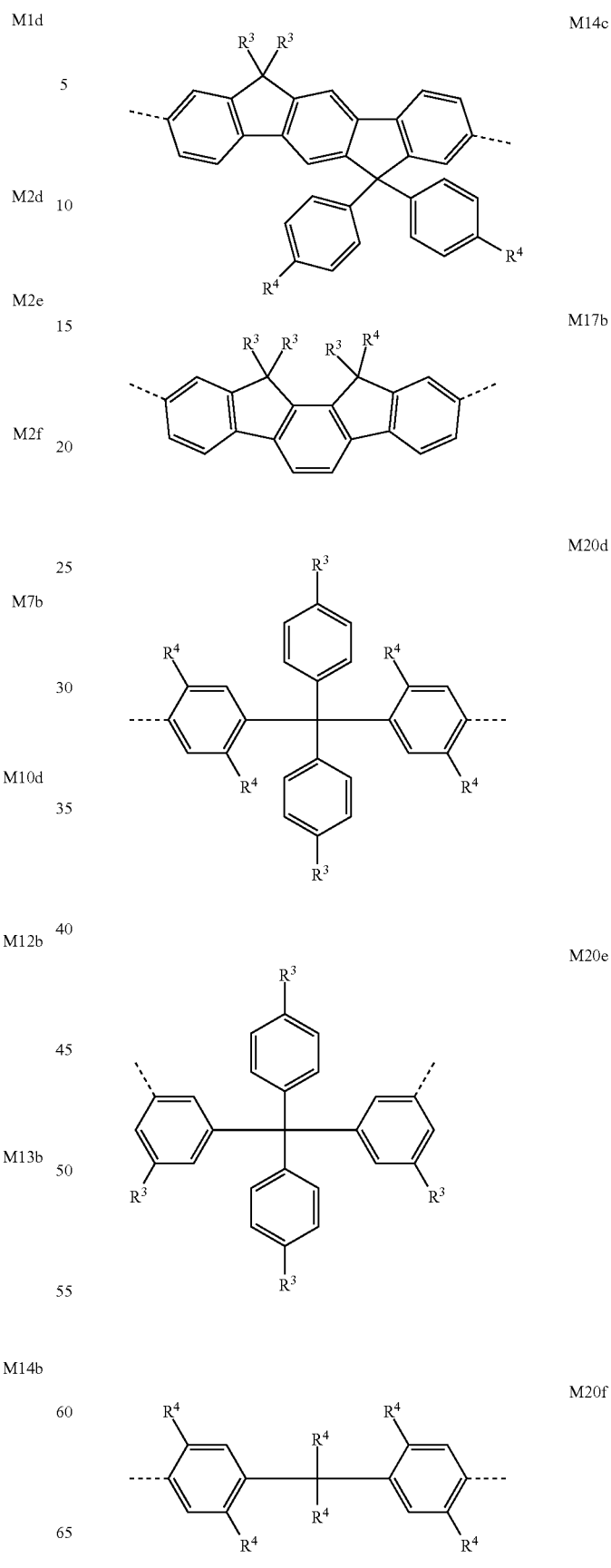

-continued

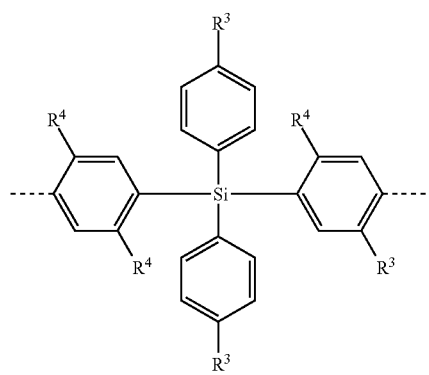
M20g

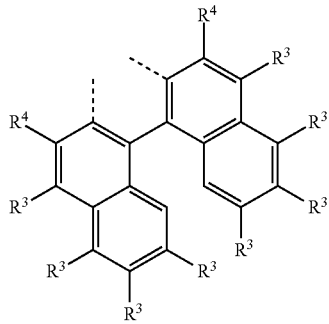
M22c

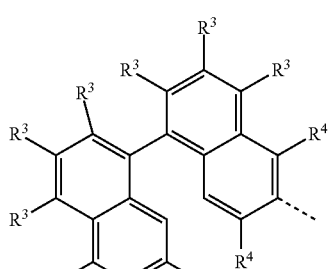
M22d

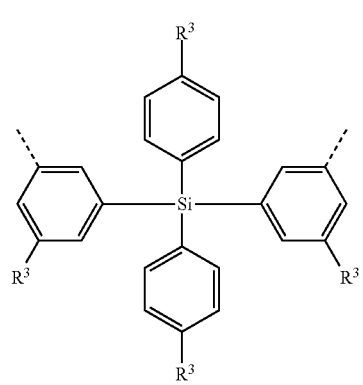
M20h

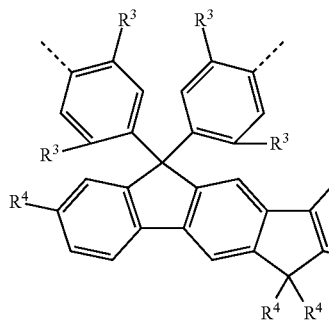
M23c

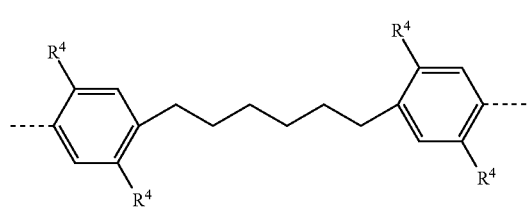
M20i

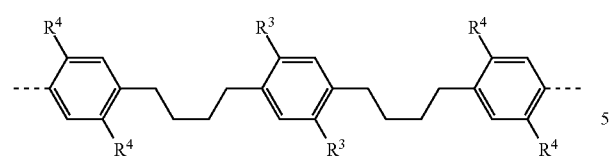
M20j

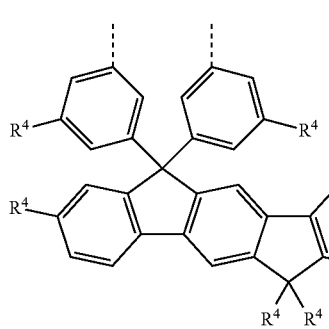
M23d

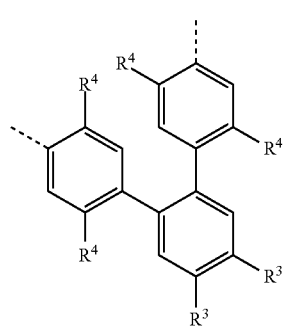
M21c

The radicals $R^3$ in the formulae M7b, M10d, M12b, M13b, M14b, M14c, M17b, M20d, M20e, M20g, M20h, M20j, M21c, M22c, M22d and M23c are on each occurrence, identically or differently, H or a straight-chain or branched alkyl group having 1 to 12 C atoms, preferably 1 to 10 C atoms. The radicals $R^3$ are particularly preferably methyl, n-butyl, sec-butyl, tert-butyl, n-hexyl and n-octyl.

The radicals $R^4$ in the formulae M1c, M1d, M14c, M20d, M20e, M20f, M20g, M20i, M20j, M21c, M22c, M22d, M23c and M23d are on each occurrence, identically or differently, H or a straight-chain or branched alkyl group having 1 to 6 C atoms, preferably 1 to 4 C atoms. The radicals $R^4$ are particularly preferably methyl, n-butyl, sec-butyl or tert-butyl.

Preferred structural units of the following formula (I)

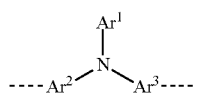

are structural units in which $Ar^1$ is selected from the groups of the formulae E1 to E12 and $Ar^2$ and $Ar^3$ are selected from the groups of the formulae M1 to M19, where it is particularly preferred for $Ar^2$ and $Ar^3$ to be identical.

A selection of preferred structural units of the formula (I) is shown in the following Table 1.

TABLE 1

| Formula (I) | $Ar^1$ | $Ar^2$ | $Ar^3$ |
|---|---|---|---|
| I1 | E1 | M1 | M1 |
| I2 | E1 | M2 | M2 |
| I3 | E1 | M10 | M10 |
| I4 | E1 | M12 | M12 |
| I5 | E1 | M14 | M14 |
| I6 | E1 | M19 | M19 |
| I7 | E2 | M1 | M1 |
| I8 | E2 | M2 | M1 |
| I9 | E2 | M7 | M7 |
| I10 | E2 | M12 | M12 |
| I11 | E2 | M13 | M13 |
| I12 | E3 | M1 | M1 |
| I13 | E3 | M13 | M13 |
| I14 | E4 | M1 | M1 |
| I15 | E4 | M2 | M2 |
| I16 | E4 | M14 | M14 |
| I17 | E5 | M3 | M3 |
| I18 | E5 | M12 | M12 |
| I19 | E6 | M6 | M6 |
| I20 | E6 | M10 | M10 |
| I21 | E6 | M16 | M16 |
| I22 | E7 | M2 | M2 |
| I23 | E7 | M15 | M15 |
| I24 | E8 | M1 | M1 |
| I25 | E8 | M2 | M2 |
| I26 | E8 | M4 | M4 |
| I27 | E8 | M5 | M5 |
| I28 | E8 | M10 | M10 |
| I29 | E8 | M12 | M12 |
| I30 | E8 | M14 | M14 |
| I31 | E9 | M1 | M1 |
| I32 | E9 | M8 | M8 |
| I33 | E9 | M13 | M13 |
| I34 | E10 | M10 | M10 |
| I35 | E11 | M9 | M9 |
| I36 | E11 | M17 | M17 |
| I37 | E12 | M7 | M7 |
| I38 | E12 | M18 | M18 |
| I39 | E1 | M23 | M23 |
| I40 | E2 | M21 | M1 |
| I41 | E8 | M20 | M20 |
| I41 | E9 | M22 | M22 |

Particularly preferred structural units of the formula (I) are structural units in which $Ar^1$ is selected from the groups of the formulae E1a to E12a and $Ar^2$ and $Ar^3$ are selected from the groups of the formulae M1a to M17a, where it is particularly preferred for $Ar^2$ and $Ar^3$ to be identical.

A selection of particularly preferred structural units of the formula (I) is shown in the following Table 2.

TABLE 2

| Formula (I) | $Ar^1$ | $Ar^2$ | $Ar^3$ |
|---|---|---|---|
| I1a | E1a | M1a | M1a |
| I2a | E1a | M2a | M2a |
| I2b | E1a | M2c | M2c |
| I3a | E1a | M10a | M10a |
| I4a | E1a | M12a | M12a |
| I5a | E1a | M14a | M14a |
| I7a | E2a | M1b | M1b |
| I7b | E2c | M1a | M1a |
| I8a | E2c | M2c | M1a |
| I9a | E2b | M7a | M7a |
| I10a | E2a | M12a | M12a |
| I11a | E2a | M13a | M13a |
| I12a | E3a | M1b | M1b |
| I13a | E3a | M13a | M13a |
| I14a | E4a | M1a | M1a |
| I15a | E4a | M2a | M2a |
| I15b | E4a | M2b | M2b |
| I16a | E4a | M14a | M14a |
| I17a | E5a | M3a | M3a |
| I18a | E5a | M12a | M12a |
| I19a | E6a | M6a | M6a |
| I20a | E6b | M10b | M10b |
| I22a | E7a | M2a | M2a |
| I24a | E8a | M1a | M1a |
| I24b | E8b | M1b | M1b |
| I24c | E8e | M1a | M1a |
| I24d | E8f | M1b | M1b |
| I25a | E8a | M2c | M2c |
| I25b | E8b | M2b | M2b |
| I25c | E8f | M2c | M2c |
| I26a | E8c | M4a | M4a |
| I27a | E8d | M5a | M5a |
| I28a | E8c | M10a | M10a |
| I29a | E8b | M12a | M12a |
| I30a | E8e | M14a | M14a |
| I31a | E9b | M1a | M1a |
| I32a | E9a | M8a | M8a |
| I33a | E9a | M13a | M13a |
| I34a | E10a | M10c | M10c |
| I36a | E11a | M17a | M17a |
| I37a | E12a | M7a | M7a |
| I39a | E1a | M23a | M23a |
| I39b | E1a | M23b | M23b |
| I40a | E2c | M21a | M1a |
| I40b | E2a | M21a | M1b |
| I41a | E8b | M20a | M20a |
| I41b | E8c | M20b | M20b |

Very particularly preferred structural units of the formula (I) are structural units in which $Ar^1$ is selected from the groups of the formulae E1b to E12b and $Ar^2$ and $Ar^3$ are selected from the groups of the formulae M1c to M14c, where it is particularly preferred for $Ar^2$ and $Ar^3$ to be identical.

A selection of very particularly preferred structural units of the formula (I) is shown in the following Table 3.

TABLE 3

| Formula (I) | $Ar^1$ | $Ar^2$ | $Ar^3$ |
|---|---|---|---|
| I1b | E1b | M1c | M1c |
| I1c | E1e | M1c | M1c |
| I2c | E1c | M2d | M2d |
| I2d | E1e | M2f | M2f |
| I2e | E1f | M2f | M2f |
| I3b | E1d | M10d | M10d |
| I4b | E1f | M12b | M12b |
| I5b | E1c | M14b | M14b |
| I5c | E1d | M14b | M14c |
| I7c | E2d | M1d | M1d |
| I7d | E2f | M1c | M1c |
| I8b | E2f | M2f | M1c |
| I9b | E2e | M7b | M7b |
| I10b | E2e | M12b | M12b |
| I11b | E2d | M13b | M13b |
| I12b | E3b | M1d | M1d |

TABLE 3-continued

| Formula (I) | Ar¹ | Ar² | Ar³ |
|---|---|---|---|
| I13b | E3b | M13b | M13b |
| I14b | E4c | M1c | M1c |
| I14c | E4d | M1c | M1c |
| I15c | E4b | M2e | M2e |
| I15d | E4e | M2d | M2d |
| I16b | E4b | M14c | M14c |
| I18b | E5b | M12b | M12b |
| I24e | E8g | M1c | M1c |
| I24f | E8j | M1c | M1c |
| I24g | E8k | M1d | M1d |
| I24h | E8l | M1d | M1d |
| I25d | E8g | M2f | M2f |
| I25e | E8h | M2e | M2e |
| I25f | E8k | M2f | M2f |
| I28b | E8i | M10d | M10d |
| I29b | E8m | M12b | M12b |
| I30b | E8j | M14b | M14b |
| I31b | E9d | M1c | M1c |
| I33b | E9c | M13b | M13b |
| I37b | E12b | M7b | M7b |
| I39c | E1b | M23c | M23c |
| I40c | E2f | M21c | M1c |
| I40d | E2d | M21c | M1d |
| I41c | E8h | M20d | M20d |
| I41d | E8h | M20g | M20g |
| I41e | E8h | M20i | M20i |
| I41f | E8i | M20h | M20h |

Preferred structural units of the following formula (IIa)

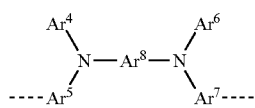

are structural units in which Ar⁴ and Ar⁶, independently of one another, identically or differently, are selected from the groups of the formulae E1 to E12 and Ar⁵, Ar⁷ and Ar⁸, independently of one another, identically or differently, are selected from the groups of the formulae M1 to M19, where it is particularly preferred for Ar⁴ and Ar⁶ or Ar⁵ and Ar⁷ to be identical.

Preferred structural units of the following formula (IIb)

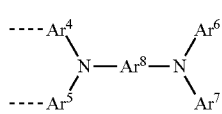

are structural units in which Ar⁶ and Ar⁷, independently of one another, identically or differently, are selected from the groups of the formulae E1 to E12 and Ar⁴, Ar⁵ and Ar⁸, independently of one another, identically or differently, are selected from the groups of the formulae M1 to M19, where it is particularly preferred for Ar⁴ and Ar⁵ or Ar⁶ and Ar⁷ to be identical.

A selection of preferred structural units of the formula (IIa) or (IIb) is shown in the following Table 4.

TABLE 4

| | Formula (IIa) | | | | |
|---|---|---|---|---|---|
| | Ar⁴ | Ar⁶ | Ar⁵ | Ar⁷ | Ar⁸ |
| | Formula (IIb) | | | | |
| | Ar⁷ | Ar⁶ | Ar⁵ | Ar⁴ | Ar⁸ |
| II1 | E1 | E1 | M1 | M1 | M1 |
| II2 | E1 | E1 | M1 | M1 | M2 |
| II3 | E1 | E1 | M1 | M1 | M10 |
| II4 | E1 | E1 | M1 | M1 | M13 |
| II5 | E1 | E1 | M1 | M1 | M14 |
| II6 | E1 | E1 | M14 | M14 | M12 |
| II7 | E2 | E2 | M1 | M1 | M2 |
| II8 | E2 | E2 | M2 | M2 | M12 |
| II9 | E3 | E3 | M7 | M7 | M1 |
| II10 | E3 | E3 | M10 | M10 | M16 |
| II11 | E4 | E4 | M1 | M1 | M7 |
| II12 | E4 | E4 | M1 | M1 | M12 |
| II13 | E4 | E4 | M2 | M2 | M14 |
| II14 | E4 | E4 | M10 | M10 | M13 |
| II15 | E4 | E8 | M1 | M1 | M7 |
| II16 | E5 | E5 | M2 | M13 | M13 |
| II17 | E6 | E6 | M3 | M3 | M6 |
| II18 | E6 | E6 | M17 | M17 | M10 |
| II19 | E7 | E7 | M5 | M5 | M4 |
| II20 | E8 | E8 | M1 | M1 | M1 |
| II21 | E8 | E8 | M1 | M1 | M2 |
| II22 | E8 | E8 | M1 | M1 | M12 |
| II23 | E8 | E8 | M2 | M2 | M10 |
| II24 | E8 | E8 | M6 | M6 | M8 |
| II25 | E8 | E8 | M10 | M10 | M7 |
| II26 | E8 | E8 | M13 | M13 | M2 |
| II27 | E8 | E8 | M14 | M14 | M12 |
| II28 | E9 | E9 | M1 | M1 | M2 |
| II29 | E9 | E9 | M9 | M9 | M11 |
| II30 | E9 | E9 | M19 | M19 | M18 |
| II31 | E10 | E10 | M1 | M1 | M4 |
| II32 | E11 | E11 | M2 | M2 | M10 |
| II33 | E11 | E11 | M13 | M13 | M15 |
| II34 | E12 | E12 | M7 | M7 | M14 |
| II35 | E2 | E2 | M1 | M1 | M14 |
| II36 | E2 | E2 | M1 | M1 | M12 |
| II37 | E8 | E8 | M1 | M1 | M20 |
| II38 | E9 | E9 | M1 | M1 | M23 |

Particularly preferred structural units of the formula (IIa) are structural units in which Ar⁴ and Ar⁶, independently of one another, identically or differently, are selected from the groups of the formulae E1a to E12a and Ar⁵, Ar⁷ and Ar⁸, independently of one another, identically or differently, are selected from the groups of the formulae M1a to M17a, where it is particularly preferred for Ar⁴ and Ar⁶ or Ar⁵ and Ar⁷ to be identical.

Particularly preferred structural units of the formula (IIb) are structural units in which Ar⁶ and Ar⁷, independently of one another, identically or differently, are selected from the groups of the formulae E1a to E12a and Ar⁴, Ar⁵ and Ar⁸, independently of one another, identically or differently, are selected from the groups of the formulae M1a to M17a, where it is particularly preferred for Ar⁴ and Ar⁵ or Ar⁶ and Ar⁷ to be identical.

A selection of particularly preferred structural units of the formula (IIa) or (IIb) is shown in the following Table 5.

TABLE 5

| | Formula (IIa) | | | | |
|---|---|---|---|---|---|
| | Ar⁴ | Ar⁶ | Ar⁵ | Ar⁷ | Ar⁸ |
| | Formula (IIb) | | | | |
| | Ar⁷ | Ar⁶ | Ar⁵ | Ar⁴ | Ar⁸ |
| II1a | E1a | E1a | M1a | M1a | M1a |
| II1b | E1a | E1a | M1b | M1b | M1b |

TABLE 5-continued

| | Formula (IIa) | | | | |
|---|---|---|---|---|---|
| | $Ar^4$ | $Ar^6$ | $Ar^5$ | $Ar^7$ | $Ar^8$ |
| | Formula (IIb) | | | | |
| | $Ar^7$ | $Ar^6$ | $Ar^5$ | $Ar^4$ | $Ar^8$ |
| II2a | E1a | E1a | M1a | M1a | M2a |
| II3a | E1a | E1a | M1a | M1a | M10a |
| II4a | E1a | E1a | M1a | M1a | M13a |
| II4b | E1a | E1a | M1b | M1b | M13a |
| II5a | E1a | E1a | M1a | M1a | M14a |
| II6a | E1a | E1a | M14a | M14a | M12a |
| II7a | E2a | E2a | M1a | M1a | M2a |
| II7b | E2c | E2c | M1a | M1a | M2a |
| II8a | E2b | E2b | M2b | M2b | M12a |
| II9a | E3a | E3a | M7a | M7a | M1b |
| II11a | E4a | E4a | M1b | M1b | M7a |
| II12a | E4a | E4a | M1b | M1b | M12a |
| II13a | E4a | E4a | M2b | M2b | M14a |
| II14a | E4a | E4a | M10a | M10a | M13a |
| II15a | E4a | E8a | M1b | M1b | M7a |
| II16a | E5a | E5a | M2c | M13a | M13a |
| II17a | E6a | E6a | M3a | M3a | M6a |
| II18a | E6b | E6b | M17a | M17a | M10b |
| II19a | E7a | E7a | M5a | M5a | M4a |
| II20a | E8f | E8f | M1a | M1a | M1a |
| II21a | E8b | E8b | M1a | M1a | M2a |
| II21b | E8e | E8e | M1a | M1a | M2a |
| II22a | E8b | E8b | M1b | M1b | M12a |
| II23a | E8d | E8d | M2b | M2b | M10c |
| II24a | E8f | E8f | M6a | M6a | M8a |
| II25a | E8a | E8a | M10a | M10a | M7a |
| II26a | E8c | E8c | M13a | M13a | M2c |
| II27a | E8b | E8b | M14a | M14a | M12a |
| II28a | E9a | E9a | M1a | M1a | M2a |
| II28b | E9b | E9b | M1a | M1a | M2a |
| II31a | E10a | E10a | M1b | M1b | M4a |
| II32a | E11a | E11a | M2c | M2c | M10c |
| II34a | E12a | E12a | M7a | M7a | M14a |
| II35a | E2a | E2a | M1a | M1a | M14a |
| II35b | E2c | E2c | M1a | M1a | M14a |
| II36a | E2c | E2c | M1a | M1a | M12a |
| II37a | E8b | E8b | M1a | M1a | M20a |
| II37b | E8e | E8e | M1a | M1a | M20b |
| II38a | E9a | E9a | M1b | M1b | M23a |
| II38b | E9b | E9b | M1b | M1b | M23b |

Very particularly preferred structural units of the formula (IIa) are structural units in which $Ar^4$ and $Ar^6$, independently of one another, identically or differently, are selected from the groups of the formulae E1b to E12b and $Ar^5$, $Ar^7$ and $Ar^8$, independently of one another, identically or differently, are selected from the groups of the formulae M1c to M14c, where it is particularly preferred for $Ar^4$ and $Ar^6$ or $Ar^5$ and $Ar^7$ to be identical.

Very particularly preferred structural units of the formula (IIb) are structural units in which $Ar^6$ and $Ar^7$, independently of one another, identically or differently, are selected from the groups of the formulae E1b to E12b and $Ar^4$, $Ar^5$ and $Ar^8$, independently of one another, identically or differently, are selected from the groups of the formulae M1c to M14c, where it is particularly preferred for $Ar^4$ and $Ar^5$ or $Ar^6$ and $Ar^7$ to be identical.

A selection of very particularly preferred structural units of the formula (IIa) or (IIb) is shown in the following Table 6.

TABLE 6

| | Formula (IIa) | | | | |
|---|---|---|---|---|---|
| | $Ar^4$ | $Ar^6$ | $Ar^5$ | $Ar^7$ | $Ar^8$ |
| | Formula (IIb) | | | | |
| | $Ar^7$ | $Ar^6$ | $Ar^5$ | $Ar^4$ | $Ar^8$ |
| II1c | E1b | E1b | M1c | M1c | M1c |
| II1d | E1e | E1e | M1d | M1d | M1d |
| II2b | E1b | E1b | M1c | M1c | M2d |
| II3b | E1b | E1b | M1c | M1c | M10d |
| II4c | E1b | E1b | M1c | M1c | M13b |
| II4d | E1d | E1d | M1d | M1d | M13b |
| II5b | E1c | E1c | M1c | M1c | M14b |
| II6b | E1f | E1f | M14b | M14b | M12b |
| II7c | E2d | E2d | M1c | M1c | M2d |
| II7d | E2f | E2f | M1c | M1c | M2d |
| II8b | E2e | E2e | M2e | M2e | M12b |
| II9b | E3b | E3b | M7b | M7b | M1d |
| II11b | E4d | E4d | M1d | M1d | M7b |
| II12b | E4c | E4c | M1d | M1d | M12b |
| II13b | E4b | E4b | M2e | M2e | M14c |
| II14b | E4e | E4e | M10d | M10d | M13b |
| II15b | E4d | E8g | M1d | M1d | M7b |
| II16b | E5b | E5b | M2f | M13b | M13b |
| II20b | E8k | E8k | M1c | M1c | M1c |
| II21c | E8h | E8h | M1c | M1c | M2d |
| II21d | E8j | E8j | M1c | M1c | M2d |
| II22b | E8m | E8m | M1d | M1d | M12b |
| II25b | E8g | E8g | M10d | M10d | M7b |
| II26b | E8i | E8i | M13b | M13b | M2f |
| II27b | E8l | E8l | M14c | M14c | M12b |
| II28c | E9c | E9c | M1c | M1c | M2d |
| II28d | E9d | E9d | M1c | M1c | M2d |
| II34b | E12b | E12b | M7b | M7b | M14c |
| II35c | E2d | E2d | M1c | M1c | M14b |
| II35d | E2f | E2f | M1c | M1c | M14b |
| II36b | E2f | E2f | M1c | M1c | M12b |
| II37c | E8h | E8h | M1c | M1c | M20g |
| II37d | E8j | E8j | M1c | M1c | M20e |
| II38c | E9c | E9c | M1d | M1d | M23c |

Preferred structural units of the following formula (III)

$$—Ar^9— \quad (III)$$

are structural units in which $Ar^9$ is selected from the groups of the formulae M1 to M19, as shown in the following Table 7.

TABLE 7

| Formula (III) | $Ar^9$ |
|---|---|
| III1 | M1 |
| III2 | M2 |
| III3 | M3 |
| III4 | M4 |
| III5 | M5 |
| III6 | M6 |
| III7 | M7 |
| III8 | M8 |
| III9 | M9 |
| III10 | M10 |
| III11 | M11 |
| III12 | M12 |
| III13 | M13 |
| III14 | M14 |
| III15 | M15 |
| III16 | M16 |
| III17 | M17 |
| III18 | M18 |
| III19 | M19 |
| III20 | M20 |
| III21 | M21 |
| III22 | M22 |
| III23 | M23 |

Particularly preferred structural units of the formula (III) are structural units in which $Ar^9$ is selected from the groups of the formulae M1a to M17a, as shown in the following Table 8.

TABLE 8

| Formula (III) | $Ar^9$ |
|---|---|
| III1a | M1a |
| III1b | M1b |
| III2a | M2a |
| III2b | M2b |
| III2c | M2c |
| III3a | M3a |
| III4a | M4a |
| III5a | M5a |
| III6a | M6a |
| III7a | M7a |
| III8a | M8a |
| III10a | M10a |
| III10b | M10b |
| III10c | M10c |
| III12a | M12a |
| III13a | M13a |
| III14a | M14a |
| III17a | M17a |
| III20a | M20a |
| III20b | M20b |
| III20c | M20c |
| III21a | M21a |
| III21b | M21b |
| III22a | M22a |
| III22b | M22b |
| III23a | M23a |
| III23b | M23b |

Very particularly preferred structural units of the formula (III) are structural units in which $Ar^9$ is selected from the groups of the formulae M1c to M14c, as shown in the following Table 9.

TABLE 9

| Formula (III) | $Ar^9$ |
|---|---|
| III1c | M1c |
| III1d | M1d |
| III2d | M2d |
| III2e | M2e |
| III2f | M2f |
| III7b | M7b |
| III10d | M10d |
| III12b | M12b |
| III13b | M13b |
| III14b | M14b |
| III14c | M14c |
| III17b | M17b |
| III20d | M20d |
| III20e | M20e |
| III20f | M20f |
| III20g | M20g |
| III20h | M20h |
| III20i | M20i |
| III20j | M20j |
| III20k | M20k |
| III21c | M21c |
| III22c | M22c |
| III22d | M22d |
| III23c | M23c |
| III23d | M23d |

In accordance with the invention, at least one of the structural units of the formula (I) and/or (II) contains at least one crosslinkable group Q, i.e.:

a) at least one of the structural units of the formula (I) contains at least one crosslinkable group, or b) at least one of the structural units of the formula (II) or (IIa) or (IIb) contains at least one crosslinkable group, or c) at least one of the structural units of the formula (I) and at least one of the structural units of the formula (II) or (IIa) or (IIb) contains at least one crosslinkable group.

Preference is given to alternatives a) and b), where alternative a) is particularly preferred, i.e. at least one of the structural units of the formula (I) contains at least one crosslinkable group.

At least one crosslinkable group in the present application means that a structural unit contains one or more crosslinkable groups. A structural unit preferably contains one crosslinkable group.

If the structural unit of the formula (II) or (IIa) or (IIb) contains the crosslinkable group, this can be bonded to $Ar^4$, $Ar^5$, $Ar^6$, $Ar^7$ or $Ar^8$. The crosslinkable group is preferably bonded to one of the monovalent-bonded, mono- or polycyclic, aromatic or heteroaromatic ring systems, i.e. to $Ar^4$ or $Ar^6$ in the case of the formula (IIa) and to $Ar^6$ or $Ar^7$ in the case of the formula (IIb).

If the structural unit of the formula (I) contains the crosslinkable group, this can be bonded to $Ar^1$, $Ar^2$ or $Ar^3$. The crosslinkable group is preferably bonded to the monovalent-bonded, mono- or polycyclic, aromatic or heteroaromatic ring system $Ar^1$.

As described above, the crosslinkable group Q is a functional group which is capable of undergoing a chemical reaction and thus forming an insoluble polymeric compound. In general, all groups Q which are known to the person skilled in the art for this purpose can be employed. The task of this group is, in particular, to link the polymeric compounds according to the invention to one another, optionally to further reactive polymeric compounds, by a crosslinking reaction. This results in a crosslinked compound, or, if the reaction is carried out in a layer, in a crosslinked layer. A crosslinked layer in the sense of the present application is taken to mean a layer which is obtainable by carrying out the crosslinking reaction from a layer of the crosslinkable, polymeric compound according to the invention. The crosslinking reaction can in general be initiated by heat and/or by UV, microwave, X-ray or electron radiation and/or by the use of free-radical formers, anions, cations, acids and/or photoacids. The presence of catalysts may likewise be helpful or necessary. The crosslinking reaction is preferably a reaction for which no initiator and no catalyst has to be added.

Crosslinkable groups Q which are preferred in accordance with the invention are the groups mentioned below:

a) Terminal or cyclic alkenyl or terminal dienyl and alkynyl groups:
   Suitable units are those which contain a terminal or cyclic double bond, a terminal dienyl group or a terminal triple bond, in particular terminal or cyclic alkenyl, terminal dienyl or terminal alkynyl groups having 2 to 40 C atoms, preferably having 2 to 10 C atoms, where individual $CH_2$ groups and/or individual H atoms may also be replaced by the above-mentioned groups R. Furthermore suitable are also groups which are to be regarded as precursors and are capable of the in-situ formation of a double or triple bond.

b) Alkenyloxy, dienyloxy or alkynyloxy groups:
   Furthermore suitable are alkenyloxy, dienyloxy or alkynyloxy groups, preferably alkenyloxy groups.

c) Acrylic acid groups:
   Furthermore suitable are acrylic acid units in the broadest sense, preferably acrylates, acrylamides, methacrylates and methacrylamides. $C_{1-10}$-alkyl acrylate and $C_{1-10}$-alkyl methacrylate are particularly preferred.

The crosslinking reaction of the groups mentioned above under a) to c) can take place via a free-radical, cationic or anionic mechanism, but also via cycloaddition.

It may be helpful to add a corresponding initiator for the crosslinking reaction. Suitable initiators for free-radical crosslinking are, for example, dibenzoyl peroxide. AIBN or TEMPO. Suitable initiators for cationic crosslinking are, for example, $AlCl_3$, $BF_3$, triphenylmethyl perchlorate or tropylium hexachloroantimonate. Suitable initiators for anionic crosslinking are bases, in particular butyllithium.

In a preferred embodiment of the present invention, however, the crosslinking is carried out without the addition of an initiator and is initiated exclusively thermally. This preference is due to the fact that the absence of the initiator prevents contamination of the layer, which could result in impairment of the device properties.

d) Oxetanes and oxiranes:
A further suitable class of crosslinkable groups Q are oxetanes and oxiranes, which crosslink cationically by ring opening.

It may be helpful to add a corresponding initiator for the crosslinking reaction. Suitable initiators are, for example, $AlCl_3$, $BF_3$, triphenylmethyl perchlorate or tropylium hexachloroantimonate. Photoacids can likewise be added as initiators.

e) Silanes:
Furthermore suitable as a class of crosslinkable groups are silane groups $SiR_3$, where at least two groups R, preferably all three groups R, stand for Cl or an alkoxy group having 1 to 20 C atoms. This group reacts in the presence of water to give an oligo- or polysiloxane.

f) Cyclobutane groups
The above-mentioned crosslinkable groups Q are generally known to the person skilled in the art, as are the suitable reaction conditions which are used for the reaction of these groups.

Preferred crosslinkable groups Q include alkenyl groups of the following formula Q1, dienyl groups of the following formula Q2, alkynyl groups of the following formula Q3, alkenyloxy groups of the following formula Q4, dienyloxy groups of the following formulae Q5, alkynyloxy groups of the following formula Q6, acrylic acid groups of the following formulae Q7 and Q8, oxetane groups of the following formulae Q9 and Q10, oxirane groups of the following formula Q11 and cyclobutane groups of the following formula Q12:

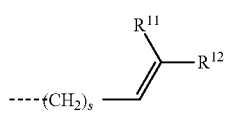

Q1

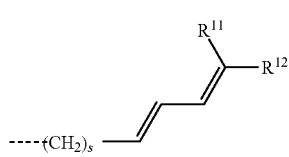

Q2

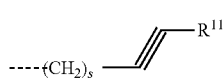

Q3

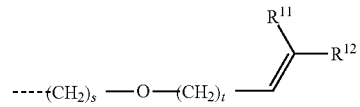

Q4

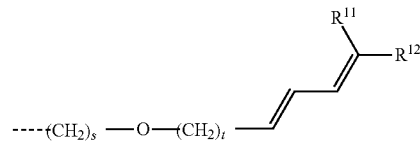

Q5

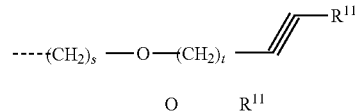

Q6

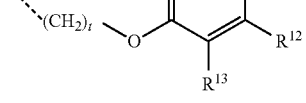

Q7

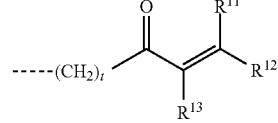

Q8

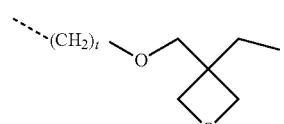

Q9

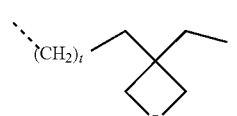

Q10

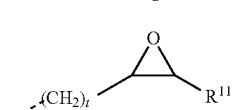

Q11

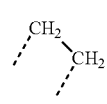

Q12

The radicals $R^{11}$, $R^{12}$ and $R^{13}$ in the formulae Q1 to Q8 and Q11 are on each occurrence, identically or differently, H, a straight-chain or branched alkyl group having 1 to 6 C atoms, preferably 1 to 4 C atoms. The radicals $R^{11}$, $R^{12}$ and $R^{13}$ are particularly preferably H, methyl, ethyl, n-propyl, isopropyl, n-butyl, sec-butyl or tert-butyl and very particularly preferably H or methyl. The indices used have the following meaning: s=0 to 8; and t=1 to 8.

The dashed bond in the formulae Q1 to Q11 and the dashed bonds in the formula Q12 represent the linking of the crosslinkable group to one of the mono- or polycyclic, aromatic or heteroaromatic ring systems $Ar^1$ to $Ar^8$.

The crosslinkable groups of the formulae Q1 to Q12 may be linked directly to one of the mono- or polycyclic, aromatic or heteroaromatic ring systems $Ar^1$ to $Ar^8$, or else indirectly, via a further mono- or polycyclic, aromatic or heteroaromatic ring system $Ar^{10}$, as depicted in the following formulae Q13 to Q24:

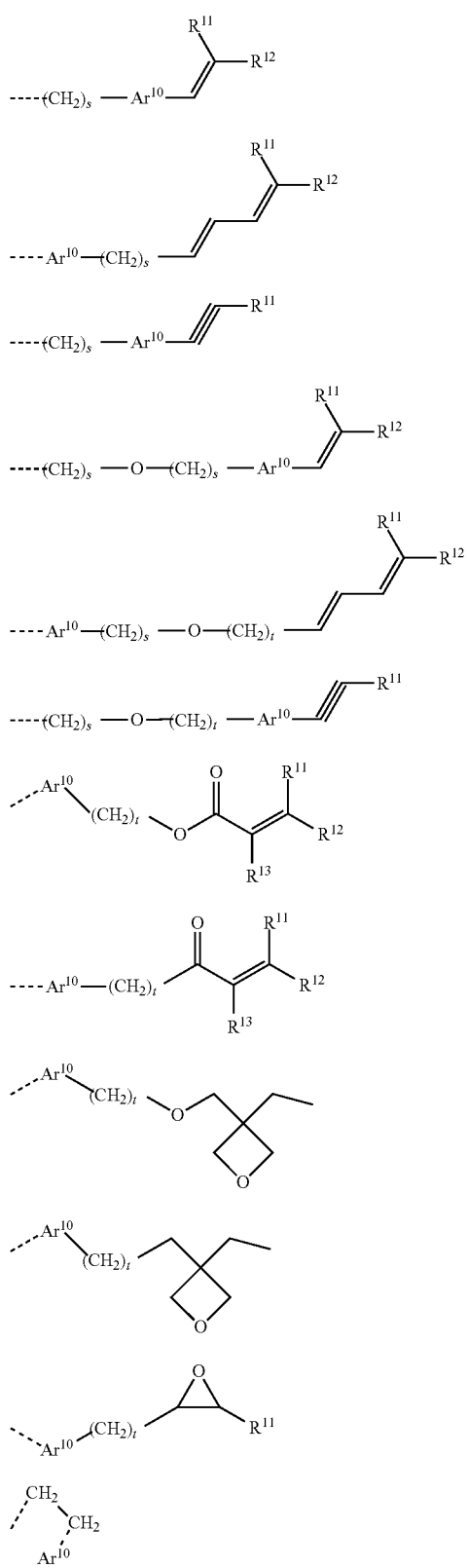
where Ar¹⁰ in the formulae Q13 to Q24 can adopt the same meanings as Ar⁹, in particular the preferred, particularly preferred and very particularly preferred meanings of Ar⁹.
Particularly preferred crosslinkable groups Q are the following:
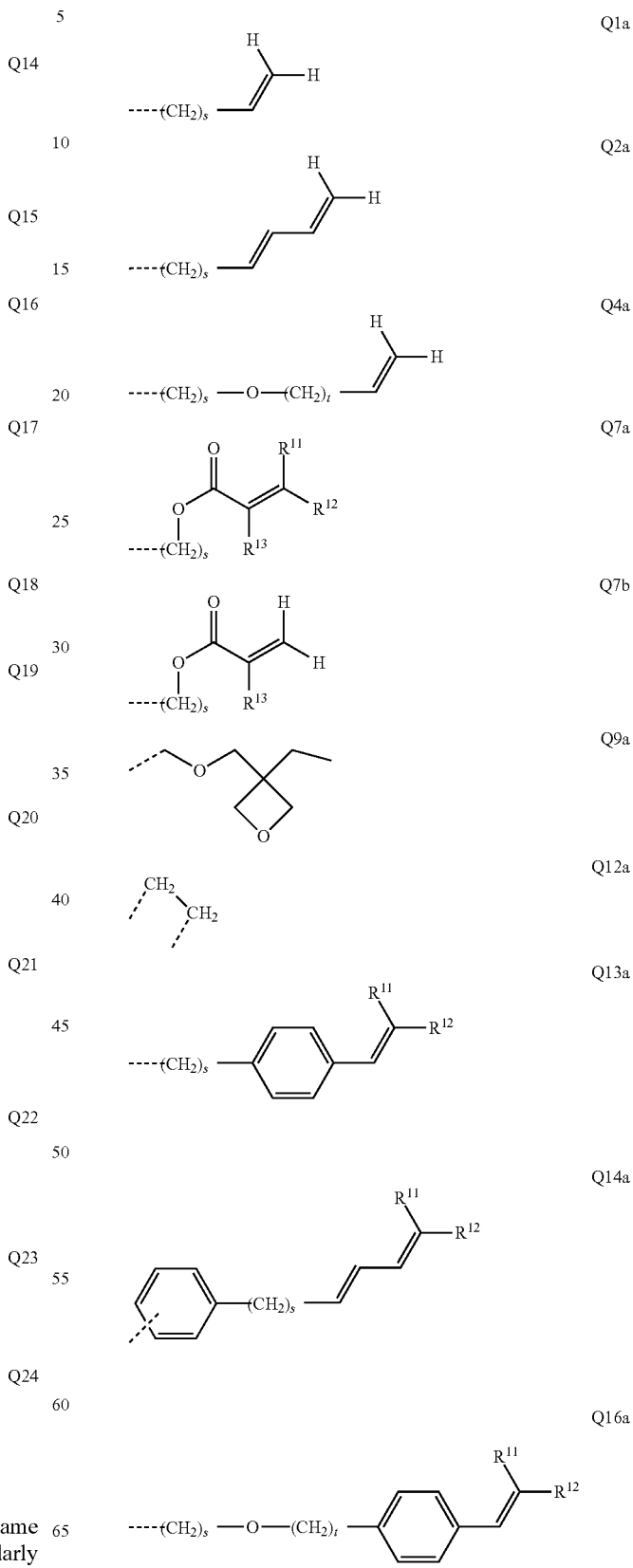

-continued

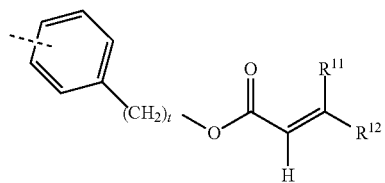
Q19a

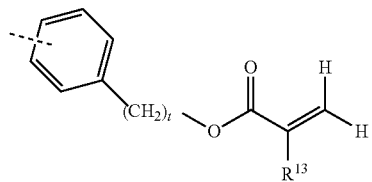
Q19b

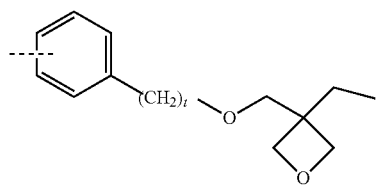
Q21a

Q24a

The radicals $R^{11}$ and $R^{12}$ in the formulae Q7a and Q13a to Q19a are on each occurrence, identically or differently, H or a straight-chain or branched alkyl group having 1 to 6 C atoms, preferably 1 to 4 C atoms. The radicals $R^{11}$ and $R^{12}$ are particularly preferably methyl, ethyl, n-propyl, isopropyl, n-butyl, sec-butyl or tert-butyl and very particularly preferably methyl.

The radical $R^{13}$ in the formulae Q7b and Q19b is on each occurrence a straight-chain or branched alkyl group having 1 to 6 C atoms, preferably 1 to 4 C atoms. The radical $R^{13}$ is particularly preferably methyl, ethyl, n-propyl, isopropyl, n-butyl, sec-butyl or tert-butyl and very particularly preferably methyl.

The indices used have the following meaning: s=0 to 8 and t=1 to 8.

Very particularly preferred crosslinkable groups Q are the following:

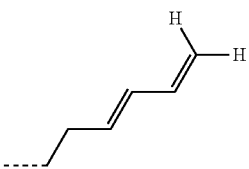
Q1b

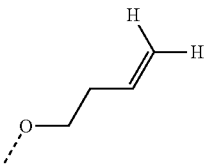
Q1c

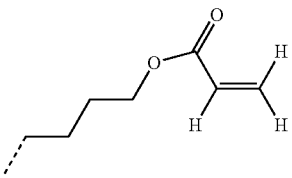
Q2b

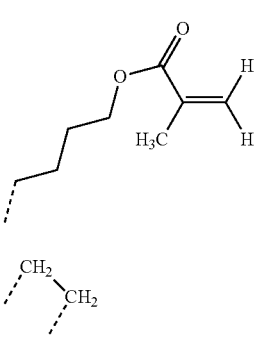
Q2c

Q4b

Q7c

Q7d

Q12b

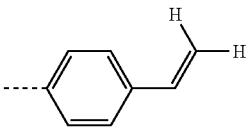
Q13b

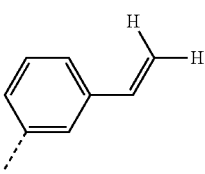
Q13c

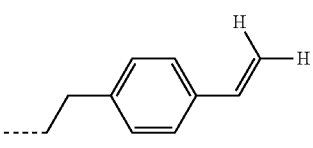
Q13d

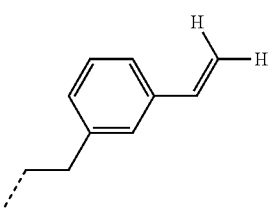
Q13e

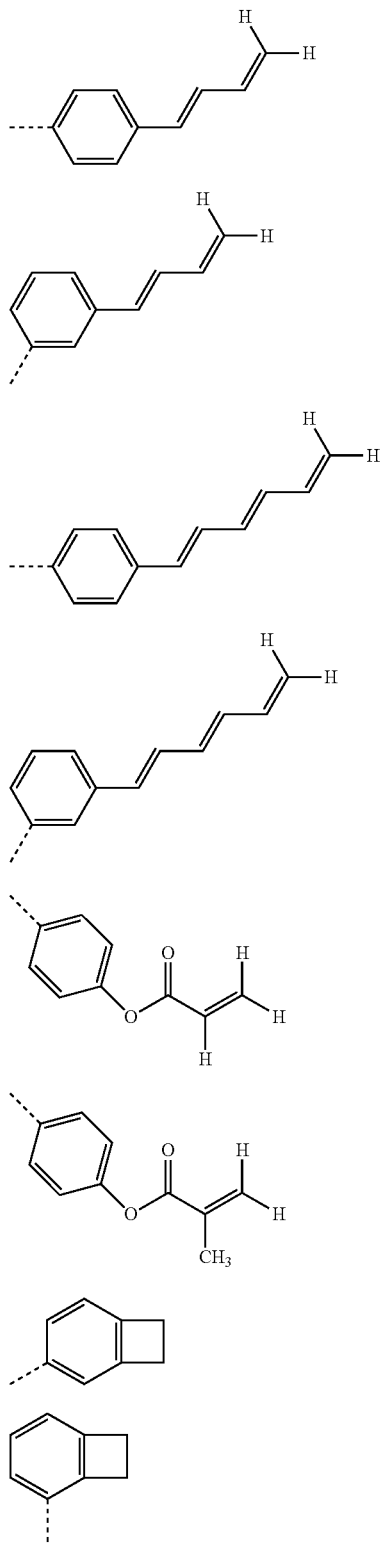

In the preferred groups Q1 to Q24, in the particularly preferred groups Q1a to Q24a and in the very particularly preferred groups Q1b to Q24c, the dashed lines represent the bonds to the mono- or polycyclic, aromatic or heteroaromatic ring systems Ar¹ to Ar⁸. It should be noted in this connection that the groups Q12 and Q24 each have two bonds to two adjacent ring carbon atoms of a mono- or polycyclic, aromatic or heteroaromatic ring system. All other crosslinkable groups have only one bond to the mono- or polycyclic, aromatic or heteroaromatic ring system.

As explained above, the crosslinkable group Q can be bonded to each of the mono- or polycyclic, aromatic or heteroaromatic ring systems $Ar^1$ to $Ar^8$.

If the structural unit of the formula (I) contains the crosslinkable group Q, this can be bonded to $Ar^1$, $Ar^2$ or $Ar^3$. The crosslinkable group is preferably bonded to the monovalent-bonded, mono- or polycyclic, aromatic or heteroaromatic ring system $Ar^1$.

If the structural unit of the formula (II) or (IIa) or (IIb) contains the crosslinkable group Q, this can be bonded to $Ar^4$, $Ar^6$, $Ar^7$ or $Ar^8$. The crosslinkable group is preferably bonded to one of the monovalent-bonded, mono- or polycyclic, aromatic or heteroaromatic ring systems, i.e. to $Ar^4$ or $Ar^6$ in the case of the formula (IIa) and to $Ar^6$ or $Ar^7$ in the case of the formula (IIb).

The structural unit of the formula (I) particularly preferably contains the crosslinkable group Q, to be precise on the monovalent-bonded, mono- or polycyclic, aromatic or heteroaromatic ring system $Ar^1$.

The crosslinkable group Q can be bonded at any free site, i.e. to any C atom which still has a free valence.

The bonding of the crosslinkable group Q is described in detail below with respect to the bonding to $Ar^1$, the particularly preferred embodiment. However, the same comments also apply to $Ar^4$ and $Ar^6$ in formula (IIa) and to $Ar^6$ and $Ar^7$ in formula (IIb).

The preferred crosslinkable groups Q1 to Q24 here are preferably bonded to the preferred groups E1 to E12 of $Ar^1$. The particularly preferred groups Q1a to Q24a here are preferably bonded to the particularly preferred groups E1a to E12a of $Ar^1$. The very particularly preferred groups Q1b to Q24c here are preferably bonded to the very particularly preferred groups E1b to E12b of Ar1. Each of the said crosslinkable groups Q can be bonded to each of the said groups E.

Preferred crosslinkable, mono- or polycyclic, aromatic or heteroaromatic groups $Ar^1$ in formula (I) are the following:

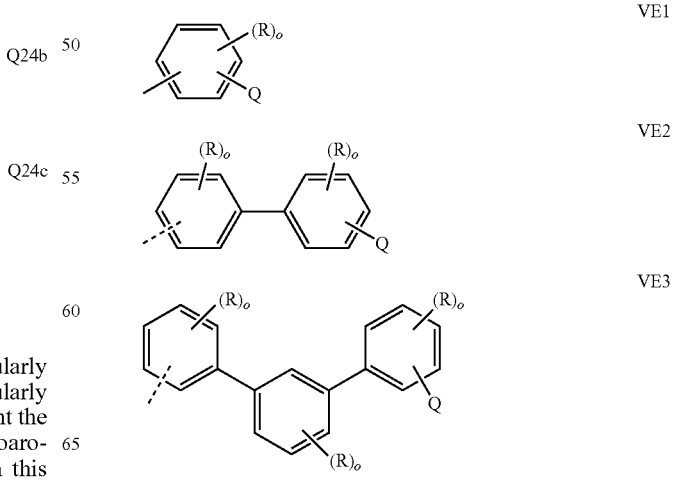

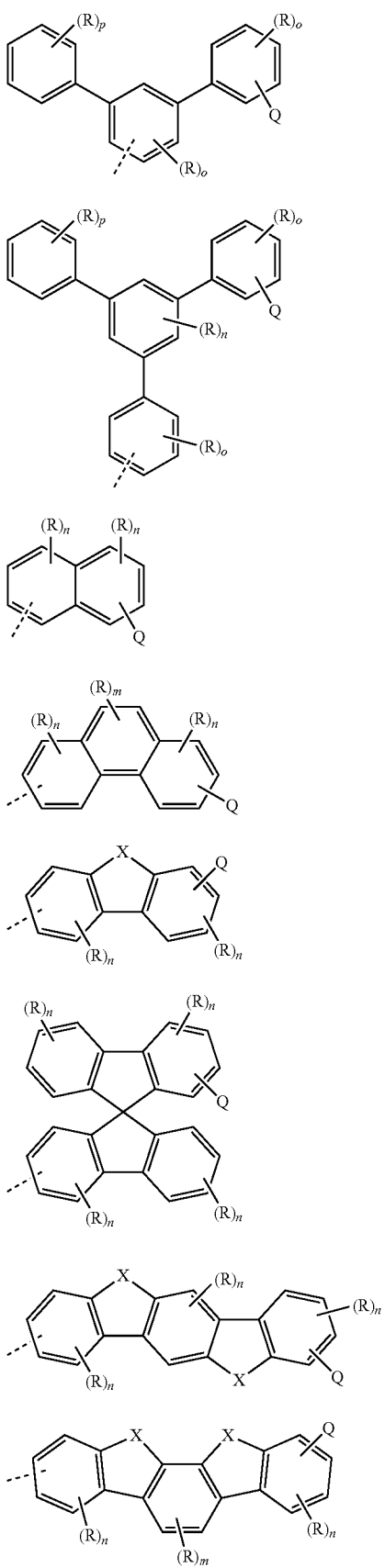

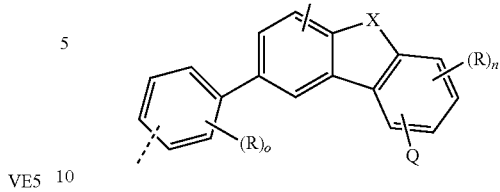

The radicals R in the formulae VE1 to VE12 can adopt the same meaning as the radicals R in the formulae (I) and (II). X can denote $CR_2$, $SiR_2$, NR, O or S, where here too R can adopt the same meaning as the radicals R in the formulae (I) and (II).

The indices used have the following meaning:

m=0, 1 or 2;

n=0, 1, 2 or 3;

o=0, 1, 2, 3 or 4; and p=0, 1, 2, 3, 4 or 5.

Particularly preferred crosslinkable, mono- or polycyclic, aromatic or heteroaromatic groups $Ar^1$ are the following:

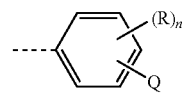

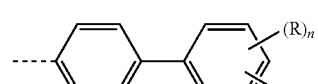

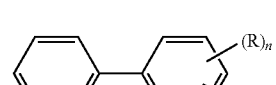

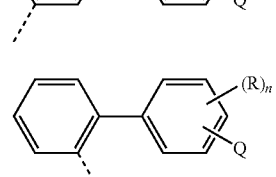

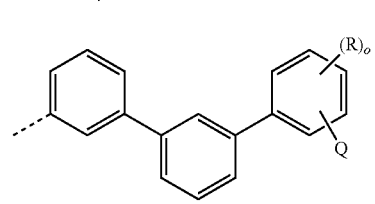

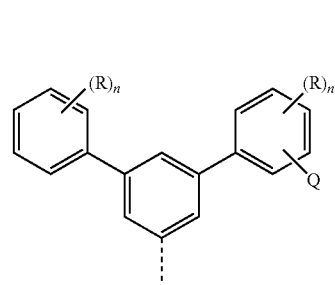

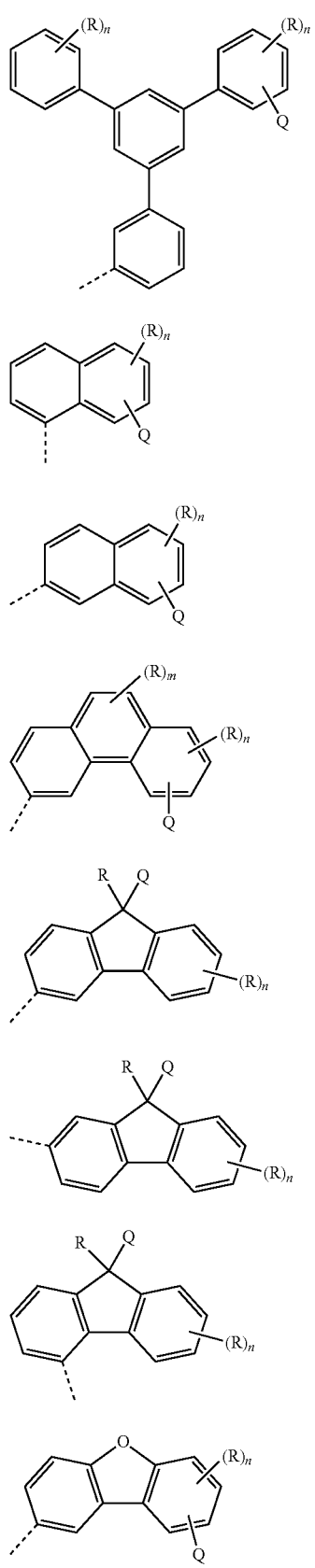
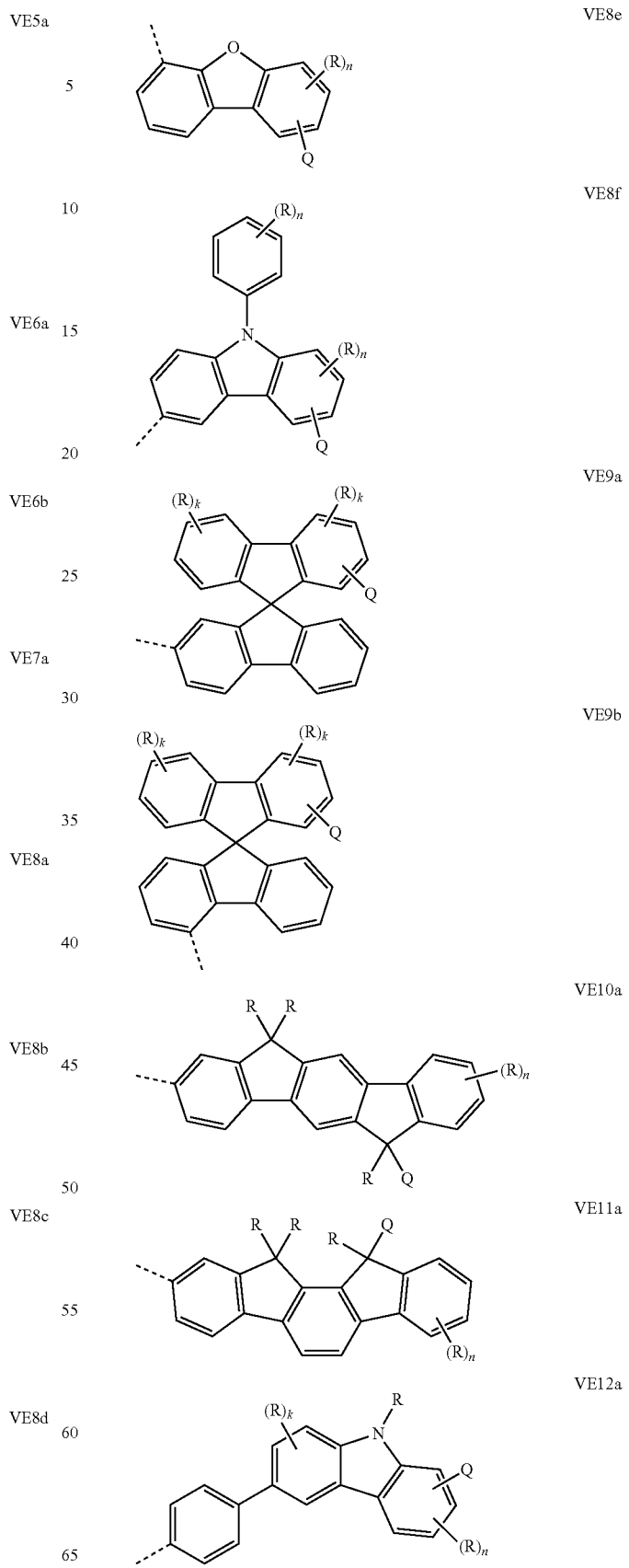

The radicals R in the formulae VE1a to VE12a can adopt the same meaning as the radicals R in the formulae (I) and (II). In addition, at least one of the radicals R can also adopt the meaning Q, i.e. can denote a further crosslinkable group Q in the groups $Ar^1$.

The indices used have the following meaning:

k=0 or 1; and n=0, 1, 2 or 3.

Very particularly preferred crosslinkable, mono- or polycyclic, aromatic or heteroaromatic groups $Ar^1$ are the following:

VE1b

VE1c
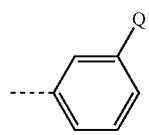

VE1d
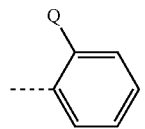

VE1e
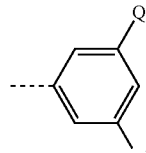

VE1f
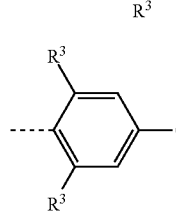

VE2d
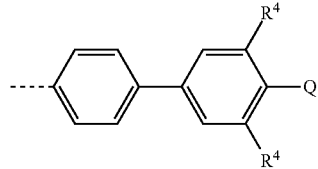

VE2e
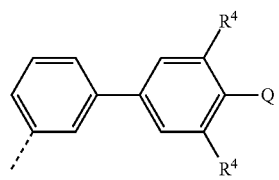

VE2f
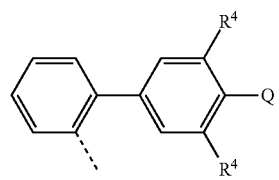

-continued

VE3b
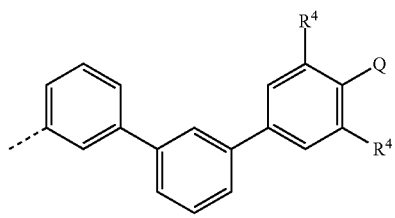

VE4b
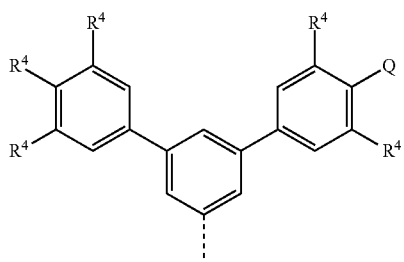

VE4c
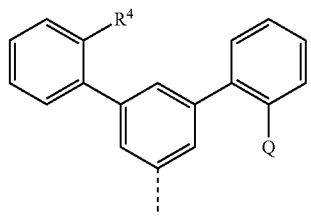

VE4d
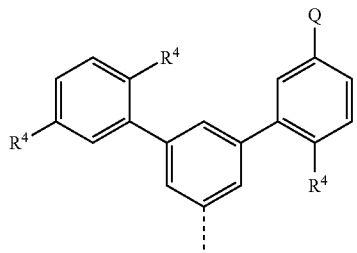

VE4e
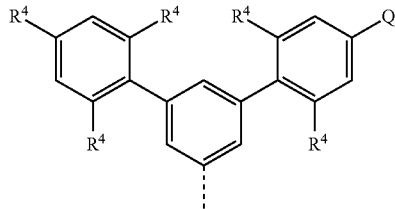

VE5b
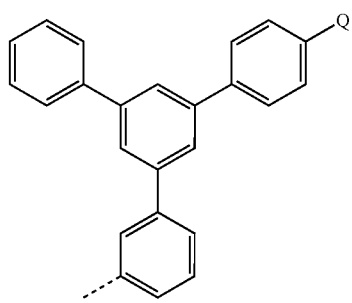

VE8g 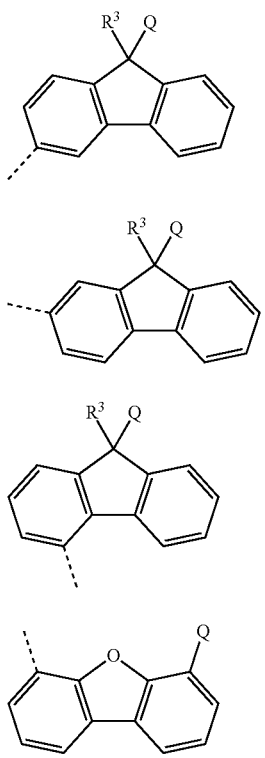

VE8h

VE8i

VE8j 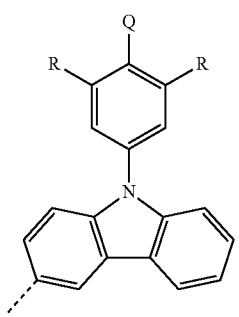

VE8k 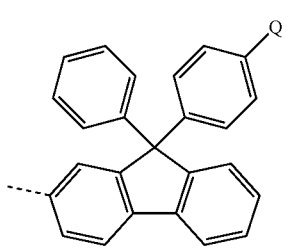

VE8l 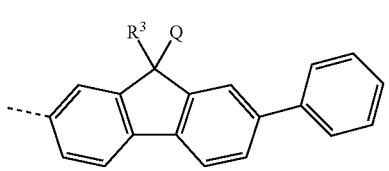

VE8m

VE9c 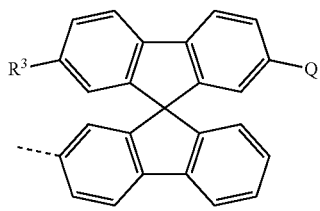

VE9d 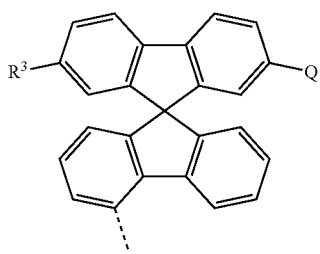

VE12b 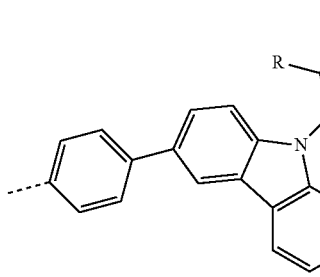

The radicals $R^3$ in the formulae VE1e, VE1f, VE8g, VE8h, VE8i, VE8m, VE9c and VE9d are on each occurrence, identically or differently, H or a straight-chain or branched alkyl group having 1 to 12 C atoms, preferably 1 to 10 C atoms. The radicals $R^3$ are particularly preferably methyl, n-butyl, sec-butyl, tert-butyl, n-hexyl and n-octyl. In addition, at least one of the radicals $R^3$ can also adopt the meaning Q, i.e. can denote a further crosslinkable group Q in the groups $Ar^1$.

The radicals $R^4$ in the formulae VE2d to VE2f, VE3b and VE4b to VE4e are on each occurrence, identically or differently, H or a straight-chain or branched alkyl group having 1 to 6 C atoms, preferably 1 to 4 C atoms. The radicals $R^4$ are particularly preferably methyl, n-butyl, sec-butyl or tert-butyl. In addition, at least one of the radicals $R^4$ can also adopt the meaning Q, i.e. can denote a further crosslinkable group Q in the groups $Ar^1$.

The radicals R in the formulae VE12b are identical or different on each occurrence and can adopt the same meaning as the radicals R in the formulae (I) and (II).

Preferred crosslinkable structural units of the formula (Iv)

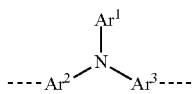 (Iv)

are structural units in which $Ar^1$ is selected from the groups of the formulae VE1 to VE12, $Ar^2$ and $Ar^3$ are selected from the groups of the formulae M1 to M19, where it is particularly preferred for $Ar^2$ and $Ar^3$ to be identical, and Q is selected from the groups Q1 to Q24.

A selection of preferred crosslinkable structural units of the formula (Iv) is shown in the following Table 10.

TABLE 10

| Formula (I) | Ar¹ | Q | Ar² | Ar³ |
|---|---|---|---|---|
| Iv1 | VE1 | Q1 | M1 | M1 |
| Iv2 | VE1 | Q14 | M2 | M2 |
| Iv3 | VE1 | Q7 | M10 | M10 |
| Iv4 | VE1 | Q2 | M12 | M12 |
| Iv5 | VE1 | Q2 | M14 | M14 |
| Iv6 | VE1 | Q10 | M19 | M19 |
| Iv7 | VE2 | Q13 | M1 | M1 |
| Iv8 | VE2 | Q24 | M2 | M1 |
| Iv9 | VE2 | Q19 | M7 | M7 |
| Iv10 | VE2 | Q2 | M12 | M12 |
| Iv11 | VE2 | Q13 | M13 | M13 |
| Iv12 | VE3 | Q1 | M1 | M1 |
| Iv13 | VE3 | Q14 | M13 | M13 |
| Iv14 | VE4 | Q7 | M1 | M1 |
| Iv15 | VE4 | Q19 | M2 | M2 |
| Iv16 | VE4 | Q24 | M14 | M14 |
| Iv17 | VE5 | Q16 | M3 | M3 |
| Iv18 | VE5 | Q13 | M12 | M12 |
| Iv19 | VE6 | Q9 | M6 | M6 |
| Iv20 | VE6 | Q16 | M10 | M10 |
| Iv21 | VE6 | Q3 | M16 | M16 |
| Iv22 | VE7 | Q9 | M2 | M2 |
| Iv23 | VE7 | Q20 | M15 | M15 |
| Iv24 | VE8 | Q13 | M1 | M1 |
| Iv25 | VE8 | Q19 | M2 | M2 |
| Iv26 | VE8 | Q16 | M4 | M4 |
| Iv27 | VE8 | Q21 | M5 | M5 |
| Iv28 | VE8 | Q2 | M10 | M10 |
| Iv29 | VE8 | Q24 | M12 | M12 |
| Iv30 | VE8 | Q14 | M14 | M14 |
| Iv31 | VE9 | Q4 | M1 | M1 |
| Iv32 | VE9 | Q21 | M8 | M8 |
| Iv33 | VE9 | Q1 | M13 | M13 |
| Iv34 | VE10 | Q9 | M10 | M10 |
| Iv35 | VE11 | Q5 | M9 | M9 |
| Iv36 | VE11 | Q9 | M17 | M17 |
| Iv37 | VE12 | Q1 | M7 | M7 |
| Iv38 | VE12 | Q12 | M18 | M18 |
| Iv39 | VE1 | Q12 | M1 | M1 |

Particularly preferred crosslinkable structural units of the formula (Iv) are structural units in which Ar¹ is selected from the groups of the formulae VE1a to VE12a, Ar² and Ar³ are selected from the groups of the formulae M1a to M17a, where it is particularly preferred for Ar² and Ar³ to be identical, and Q is selected from the groups Q1a to Q24a.

A selection of particularly preferred crosslinkable structural units of the formula (Iv) is shown in the following Table 11.

TABLE 11

| Formula (I) | Ar¹ | Q | Ar² | Ar³ |
|---|---|---|---|---|
| Iv1a | VE1a | Q1a | M1a | M1a |
| Iv2a | VE1a | Q14a | M2a | M2a |
| Iv2b | VE1a | Q14a | M2c | M2c |
| Iv3a | VE1a | Q7a | M10a | M10a |
| Iv4a | VE1a | Q2a | M12a | M12a |
| Iv5a | VE1a | Q2a | M14a | M14a |
| Iv7a | VE2a | Q13a | M1b | M1b |
| Iv7b | VE2c | Q13b | M1a | M1a |
| Iv8a | VE2c | Q24a | M2c | M1a |
| Iv9a | VE2b | Q19b | M7a | M7a |
| Iv10a | VE2a | Q2a | M12a | M12a |
| Iv11a | VE2a | Q13a | M13a | M13a |
| Iv12a | VE3a | Q1a | M1b | M1b |
| Iv13a | VE3a | Q14a | M13a | M13a |
| Iv14a | VE4a | Q7b | M1a | M1a |
| Iv15a | VE4a | Q19a | M2a | M2a |
| Iv15b | VE4a | Q19a | M2b | M2b |
| Iv16a | VE4a | Q24a | M14a | M14a |
| Iv17a | VE5a | Q16a | M3a | M3a |
| Iv18a | VE5a | Q13a | M12a | M12a |
| Iv19a | VE6a | Q9a | M6a | M6a |
| Iv20a | VE6b | Q16a | M10b | M10b |
| Iv22a | VE7a | Q9a | M2a | M2a |
| Iv24a | VE8a | Q13a | M1a | M1a |
| Iv24b | VE8b | Q13a | M1b | M1b |
| Iv24c | VE8e | Q13a | M1a | M1a |
| Iv24d | VE8f | Q13a | M1b | M1b |
| Iv25a | VE8a | Q19b | M2c | M2c |
| Iv25b | VE8b | Q19b | M2b | M2b |
| Iv25c | VE8f | Q19a | M2c | M2c |
| Iv26a | VE8c | Q16a | M4a | M4a |
| Iv27a | VE8d | Q21a | M5a | M5a |
| Iv28a | VE8c | Q2a | M10a | M10a |
| Iv29a | VE8b | Q24a | M12a | M12a |
| Iv30a | VE8e | Q14a | M14a | M14a |
| Iv31a | VE9b | Q4a | M1a | M1a |
| Iv32a | VE9a | Q21a | M8a | M8a |
| Iv33a | VE9a | Q1a | M13a | M13a |
| Iv34a | VE10a | Q9a | M10c | M10c |
| Iv36a | VE11a | Q9a | M17a | M17a |
| Iv37a | VE12a | Q1a | M7a | M7a |
| Iv39a | VE1a | Q12a | M1a | M1a |

Very particularly preferred structural units of the formula (Iv) are structural units in which Ar¹ is selected from the groups of the formulae VE1b to VE12b, Ar² and Ar³ are selected from the groups of the formulae M1b to M14c, and Q is selected from the groups Q1b to Q24c.

A selection of very particularly preferred structural units of the formula (Iv) is shown in the following Table 12.

TABLE 12

| Formula (I) | Ar¹ | Q | Ar² | Ar³ |
|---|---|---|---|---|
| Iv1b | VE1b | Q1b | M1c | M1c |
| Iv1c | VE1e | Q1c | M1c | M1c |
| Iv1d | VE1c | Q1b | M1c | M1c |
| Iv2c | VE1c | Q14b | M2d | M2d |
| Iv2d | VE1e | Q14d | M2f | M2f |
| Iv2e | VE1f | Q14d | M2f | M2f |
| Iv3b | VE1d | Q7c | M10d | M10d |
| Iv4b | VE1f | Q2b | M12b | M12b |
| Iv5b | VE1c | Q2b | M14b | M14b |
| Iv5c | VE1d | Q2c | M14b | M14c |
| Iv7c | VE2d | Q13b | M1d | M1d |
| Iv7d | VE2f | Q13e | M1c | M1c |
| Iv8b | VE2f | Q24b | M2f | M1c |
| Iv9b | VE2e | Q19d | M7b | M7b |
| Iv10b | VE2e | Q2c | M12b | M12b |
| Iv11b | VE2d | Q13c | M13b | M13b |
| Iv12b | VE3b | Q1b | M1d | M1d |
| Iv13b | VE3b | Q14c | M13b | M13b |
| Iv14b | VE4c | Q7d | M1c | M1c |
| Iv14c | VE4d | Q7d | M1c | M1c |
| Iv15c | VE4b | Q19d | M2e | M2e |
| Iv15d | VE4e | Q19c | M2d | M2d |
| Iv16b | VE4b | Q24c | M14c | M14c |
| Iv18b | VE5b | Q13b | M12b | M12b |
| Iv24e | VE8g | Q13e | M1c | M1c |
| Iv24f | VE8j | Q13b | M1c | M1c |
| Iv24g | VE8k | Q13d | M1d | M1d |
| Iv24h | VE8l | Q13c | M1d | M1d |
| Iv25d | VE8g | Q19d | M2f | M2f |
| Iv25e | VE8h | Q19d | M2e | M2e |
| Iv25f | VE8k | Q19c | M2f | M2f |
| Iv28b | VE8i | Q2b | M10d | M10d |
| Iv29b | VE8m | Q24c | M12b | M12b |
| Iv30b | VE8j | Q14e | M14b | M14b |
| Iv31b | VE9d | Q4b | M1c | M1c |
| Iv33b | VE9c | Q1b | M13b | M13b |
| Iv37b | VE12b | Q1c | M7b | M7b |
| Iv39b | VE1b | Q12b | M1c | M1c |

Preferred crosslinkable structural units of the formula (IIva)

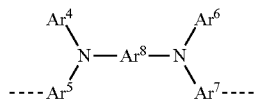

are structural units in which $Ar^4$ is selected from the groups of the formulae E1 to E12, $Ar^5$, $Ar^7$ and $Ar^8$, independently of one another, identically or differently, are selected from the groups of the formulae M1 to M19, where it is particularly preferred for $Ar^5$ and $Ar^7$ to be identical, $Ar^8$ is selected from the groups VE1 to VE12 and Q is selected from the groups Q1 to Q24.

Preferred crosslinkable structural units of the formula (IIvb)

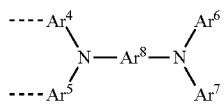

are structural units in which $Ar^7$ is selected from the groups of the formulae E1 to E12, $Ar^4$, $Ar^5$ and $Ar^8$, independently of one another, identically or differently, are selected from the groups of the formulae M1 to M19, where it is particularly preferred for $Ar^4$ and $Ar^5$ to be identical, $Ar^6$ is selected from the groups of the formulae VE1 to VE12 and Q is selected from the groups Q1 to Q24.

A selection of preferred structural units of the formula (IIva) or (IIvb) is shown in the following Table 13.

TABLE 13

| | Formula (IIva) | | | | | |
|---|---|---|---|---|---|---|
| | $Ar^4$ | $Ar^6$ | Q | $Ar^5$ | $Ar^7$ | $Ar^8$ |
| | Formula (IIvb) | | | | | |
| | $Ar^7$ | $Ar^6$ | Q | $Ar^5$ | $Ar^4$ | $Ar^8$ |
| IIv1 | E1 | VE1 | Q1 | M1 | M1 | M1 |
| IIv2 | E1 | VE1 | Q13 | M1 | M1 | M2 |
| IIv3 | E1 | VE1 | Q19 | M1 | M1 | M10 |
| IIv4 | E1 | VE1 | Q2 | M1 | M1 | M13 |
| IIv5 | E1 | VE1 | Q13 | M1 | M1 | M14 |
| IIv6 | E1 | VE1 | Q24 | M14 | M14 | M12 |
| IIv7 | E2 | VE2 | Q13 | M1 | M1 | M2 |
| IIv8 | E2 | VE2 | Q7 | M2 | M2 | M12 |
| IIv9 | E3 | VE3 | Q4 | M7 | M7 | M1 |
| IIv10 | E3 | VE3 | Q22 | M10 | M10 | M16 |
| IIv11 | E4 | VE4 | Q4 | M1 | M1 | M7 |
| IIv12 | E4 | VE4 | Q1 | M1 | M1 | M12 |
| IIv13 | E4 | VE4 | Q14 | M2 | M2 | M14 |
| IIv14 | E4 | VE4 | Q24 | M10 | M10 | M13 |
| IIv15 | E4 | VE8 | Q19 | M1 | M1 | M7 |
| IIv16 | E5 | VE5 | Q14 | M2 | M13 | M13 |
| IIv17 | E6 | VE6 | Q21 | M3 | M3 | M6 |
| IIv18 | E6 | VE6 | Q16 | M17 | M17 | M10 |
| IIv19 | E7 | VE7 | Q9 | M5 | M5 | M4 |
| IIv20 | E8 | VE8 | Q14 | M1 | M1 | M1 |
| IIv21 | E8 | VE8 | Q19 | M1 | M1 | M2 |
| IIv22 | E8 | VE8 | Q1 | M1 | M1 | M12 |
| IIv23 | E8 | VE8 | Q9 | M2 | M2 | M10 |
| IIv24 | E8 | VE8 | Q21 | M6 | M6 | M8 |
| IIv25 | E8 | VE8 | Q7 | M10 | M10 | M7 |
| IIv26 | E8 | VE8 | Q13 | M13 | M13 | M2 |
| IIv27 | E8 | VE8 | Q7 | M14 | M14 | M12 |
| IIv28 | E9 | VE9 | Q24 | M1 | M1 | M2 |
| IIv29 | E9 | VE9 | Q22 | M9 | M9 | M11 |
| IIv30 | E9 | VE9 | Q12 | M19 | M19 | M18 |
| IIv31 | E10 | VE10 | Q9 | M1 | M1 | M4 |
| IIv32 | E11 | VE11 | Q16 | M2 | M2 | M10 |
| IIv33 | E11 | VE11 | Q8 | M13 | M13 | M15 |
| IIv34 | E12 | VE12 | Q14 | M7 | M7 | M14 |
| IIv35 | E1 | VE1 | Q12 | M1 | M1 | M2 |
| IIv36 | E2 | VE2 | Q1 | M1 | M1 | M14 |

Particularly preferred structural units of the formula (IIva) are structural units in which $Ar^4$ is selected from the groups of the formulae E1a to E12a, $Ar^5$, $Ar^7$ and $Ar^8$, independently of one another, identically or differently, are selected from the groups of the formulae M1a to M17a, where it is particularly preferred for $Ar^5$ and $Ar^7$ to be identical, $Ar^6$ is selected from the groups of the formulae VE1a to VE12a and Q is selected from the groups Q1a to Q24a.

Particularly preferred structural units of the formula (IIvb) are structural units in which $Ar^7$ is selected from the groups of the formulae E1a to E12a, $Ar^4$, $Ar^5$ and $Ar^8$, independently of one another, identically or differently, are selected from the groups of the formulae M1a to M17a, where it is particularly preferred for $Ar^4$ and $Ar^5$ to be identical, $Ar^6$ is selected from the groups of the formulae VE1a to VE12a and Q is selected from the groups Q1a to Q24a.

A selection of particularly preferred structural units of the formula (IIva) or (llvb) is shown in the following Table 14.

TABLE 14

| | Formula (IIa) | | | | | |
|---|---|---|---|---|---|---|
| | $Ar^4$ | $Ar^6$ | Q | $Ar^5$ | $Ar^7$ | $Ar^8$ |
| | Formula (IIb) | | | | | |
| | $Ar^7$ | $Ar^6$ | Q | $Ar^5$ | $Ar^4$ | $Ar^8$ |
| IIv1a | E1a | VE1a | Q1a | M1a | M1a | M1a |
| IIv1b | E1a | VE1a | Q1a | M1b | M1b | M1b |
| IIv2a | E1a | VE1a | Q13a | M1a | M1a | M2a |
| IIv3a | E1a | VE1a | Q19b | M1a | M1a | M10a |
| IIv4a | E1a | VE1a | Q2a | M1a | M1a | M13a |
| IIv4b | E1a | VE1a | Q2a | M1b | M1b | M13a |
| IIv5a | E1a | VE1a | Q13a | M1a | M1a | M14a |
| IIv6a | E1a | VE1a | Q24a | M14a | M14a | M12a |
| IIv7a | E2a | VE2a | Q13a | M1a | M1a | M2a |
| IIv7b | E2c | VE2c | Q13a | M1a | M1a | M2a |
| IIv8a | E2b | VE2b | Q7b | M2b | M2b | M12a |
| IIv9a | E3a | VE3a | Q4a | M7a | M7a | M1a |
| IIv11a | E4a | VE4a | Q4a | M1b | M1b | M7a |
| IIv12a | E4a | VE4a | Q1a | M1b | M1b | M12a |
| IIv13a | E4a | VE4a | Q14a | M2b | M2b | M14a |
| IIv14a | E4a | VE4a | Q24a | M10a | M10a | M13a |
| IIv15a | E4a | VE8a | Q19b | M1b | M1b | M7a |
| IIv16a | E5a | VE5a | Q14a | M2c | M13a | M13a |
| IIv17a | E6a | VE6a | Q21a | M3a | M3a | M6a |
| IIv18a | E6b | VE6b | Q16a | M17a | M17a | M10b |
| IIv19a | E7a | VE7a | Q9a | M5a | M5a | M4a |
| IIv20a | E8f | VE8f | Q14a | M1a | M1a | M1a |
| IIv21a | E8b | VE8b | Q19a | M1a | M1a | M2a |
| IIv21b | E8e | VE8e | Q19b | M1a | M1a | M2a |
| IIv22a | E8b | VE8b | Q1a | M1b | M1b | M12a |
| IIv23a | E8d | VE8d | Q9a | M2b | M2b | M10c |
| IIv24a | E8f | VE8f | Q21a | M6a | M6a | M8a |
| IIv25a | E8a | VE8a | Q7a | M10a | M10a | M7a |
| IIv26a | E8c | VE8c | Q13a | M13a | M13a | M2c |

TABLE 14-continued

| | Ar⁴ | Ar⁶ | Q | Ar⁵ | Ar⁷ | Ar⁸ |
| | | | Formula (IIa) | | | |
| | Ar⁷ | Ar⁶ | Q | Ar⁵ | Ar⁴ | Ar⁸ |
| | | | Formula (IIb) | | | |
|---|---|---|---|---|---|---|
| IIv27a | E8b | VE8b | Q7a | M14a | M14a | M12a |
| IIv28a | E9a | VE9a | Q24a | M1a | M1a | M2a |
| IIv28b | E9b | VE9b | Q24a | M1a | M1a | M2a |
| IIv31a | E10a | VE10a | Q9a | M1b | M1b | M4a |
| IIv32a | E11a | VE11a | Q16a | M2c | M2c | M10c |
| IIv34a | E12a | VE12a | Q14a | M7a | M7a | M14a |
| IIv35a | E1a | VE1a | Q12a | M1a | M1a | M2a |
| IIv36a | E2a | VE2a | Q1a | M1a | M1a | M14a |

Very particularly preferred structural units of the formula (IIva) are structural units in which Ar⁴ is selected from the groups of the formulae E1b to E12b, Ar⁵, Ar⁷ and Ar⁸, independently of one another, identically or differently, are selected from the groups of the formulae M1b to M14c, where it is particularly preferred for Ar⁵ and Ar⁷ to be identical, Ar⁶ is selected from the groups of the formulae VE1b to VE12b and Q is selected from the groups Q1b to Q24c.

Very particularly preferred structural units of the formula (IIvb) are structural units in which Ar⁷ is selected from the groups of the formulae E1b to E12b, Ar⁴, Ar⁵ and Ar⁸, independently of one another, identically or differently, are selected from the groups of the formulae M1b to M14c, where it is particularly preferred for Ar⁴ and Ar⁵ to be identical, Ar⁶ is selected from the groups of the formulae VE1b to VE12b and Q is selected from the groups Q1b to Q24c.

A selection of very particularly preferred structural units of the formula (IIva) or (IIvb) is shown in the following Table 15.

TABLE 15

| | Ar⁴ | Ar⁶ | Q | Ar⁵ | Ar⁷ | Ar⁸ |
| | | | Formula (IIva) | | | |
| | Ar⁷ | Ar⁶ | Q | Ar⁵ | Ar⁴ | Ar⁸ |
| | | | Formula (IIvb) | | | |
|---|---|---|---|---|---|---|
| IIv1c | E1b | VE1b | Q1c | M1c | M1c | M1c |
| IIv1d | E1e | VE1e | Q1b | M1d | M2d | M1d |
| IIv2b | E1b | VE1b | Q13b | M1c | M1c | M2d |
| IIv3b | E1b | VE1b | Q19d | M1c | M1c | M10d |
| IIv4c | E1b | VE1b | Q2b | M1c | M1c | M13b |
| IIv4d | E1d | VE1d | Q2c | M1d | M1d | M13b |
| IIv5b | E1c | VE1c | Q13e | M1c | M1c | M14b |
| IIv6b | E1f | VE1f | Q24c | M14b | M14b | M12b |
| IIv7c | E2d | VE2d | Q13d | M1c | M1c | M2d |
| IIv7d | E2f | VE2f | Q13c | M1c | M1c | M2d |
| IIv8b | E2e | VE2e | Q7d | M2e | M2e | M12b |
| IIv9b | E3b | VE3b | Q4b | M7b | M7b | M1d |
| IIv11b | E4d | VE4d | Q4b | M1d | M1d | M7b |
| IIv12b | E4c | VE4c | Q1b | M1d | M1d | M12b |
| IIv13b | E4b | VE4b | Q14d | M2e | M2e | M14c |
| IIv14b | E4e | VE4e | Q24b | M10d | M10d | M13b |
| IIv15b | E4d | VE8g | Q19d | M1d | M1d | M7b |
| IIv16b | E5b | VE5b | Q14e | M2f | M13b | M13b |
| IIv20b | E8k | VE8k | Q14b | M1c | M1c | M1c |
| IIv21c | E8h | VE8h | Q19c | M1c | M1c | M2d |
| IIv21d | E8j | VE8j | Q19d | M1c | M1c | M2d |
| IIv22b | E8m | VE8m | Q1c | M1d | M1d | M12b |
| IIv25b | E8g | VE8g | Q7c | M10d | M10d | M7b |
| IIv26b | E8i | VE8i | Q13e | M13b | M13b | M2f |
| IIv27b | E8l | VE8l | Q7c | M14c | M14c | M12b |
| IIv28c | E9c | VE9c | Q24b | M1c | M1c | M2d |
| IIv28d | E9d | VE9d | Q24c | M1c | M1c | M2d |
| IIv34b | E12b | VE12b | Q14c | M7b | M7b | M14c |
| IIv35b | E1b | VE1b | Q12b | M1c | M1c | M2d |
| IIv36b | E2d | VE2d | Q1b | M1c | M1c | M14b |

Preferred polymers according to the invention contain:
- the preferred structural units (I1) to (I38) of the formula (I);
- the preferred structural units (II1) to (II34) of the formula (II);
- optionally the preferred structural units (III1) to (III19) of the formula (III); and
- the preferred crosslinkable structural units (Iv1) to (Iv39) of the formula (Iv).

A selection of preferred polymers is shown in the following Table 16.

TABLE 16

| Polymer | (I) | (Iv) | (II) | (IIv) | (III) |
|---|---|---|---|---|---|
| P1 | 1 | 1 | 1 | — | 14 |
| P2 | — | 1 | 7 | — | 14 |
| P3 | — | 1 | 7 | — | 12 |
| P4 | 1 | 1 | 4 | — | — |
| P5 | 1 | 1 | 3 | — | — |
| P6 | — | 1 | 4 | — | 14 |
| P7 | — | 1 | 3 | — | 14 |
| P8 | — | 1 | 2 | — | 14 |
| P9 | — | 1 | 2 | — | 7 |
| P10 | — | 1 | 2 | — | 7; 14 |
| P11 | 1 | 1 | 2 | — | — |
| P12 | — | 1 | 4; 7 | — | — |
| P13 | 1 | 1 | 4 | — | 14 |
| P14 | — | 1 | 4; 7 | — | 14 |
| P15 | 1 | 1 | 7 | — | 14 |
| P16 | — | 1 | 7 | — | 17 |
| P17 | — | 1 | 21 | — | 14 |
| P18 | 1 | 1 | 7 | — | 1 |
| P19 | 24 | 2 | 9; 16 | — | — |
| P20 | 31 | 4 | 26 | — | — |
| P21 | 37 | 7 | 12 | — | 12 |
| P22 | 2 | 8 | 7 | — | — |
| P23 | 5 | 11 | 21 | — | 2 |
| P24 | 12; 14 | 14 | 28 | — | 10 |
| P25 | 18 | 16 | 34 | — | 13 |
| P26 | 25 | 24 | 21 | — | — |
| P27 | 29 | 24 | 4 | — | 2 |
| P28 | 33 | 39 | 13 | — | — |
| P29 | 1 | — | 8 | 1 | — |
| P30 | 15 | — | 20 | 2 | 7 |
| P31 | 5 | — | 25 | 4 | — |
| P32 | 7 | — | 28 | 6 | 1 |
| P33 | 31 | — | 11 | 7 | 14 |
| P34 | 2 | — | — | 20 | 10 |
| P35 | 24 | — | — | 35 | — |
| P36 | — | 2 | 7 | — | 2; 14 |
| P37 | — | 5 | 14 | — | 7 |
| P38 | 3 | — | — | 15 | 12 |
| P39 | 9 | — | — | 28 | 14 |
| P40 | 14 | 1; 2 | 2 | — | — |
| P41 | — | 30; 31 | 22 | — | — |
| P42 | — | 1 | 15 | 13 | 10 |
| P43 | 18 | 25 | — | 21 | 2; 12 |
| P44 | 1 | 1 | 35 | — | 14 |
| P45 | 1 | 1 | 35 | — | — |
| P46 | — | 39 | 35 | — | 14 |
| P47 | 1 | 39 | 21 | — | 14 |
| P48 | — | 39 | 3 | — | 14 |

TABLE 16-continued

| Polymer | (I) | (Iv) | (II) | (IIv) | (III) |
|---|---|---|---|---|---|
| P49 | — | 1 | 21 | — | — |
| P50 | — | 1 | 7; 35 | — | 17 |
| P51 | — | 1 | 35 | — | 14 |
| P52 | — | 39 | 36 | — | 14 |
| P53 | — | 1 | 28 | — | 23 |
| P54 | — | 1 | 4 | — | 20 |
| P55 | 41 | 39 | 36 | — | 14 |
| P56 | — | 1 | 38 | — | 1 |
| P57 | — | 39 | 37 | — | 12 |

Particularly preferred polymers according to the invention contain:
- the particularly preferred structural units (I1a) to (I37a) of the formula (I);
- the particularly preferred structural units (II1a) to (II34a) of the formula (II);
- optionally the particularly preferred structural units (III1a) to (III17a) of the formula (III); and
- the particularly preferred crosslinkable structural units (Iv1a) to (Iv39a) of the formula (Iv).

A selection of particularly preferred polymers is shown in the following Table 17.

TABLE 17

| Polymer | (I) | (Iv) | (II) | (IIv) | (III) |
|---|---|---|---|---|---|
| P1a | 1a | 1a | 1a | — | 14a |
| P2a | — | 1a | 7a | — | 14a |
| P2b | — | 1a | 7b | — | 14a |
| P3a | — | 1a | 7a | — | 12a |
| P4a | 1a | 1a | 4a | — | — |
| P5a | 1a | 1a | 3a | — | — |
| P6a | — | 1a | 4a | — | 14a |
| P7a | — | 1a | 3a | — | 14a |
| P8a | — | 1a | 2a | — | 14a |
| P9a | — | 1a | 2a | — | 7a |
| P10a | — | 1a | 2a | — | 7a; 14a |
| P11a | 1a | 1a | 2a | — | — |
| P12a | — | 1a | 4a; 7a | — | — |
| P13a | 1a | 1a | 4a | — | 14a |
| P14a | — | 1a | 4a; 7a | — | 14a |
| P15a | 1a | 1a | 7a | — | 14a |
| P16a | — | 1a | 7a | — | 17a |
| P17a | — | 1a | 21a | — | 14a |
| P18a | 1a | 1a | 7a | — | 1a |
| P19a | 24c | 2a | 9a; 16a | — | — |
| P20a | 31a | 4a | 26a | — | — |
| P21a | 37a | 7a | 12a | — | 12a |
| P22a | 2a | 8a | 7b | — | — |
| P23a | 5a | 11a | 21b | — | 2b |
| P24a | 12a; 14a | — | 28b | — | 10a |
| P25a | 18a | 16a | 34a | — | 13a |
| P26a | 25a | 24a | 21a | — | — |
| P27a | 29a | 24b | 4b | — | 2c |
| P28a | 33a | 39a | 13a | — | — |
| P29a | 1a | — | 8a | 1b | — |
| P30a | 15a | — | 20a | 2a | 7a |
| P31a | 5a | — | 25a | 4b | — |
| P32a | 7a | — | 28a | 6a | 1b |
| P33a | 31a | — | 11a | 7b | 14a |
| P34a | 2b | — | 20a | 10a | — |
| P35a | 24d | — | — | 35a | — |
| P36a | — | 2b | 7a | — | 2a; 14a |
| P37a | — | 5a | 14a | — | 7a |
| P38a | 3a | — | — | 15a | 12a |
| P39a | 9a | — | — | 28b | 14a |
| P40a | 14a | 1a; 2a | 2a | — | — |
| P41a | — | 30a; | 22a | — | — |
| P42a | — | 1a | 15a | 13a | 10a |
| P43a | 18a | 25c | — | 21a | 2c; 12a |
| P44a | 1a | 1a | 35a | — | 14a |
| P45a | 1a | 1a | 35a | — | — |
| P46a | — | 39a | 35a | — | 14a |

TABLE 17-continued

| Polymer | (I) | (Iv) | (II) | (IIv) | (III) |
|---|---|---|---|---|---|
| P47a | 1a | 39a | 21a | — | 14a |
| P48a | — | 39a | 3a | — | 14a |
| P49a | — | 1a | 21a | — | — |
| P50a | — | 1a | 7a; 35a | — | 17a |
| P51a | — | 1a | 35b | — | 14a |
| P52a | — | 39a | 36a | — | 14a |
| P53a | — | 1a | 28b | — | 23a |
| P54a | — | 1a | 4a | — | 20a |
| P55a | 41a | 39a | 36a | — | 14a |
| P56a | — | 1a | 38a | — | 1b |
| P57a | — | 39a | 37b | — | 12a |

Very particularly preferred polymers according to the invention contain:
- the very particularly preferred structural units (I1b) to (I37b) of the formula (I);
- the very particularly preferred structural units (II1c) to (II34b) of the formula (II);
- optionally the very particularly preferred structural units (III1c) to (III14c) of the formula (III); and
- the very particularly preferred crosslinkable structural units (Iv1b) to (Iv39b) of the formula (Iv).

A selection of very particularly preferred polymers is shown in the following Table 18.

TABLE 18

| Polymer | (I) | (Iv) | (II) | (IIv) | (III) |
|---|---|---|---|---|---|
| P1b | 1b | 1b | 1c | — | 14b |
| P2c | — | 1b | 7c | — | 14b |
| P2d | — | 1b | 7c | — | 14c |
| P2e | — | 1d | 7c | — | 14b |
| P2f | — | 1b | 7c | — | 14b; 14c |
| P2g | — | 1b | 7d | — | 14b |
| P3b | — | 1b | 7c | — | 12b |
| P4b | 1b | 1b | 4c | — | — |
| P5b | 1b | 1b | 3b | — | — |
| P6b | — | 1b | 4c | — | 14b |
| P7b | — | 1b | 3b | — | 14b |
| P8b | — | 1b | 2b | — | 14c |
| P8c | — | 1b | 2b | — | 14b |
| P9b | — | 1b | 2b | — | 7b |
| P10b | — | 1b | 2b | — | 7b; 14b |
| P11b | 1b | 1b | 2b | — | — |
| P12b | — | 1b | 4c; 7c | — | — |
| P13b | 1b | 1b | 4c | — | 14b |
| P14b | — | 1b | 4c; 7c | — | 14b |
| P15b | 1b | 1b | 7c | — | 14b |
| P16b | — | 1b | 7c | — | 17b |
| P17b | — | 1b | 21c | — | 14b |
| P18b | 1c | 1c | 7c | — | 1c |
| P19b | 24f | 2c | 9b; 16b | — | — |
| P20b | 31b | 4b | 26b | — | — |
| P21b | 37b | 7c | 12b | — | 12b |
| P22b | 31b | 4b | 26b | — | — |
| P23b | 37b | 7c | 12b | — | 12b |
| P24b | 2c | 8b | 7d | — | — |
| P25b | 5b | 11b | 21d | — | 2e |
| P26b | 25d | 24e | 21c | — | — |
| P27b | 29b | 24h | 4d | — | 2f |
| P28b | 33b | 39b | 13b | — | — |
| P29b | 1b | — | 8b | 1d | — |
| P30b | 15d | — | 20b | 2b | 7b |
| P31b | 5c | — | 25b | 4d | — |
| P32b | 7c | — | 28c | 6b | 1d |
| P33b | 31b | — | 11b | 7d | 14b |
| P34b | 2d | — | — | 20b | 10d |
| P35b | 24g | — | — | 35b | — |
| P36b | — | 2d | 7c | — | 2d; 14c |
| P37b | — | 5b | 14b | — | 7b |
| P38b | 3b | — | — | 15b | 12b |
| P39b | 9b | — | — | 28d | 14b |
| P40b | 14c | 1c; 2c | 2b | — | — |

TABLE 18-continued

| Polymer | (I) | (Iv) | (II) | (IIv) | (III) |
|---|---|---|---|---|---|
| P41b | — | 30b; 31b | 22b | — | — |
| P42b | — | 1b | 15b | 13b | 10d |
| P43b | 18b | 25f | — | 21c | 2f; 12b |
| P44b | 1b | 1b | 35c | — | 14b |
| P45b | 1b | 1b | 35c | — | — |
| P46b | — | 39b | 35c | — | 14c |
| P47b | 1b | 39b | 21c | — | 14c |
| P48b | — | 39b | 3b | — | 14b |
| P49b | — | 1b | 21b | — | — |
| P50b | — | 1b | 7c; 35c | — | 17b |
| P51b | — | 1b | 35d | — | 14b |
| P52b | — | 39b | 36b | — | 14b |
| P53b | — | 1b | 28d | — | 23c |
| P54b | — | 1b | 4c | — | 20i |
| P55b | 41d | 39b | 36b | — | 14b |
| P56b | — | 1b | 38c | — | 1d |
| P57b | — | 39c | 37d | — | 12b |

The proportion of structural units of the formula (I) in the polymer is preferably in the range from 1 to 99 mol %, particularly preferably in the range from 3 to 97 mol %, and very particularly preferably in the range from 5 to 95 mol %, based on 100 mol % of all copolymerised monomers present as structural units in the polymer.

The proportion of structural units of the formula (II) in the polymer is preferably in the range from 1 to 99 mol %, particularly preferably in the range from 3 to 97 mol %, and very particularly preferably in the range from 5 to 95 mol %, based on 100 mol % of all copolymerised monomers present as structural units in the polymer.

The proportion of structural units of the formula (Iv) and/or (IIv), preferably of structural units of the formula (Iv), which contain a crosslinkable group Q in the polymer is preferably in the range from 0.1 to 50 mol %, particularly preferably in the range from 0.5 to 40 mol %, and very particularly preferably in the range from 1 to 30 mol %, based on 100 mol % of all copolymerised monomers present as structural units in the polymer.

In a first preferred embodiment, the proportion of structural units of the formulae (I) and (II) in the polymer is 100 mol %, i.e. the polymer consists exclusively of structural units of the formulae (I) and (II). The proportion of structural units of the formula (I) and/or (II), preferably of structural units of the formula (I), which contain a crosslinkable group Q is in the ranges indicated above.

In the first preferred embodiment, the proportion of structural units of the formula (I) is preferably in the range from 30 to 75 mol %, of which 1 to 30 mol % of the structural units of the formula (I) contain crosslinkable groups Q, and the proportion of structural units of the formula (II) is likewise preferably in the range from 25 to 70 mol %. In this embodiment, the proportion of structural units of the formula (I) which contain no crosslinkable group Q is consequently in the range from 0 to 74 mol %.

In a second preferred embodiment, the proportion of structural units of the formulae (I) and (II) in the polymer is in the range from 25 to 75 mol %, i.e. the polymer contains further structural units, either structural units of the formula (III) which are different from structural units (I) and (II) or structural units which are different from the structural units of the formulae (I), (II) and (III). The proportion of these further structural units, preferably of the formula (III), in the polymer is then in the range from 25 to 75 mol %, based on 100 mol % of all copolymerised monomers present as structural units in the polymer.

The polymers according to the invention which contain at least one structural unit of the formula (I), at least one structural unit of the formula (II) and optionally at least one structural unit of the formula (III), where at least one structural unit of the formula (I) and/or (II) contains at least one crosslinkable group Q, are generally prepared by polymerisation of a plurality of different monomers, at least one monomer of which results in structural units of the formula (I) in the polymer, at least one monomer of which results in structural units of the formula (II) in the polymer, and optionally at least one monomer of which results in structural units of the formula (III) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of the SUZUKI coupling, the YAMAMOTO coupling and the STILLE coupling. The C—N linking reaction is preferably a HARTWIG-BUCHWALD coupling.

The present invention thus preferably also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

Monomers which can be converted into the polymers according to the invention by polymerisation are monomers containing at least two groups, preferably two groups, which are preferably selected, independently of one another, from the group consisting of halogen, preferably Br and I, O-tosylate, O-triflate, O—$SO_2R^2$, $B(OR^2)_2$ and $Sn(R^2)_3$.

$R^2$ is preferably selected on each occurrence, independently of one another, from the group consisting of hydrogen, an aliphatic hydrocarbon radical having 1 to 20 C atoms and a mono- or polycyclic, aromatic ring system having 6 to ring atoms, where two or more radicals $R^2$ may form a ring system with one another. Aliphatic hydrocarbons having 1 to 20 carbon atoms here are linear, branched or cyclic alkyl groups, alkenyl groups, alkynyl groups, in which one or more carbon atoms may be replaced by O, N or S. In addition, one or more hydrogen atoms may be replaced by fluorine. Examples of aliphatic hydrocarbons having 1 to 20 carbon atoms include the following: methyl, ethyl, n-propyl, isopropyl, n-butyl, isobutyl, sec-butyl (1-methylpropyl), tert-butyl, isopentyl, n-pentyl, tert-pentyl (1,1-dimethylpropyl), 1,2-dimethyl propyl, 2,2-dimethylpropyl(neopentyl), 1-ethylpropyl, 2-methylbutyl, n-hexyl, isohexyl, 1,2-dimethylbutyl, 1-ethyl-1-methylpropyl, 1-ethyl-2-methylpropyl, 1,1,2-trimethylpropyl, 1,2,2-trimethylpropyl, 1-ethylbutyl, 1-methylbutyl, 1,1-dimethylbutyl, 2,2-dimethylbutyl, 1,3-dimethylbutyl, 2,3-dimethylbutyl, 3,3-dimethylbutyl, 2-ethylbutyl, 1-methylpentyl, 2-methylpentyl, 3-methylpentyl, cyclopentyl, cyclohexyl, cycloheptyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl and octynyl.

The term "mono- or polycyclic, aromatic ring system having 6 to 20 ring atoms" with respect to $R^2$ is intended to have the same meaning as defined above in relation to $Ar^1$ to $Ar^8$. Preferred aromatic ring systems are naphthyl and phenyl, where phenyl is particularly preferred.

In the case where two radicals $R^2$ form a ring system, these two linked radicals $R^2$ preferably represent a divalent aliphatic group having 2 to 8 carbon atoms. Examples thereof are compounds of the following formula —$CH_2$(CH$_2$)$_n$CH$_2$—, where n=0, 1, 2, 3, 4, 5 or 6, preferably 0, 1, 2 or 3.

In the case where more than two radicals $R^2$ form a ring system with one another, these radicals $R^2$ with one another represent a branched tri-, tetra-, penta- or polyvalent aliphatic group having 6 to 20 carbon atoms.

In a particularly preferred embodiment, the reactive groups of the monomers are selected, independently of one another, from Br, I and B(OR$^2$)$_2$.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters: new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

The crosslinkable polymers according to the invention which contain at least one structural unit of the formula (I), at least one structural unit of the formula (II) and optionally at least one structural unit of the formula (III), where at least one structural unit of the formulae (I) and/or (II) contains at least one crosslinkable group Q, can be used as the pure substance, but also as a mixture (blend) together with any desired further polymeric, oligomeric, dendritic or low-molecular-weight substances. Low-molecular-weight substance in the present application is taken to mean compounds having a molecular weight in the range from 100 to 3000 g/mol, preferably 200 to 2000 g/mol. These further substances may, for example, improve the electronic properties or themselves emit. Likewise, a styrene monomer may also be added as low-molecular-weight substance in order to achieve a higher degree of crosslinking. The term mixture above and below denotes a mixture comprising at least one polymeric component. In this way, one or more polymer layers consisting of a mixture (blend) of one or more crosslinkable polymers according to the invention which contain at least one structural unit of the formula (I), at least one structural unit of the formula (II) and optionally at least one structural unit of the formula (III), where at least one structural unit of the formulae (I) and/or (II) contains at least one crosslinkable group Q, and optionally one or more further polymers can be prepared using one or more low-molecular-weight substances.

The present invention thus furthermore relates to a polymer blend comprising one or more crosslinkable polymers according to the invention which contain at least one structural unit of the formula (I), at least one structural unit of the formula (II) and optionally at least one structural unit of the formula (III), where at least one structural unit of the formulae (I) and/or (II) contains at least one crosslinkable group Q, and one or more further polymeric, oligomeric, dendritic and/or low-molecular-weight substances.

The present invention furthermore relates to solutions and formulations comprising one or more crosslinkable polymers according to the invention or mixtures in one or more solvents. The way in which such solutions can be prepared is known to the person skilled in the art and is described, for example, in WO 02/072714 A1, WO 03/019694 A2 and the literature cited therein.

Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphtalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

These solutions can be used in order to produce thin polymer layers, for example by surface-coating methods (for example spin coating) or by printing processes (for example ink-jet printing).

The crosslinkable polymers according to the invention which contain at least one structural unit of the formula (I), at least one structural unit of the formula (II) and optionally at least one structural unit of the formula (III), where at least one structural unit of the formulae (I) and/or (II) contains at least one crosslinkable group Q, are particularly suitable for the production of films or coatings, in particular for the production of structured coatings, for example by thermal or light-induced in-situ polymerisation and in-situ crosslinking, such as, for example, in-situ UV photopolymerisation or photopatterning. It is both possible here to use corresponding polymers in pure substance, but also formulations or mixtures of these polymers as described above. These can be used with or without addition of solvents and/or binders. Suitable materials, processes and devices for the methods described above are described, for example, in WO 2005/083812 A2. Possible binders are, for example, polystyrene, polycarbonate, poly(meth)acrylates, polyacrylates, polyvinylbutyral and similar, optoelectronically neutral polymers.

The present invention furthermore relates to the use of a crosslinkable polymer according to the invention which contains at least one structural unit of the formula (I), at least one structural unit of the formula (II) and optionally at least one structural unit of the formula (III), where at least one structural unit of the formulae (I) and/or (II) contains at least one crosslinkable group Q, for the preparation of a crosslinked polymer.

If the crosslinkable group Q is, for example, a vinyl group or alkenyl group, the crosslinking can take place by free-radical or ionic polymerisation, which can be induced thermally or by radiation. Preference is given to free-radical polymerisation which is induced thermally, preferably at temperatures of less than 250° C., particularly preferably at temperatures of less than 200° C.

The present invention thus also relates to a process for the preparation of a crosslinked polymer which comprises the following steps:
(a) provision of the crosslinkable polymer according to the invention which contains at least one structural unit of the formula (I), at least one structural unit of the formula (II) and optionally at least one structural unit of the formula (III), where at least one structural unit of the formulae (I) and/or (II) contains at least one crosslinkable group Q; and
(b) free-radical or ionic crosslinking, preferably free-radical crosslinking, of the crosslinkable polymer, which can be induced both thermally and also by radiation, preferably thermally.

The crosslinked polymers prepared by the process according to the invention are insoluble in all common solvents. In this way, it is possible to produce defined layer thicknesses which cannot be dissolved or partially dissolved again, even by the application of subsequent layers.

The present invention thus also relates to a crosslinked polymer which is obtainable by the process mentioned above. The crosslinked polymer is, as described above, preferably produced in the form of a crosslinked polymer layer. Owing to the insolubility of the crosslinked polymer in all solvents, a further layer can be applied to the surface of a crosslinked polymer layer of this type.

The crosslinked polymer according to the invention can be used in electronic or opto-electronic devices or for the production thereof.

The present invention thus furthermore relates to the use of the crosslinked polymer according to the invention in electronic or opto-electronic devices, preferably in organic electroluminescent devices (OLED), organic light-emitting electrochemical cells (OLEC), organic field-effect transistors (OFET), organic integrated circuits (O-IC), organic thin-film transistors (TFT), organic solar cells (O-SC), organic laser diodes (O-lasers), organic photovoltaic (OPV) elements or devices or organic photoreceptors (OPC), particularly preferably in organic electroluminescent devices (OLED).

The way in which OLEDs can be produced is known to the person skilled in the art and is described in detail, for example, as a general process in WO 2004/070772 A2, which should be adapted correspondingly for the individual case.

The term OLED here also encompasses a so-called hybrid device, in which one or more polymer layers and one or more layers comprising low-molecular-weight substances may occur. The low-molecular-weight substances here can be processed either by vapour deposition in a high vacuum or from solution.

As described above, the crosslinked polymers according to the invention are very particularly suitable as active materials in OLEDs or displays produced in this way.

Active materials in the sense of the present application are materials which can be used as active layer or in an active layer. Active layer means that the layer is capable of emitting light on application of an electric field (light-emitting layer) and/or that it improves the injection and/or transport of positive and/or negative charges (charge-injection or charge-transport layer) and/or that it blocks the injection and/or transport of positive and/or negative charges (charge-blocking layer).

The present invention therefore preferably also relates to the use of the crosslinked polymer according to the invention in an OLED, as charge-injection or charge-transport material, particularly preferably as hole-injection or hole-transport material.

The present invention furthermore relates to electronic or opto-electronic components, preferably organic electroluminescent devices (OLEDs), organic light-emitting electrochemical cells (OLECs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices and organic photoreceptors (OPCs), particularly preferably organic electroluminescent devices, having one or more active layers, where at least one of these active layers comprises one or more crosslinked polymers according to the invention. The active layer can be, for example, a light-emitting layer, a charge-transport layer and/or a charge-injection layer, or a charge-blocking layer.

The present application text and also the examples below are principally directed to the use of the crosslinked polymers according to the invention in relation to OLEDs and corresponding displays. In spite of this restriction of the description, it is possible for the person skilled in the art, without further inventive step, also to use the crosslinked polymers according to the invention as semiconductors for the further uses described above in other electronic devices.

The following examples are intended to explain the invention in greater detail without restricting it. In particular, the features, properties and advantages described therein of the defined compounds on which the relevant example is based can also be applied to other compounds which are not described in detail, but fall within the scope of protection of the claims, unless stated otherwise elsewhere.

WORKING EXAMPLES

Part A: Synthesis of the Monomers

Biphenyl-2-ylphenylamine can be synthesised in accordance with Organic Letters 2006, 8, 1133. All further starting materials used are commercially available or are prepared in accordance with the literature indicated in Table 19.

Example 1

Preparation of Monomer Mo6

1st Step:

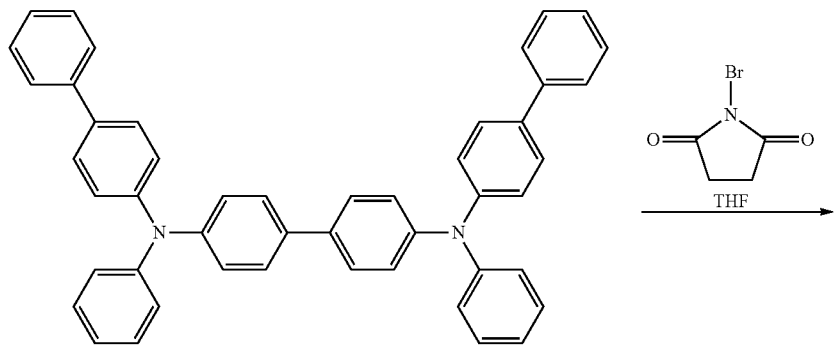

71.5 g of N4,N4'-bisbiphenyl-4-yl-N4,N4'-diphenylbiphenyl-4,4'-diamine (112 mmol) (CAS: 134008-76-7) are dissolved in 1.5 l of dried tetrahydrofuran (THF) and cooled to 0° C. 40 g of N-bromosuccinimide (224 mmol) are added in portions as a solid, and the solution is stirred at 20° C. for 14 hours.

The solid is filtered and washed with THF. The filtrates are evaporated together, stirred with water, filtered off with suction and dried in a vacuum drying cabinet. The residue is recrystallised twice from dimethylformamide (DMF) (700 ml and 500 ml). The solid is then stirred three times with 700 ml of ethanol and subsequently dried in a drying cabinet, giving 72.7 g (82% of theory) as a pale-coloured solid.

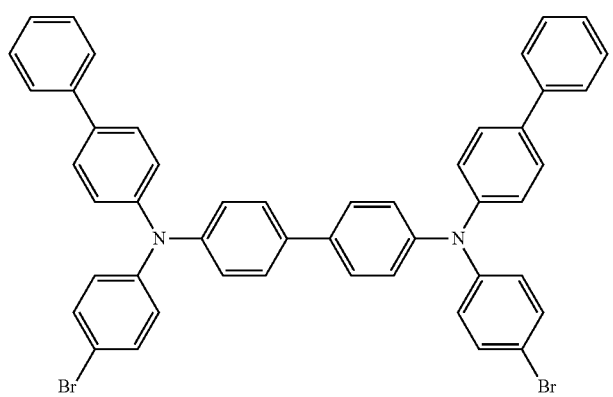

2nd Step:

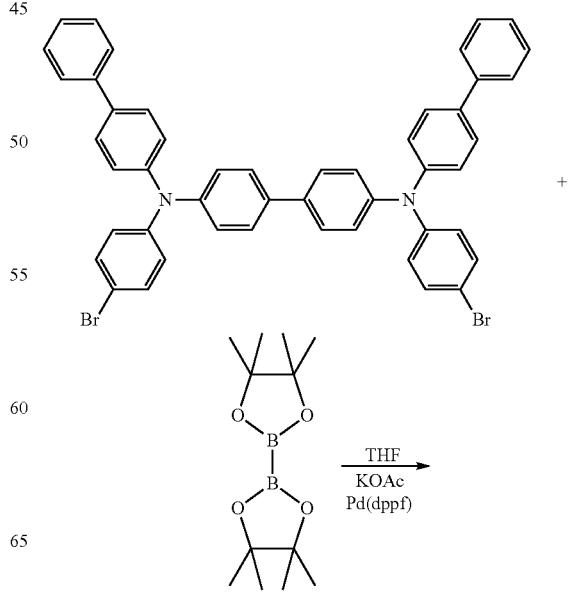

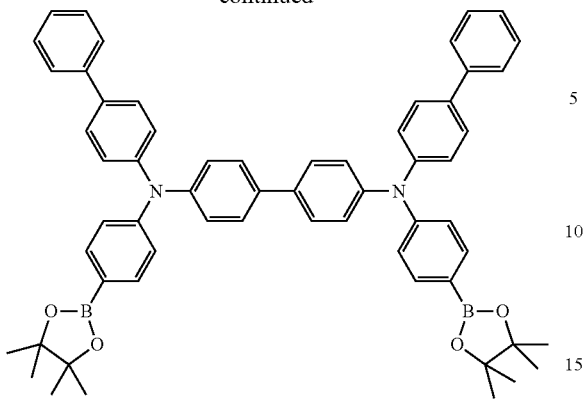

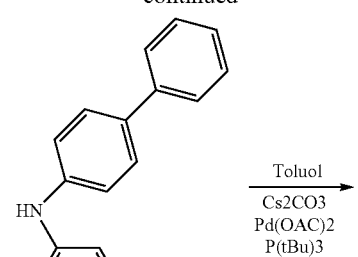

58.3 g of N4,N4'-bisbiphenyl-4-yl-N4,N4'-bis-(4-bromophenyl)biphenyl-4,4'-diamine (73 mmol) are dissolved in 1.5 l of dried THF, 44.5 g of bis(pinacolato)diboron (175.2 mmol) and 43 g of potassium acetate (438 mmol) are added successively as solids, and the solution is saturated with argon. 1.2 g of 1,1-bis(diphenylphosphino)ferrocene-Pd(II) dichloride complex is added, and the reaction mixture is stirred under reflux for 22 hours.

The solid is filtered through silica gel and Celite, and the solution is evaporated. 800 ml of dichloromethane are added to the residue. The phases are separated. The organic phase is washed three times with 300 ml of water and dried over $Na_2SO_4$, then filtered and evaporated in a rotary evaporator. The product is filtered through silica gel (toluene as eluent). The clean fractions (about 35 g) are recrystallised from a mixture of 50 ml of heptane and 170 ml of toluene. The solid is filtered, washed with heptane and dried, giving 33.5 g (52% of theory) of the product as a colourless powder having a purity of 99.1% according to HPLC.

Examples 2 to 5

Preparation of Monomers Mo16, Mo21, Mo22 and Mo23

1st Step:

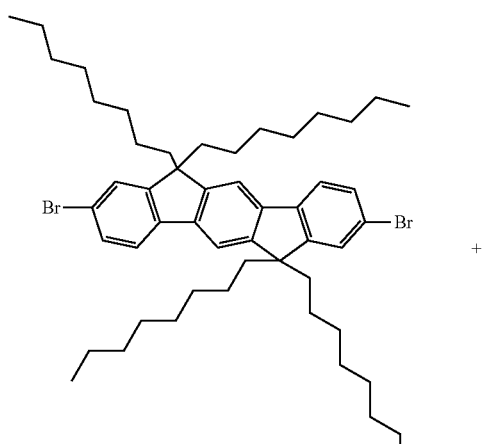

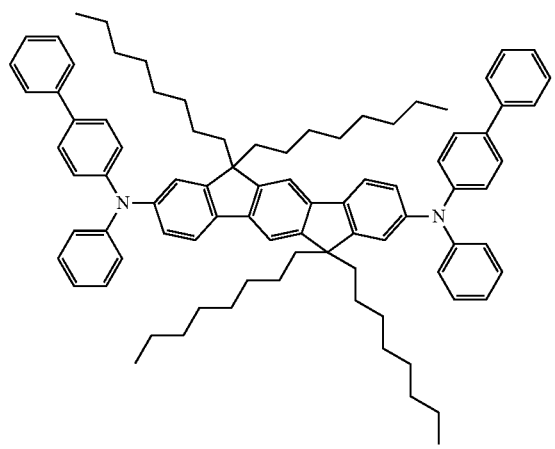

21.7 g of 2,8-dibromo-6,6,12,12-tetraoctyl-6,12-dihydroindeno[1,2-b]fluorene (25 mmol) are dissolved in 0.2 l of dried toluene, 13.0 g of biphenyl-4-ylphenylamine (52 mmol), 26.3 g of caesium carbonate (80 mmol) and 0.23 g of palladium acetate (1 mmol) are added successively as solids, and the solution is saturated with nitrogen. 2.0 ml of 1 M tri-tert-butylphosphine solution (2 mmol) are added, and the reaction mixture is stirred under reflux for 24 hours.

The solid is filtered off and washed with toluene. The filtrates are evaporated together, stirred with hot ethanol, filtered off with suction and dried in a vacuum drying cabinet, giving 26.8 g (90% of theory) as a yellow solid.

The following intermediates are synthesised analogously:
| Intermediates | Dibrominated starting material | Amine |
|---|---|---|
| Mo16-a | 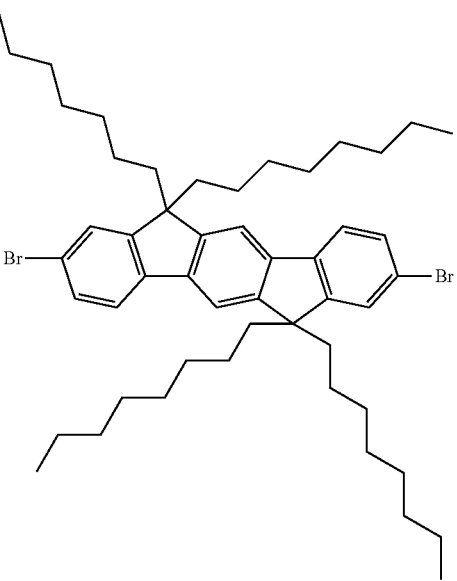 | 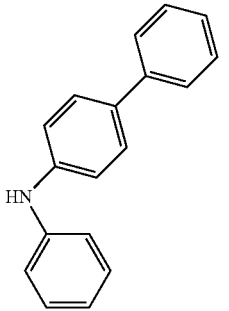 [SMILES: c1ccc(Nc2ccc(-c3ccccc3)cc2)cc1] |
| Mo21-a | 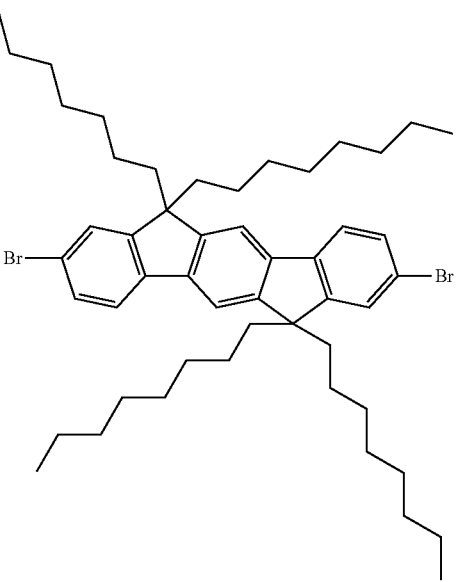 | 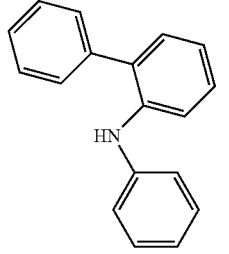 [SMILES: c1ccc(Nc2ccccc2-c2ccccc2)cc1] |
| Mo22-a | 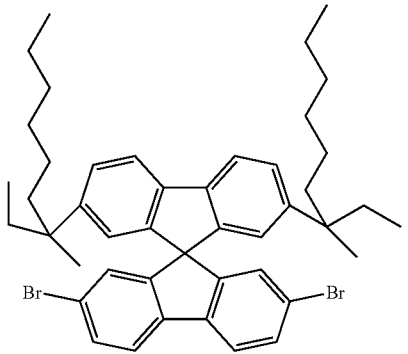 [SMILES: CCCCCCC(C)(CC)c1ccc2c(c1)C1(c3cc(Br)ccc3-c3ccc(Br)cc31)c1cc(C(C)(CC)CCCCCC)ccc1-2] | 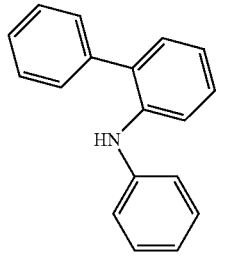 [SMILES: c1ccc(Nc2ccccc2-c2ccccc2)cc1] |

| | | -continued | |
|---|---|---|---|
| Mo23-a | 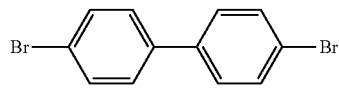 [SMILES: Brc1ccc(-c2ccc(Br)cc2)cc1] | | 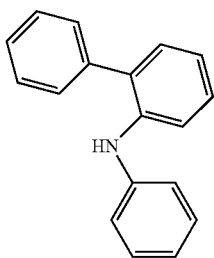 [SMILES: c1ccc(Nc2ccccc2-c2ccccc2)cc1] |
| Intermediates | Product | Yield |
|---|---|---|
| Mo16-a | 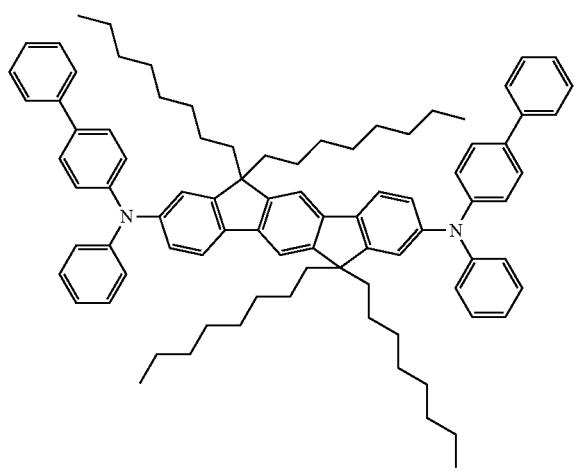 [SMILES: CCCCCCCCC1(CCCCCCCC)c2cc(N(c3ccccc3)c3ccc(-c4ccccc4)cc3)ccc2-c2cc3c(cc21)-c1ccc(N(c2ccccc2)c2ccc(-c4ccccc4)cc2)cc1C3(CCCCCCCC)CCCCCCCC] | 90% |
| Mo21-a | 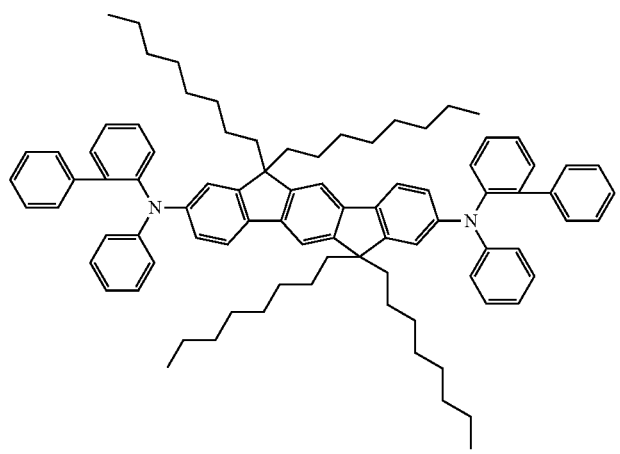 [SMILES: CCCCCCCCC1(CCCCCCCC)c2cc(N(c3ccccc3)c3ccccc3-c3ccccc3)ccc2-c2cc3c(cc21)-c1ccc(N(c2ccccc2)c2ccccc2-c2ccccc2)cc1C3(CCCCCCCC)CCCCCCCC] | 68% |

| | -continued | |
|---|---|---|
| Mo22-a | 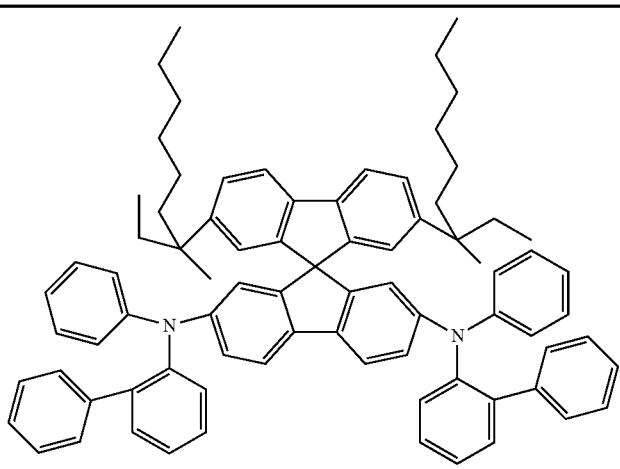 | 74% |
| Mo23-a | 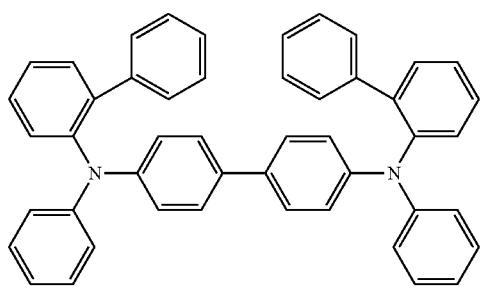 [SMILES: c1ccc(-c2ccccc2N(c2ccccc2)c2ccc(-c3ccc(N(c4ccccc4)c4ccccc4-c4ccccc4)cc3)cc2)cc1] | 81% |
2nd Step:
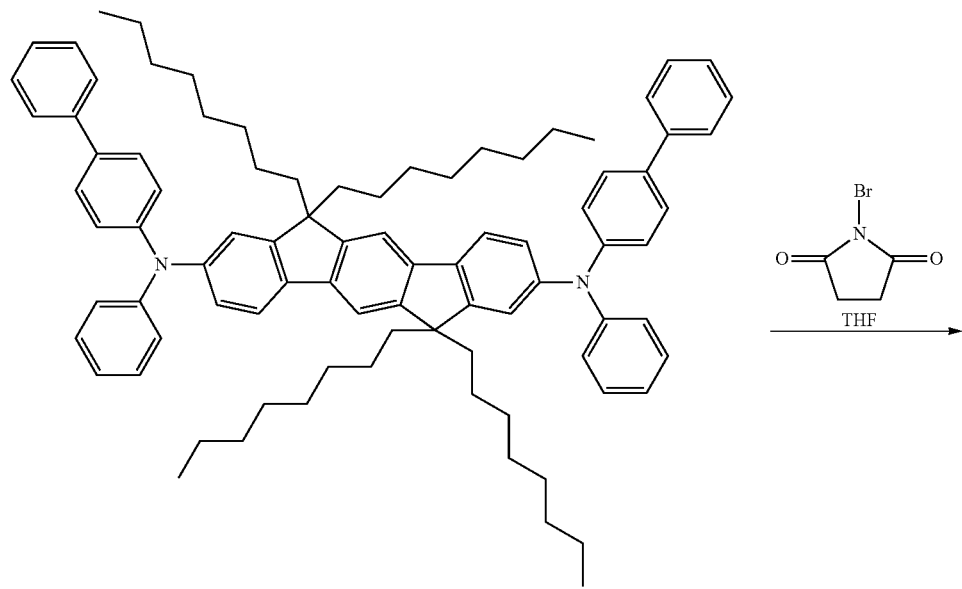

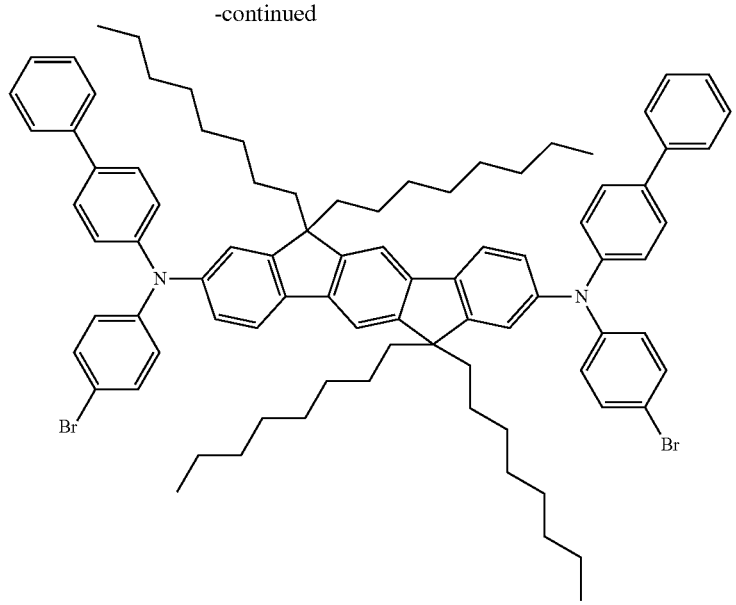

26.0 g of N,N'-bisbiphenyl-4-yl-6,6,12,12-tetraoctyl-N,N'-diphenyl-6H,12H-indeno[1,2-b]fluorene-2,8-diamine (21 mmol) are dissolved in 0.6 l of dried tetrahydrofuran (THF) and cooled to 0° C. 7.8 g of N-bromosuccinimide (43 mmol) are added in portions as a solid, and the solution is stirred at 20° C. for 14 hours.

The reaction mixture is evaporated. The residue is stirred in hot ethanol. The solid is filtered and recrystallised three times from ethyl acetate (in each case 1 l) and subsequently dried in a drying cabinet, giving 23.0 g (78% of theory) of the product as a yellow powder having a purity of 97.7% according to HPLC.

The following monomers are synthesised analogously:

| Monomer | Starting material |
|---|---|
| Mo16 | 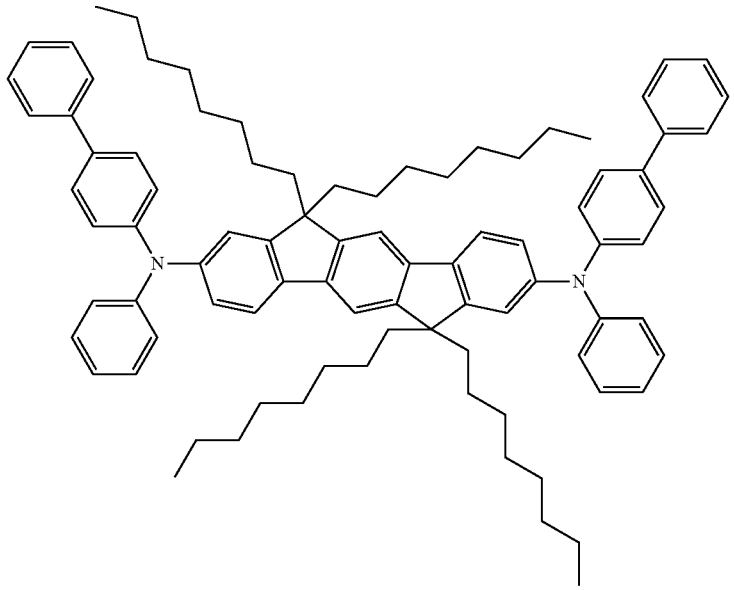 [SMILES: CCCCCCCCC1(CCCCCCCC)c2cc(N(c3ccccc3)c3ccc(-c4ccccc4)cc3)ccc2-c2cc3c(cc21)-c1ccc(N(c2ccccc2)c2ccc(-c4ccccc4)cc2)cc1C3(CCCCCCCC)CCCCCCCC] |

-continued
Mo21
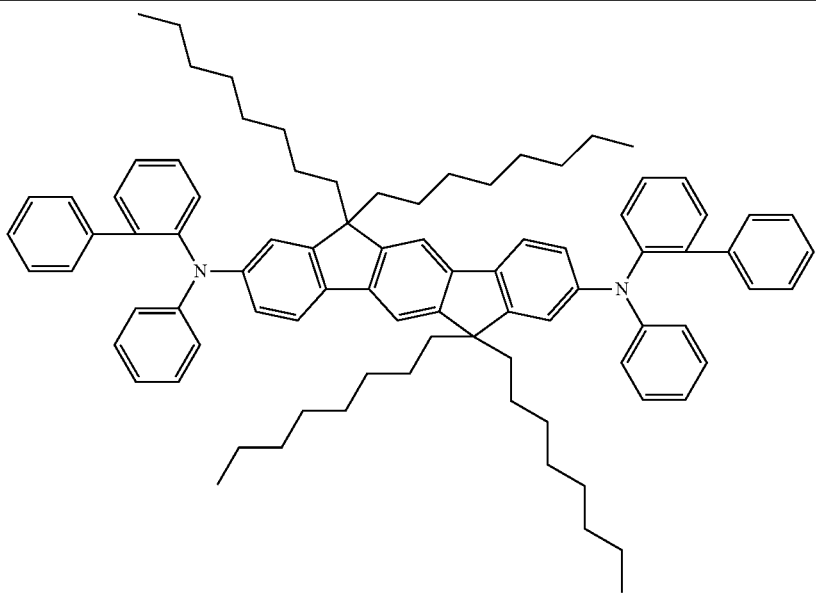
Mo22
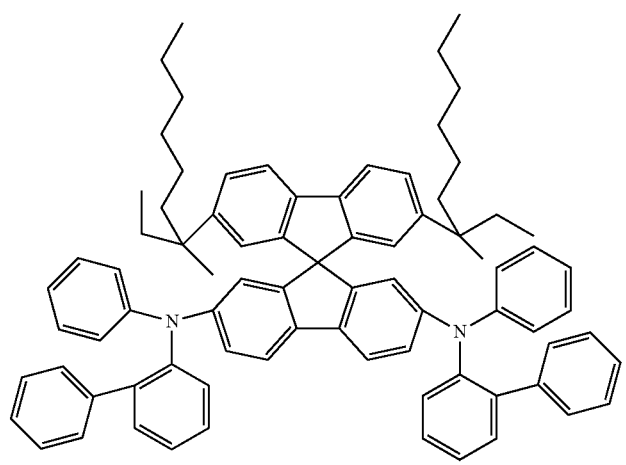 [SMILES: CCCCCCC(C)(CC)c1ccc2c(c1)C1(c3cc(N(c4ccccc4)c4ccccc4-c4ccccc4)ccc3-c3ccc(N(c4ccccc4)c4ccccc4-c4ccccc4)cc31)c1cc(C(C)(CC)CCCCCC)ccc1-2]
Mo23
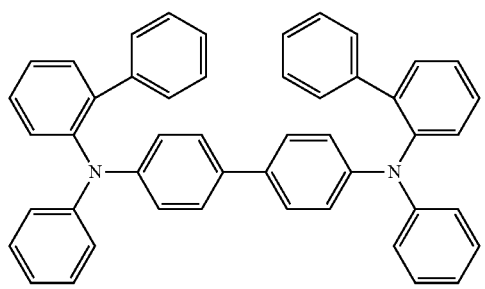 [SMILES: c1ccc(-c2ccccc2N(c2ccccc2)c2ccc(-c3ccc(N(c4ccccc4)c4ccccc4-c4ccccc4)cc3)cc2)cc1]

-continued

| Monomer | Product | Yield (HPLC purity) |
|---|---|---|
| Mo16 | (structure) | 78% (97.7%) |
| Mo21 | (structure) | 75% (99.3%) |

Mo22 82% (98.7%)

Mo23 71% (99.8%)

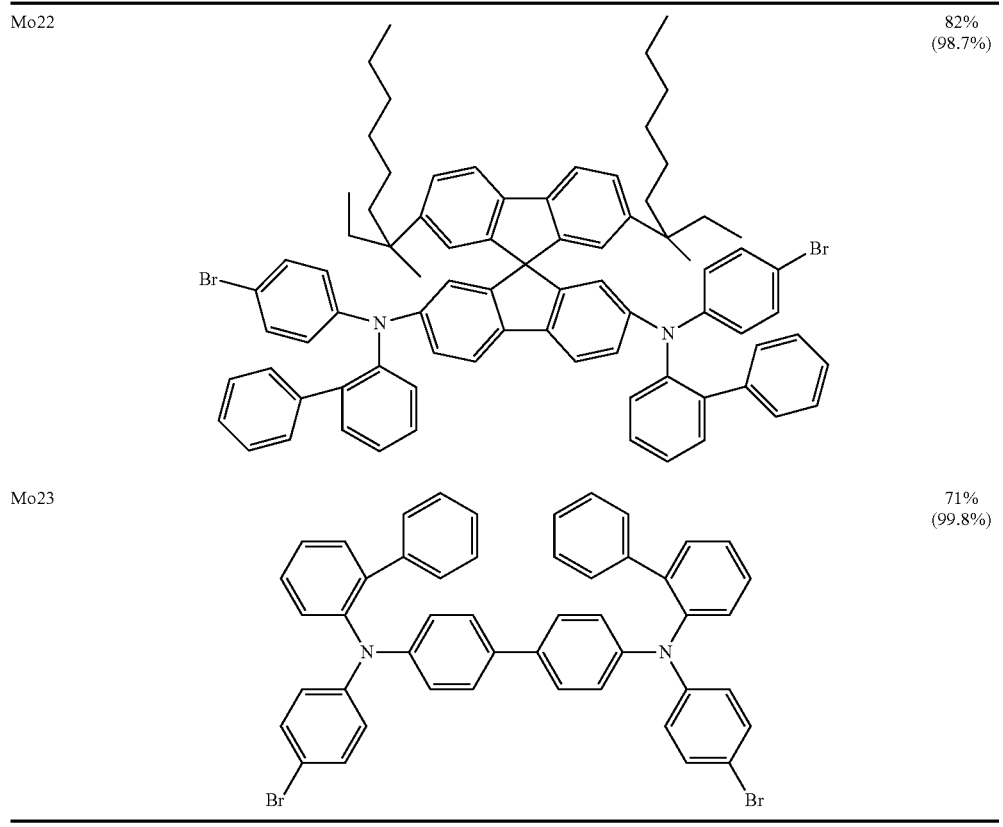

Example 6

Preparation of Monomer Mo17

1st Step:

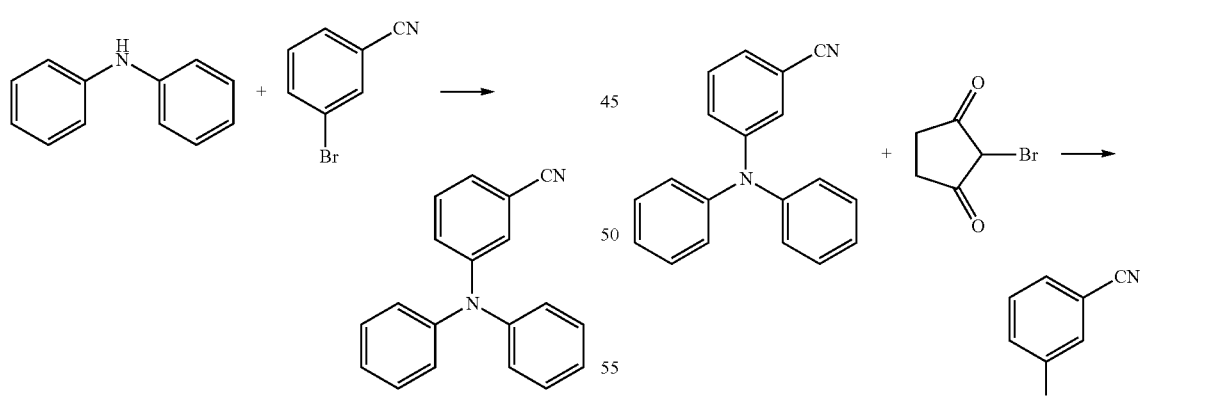

50.0 g of diphenylamine (295 mmol) are initially introduced in 1000 ml of toluene with 64.5 g of 3-bromobenzonitrile (355 mmol), 20 ml of tri-tert-butylphosphine (1M solution in toluene, 20 mmol), 2.65 g of palladium acetate (11 mmol) and 85.2 g of sodium tert-butoxide (886 mmol) and heated under reflux with stirring for 15 hours. After cooling, the organic phase is washed three times with 1 l of water each time, dried over sodium sulfate and subsequently evaporated to dryness in vacuo. The solid remaining is extracted with about 400 ml of heptane in a continuous hot extractor through a bed of aluminium oxide (basic, activity grade 1). After cooling, the precipitated solid is filtered off, washed twice with about 200 ml of heptane and dried in vacuo, giving 53.0 g (66% of theory) as a pale-coloured solid.

2nd Step;

53.0 g of 3-diphenylaminobenzonitrile (196 mmol) are dissolved in 500 ml of dry tetrahydrofuran and cooled to 0° C. 69.8 g (392 mmol) of N-bromosuccinimide are added in portions as a solid with ice-cooling and vigorous stirring that the temperature does not exceed 5° C. The cooling is removed, and the mixture is stirred for 12 hours. The solvent is removed in vacuo, and the solid remaining is dissolved in as little ethyl acetate as possible. The solution is washed three times with about 500 ml of aqueous sodium hydroxide solution (5%) and twice with water. The organic phase is evaporated to dryness, giving 70.8 g (84% of theory) as a colourless solid.

3rd Step:

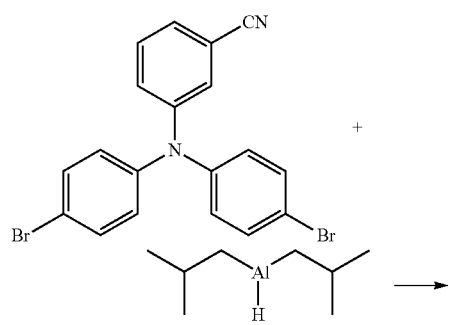

4th Step:

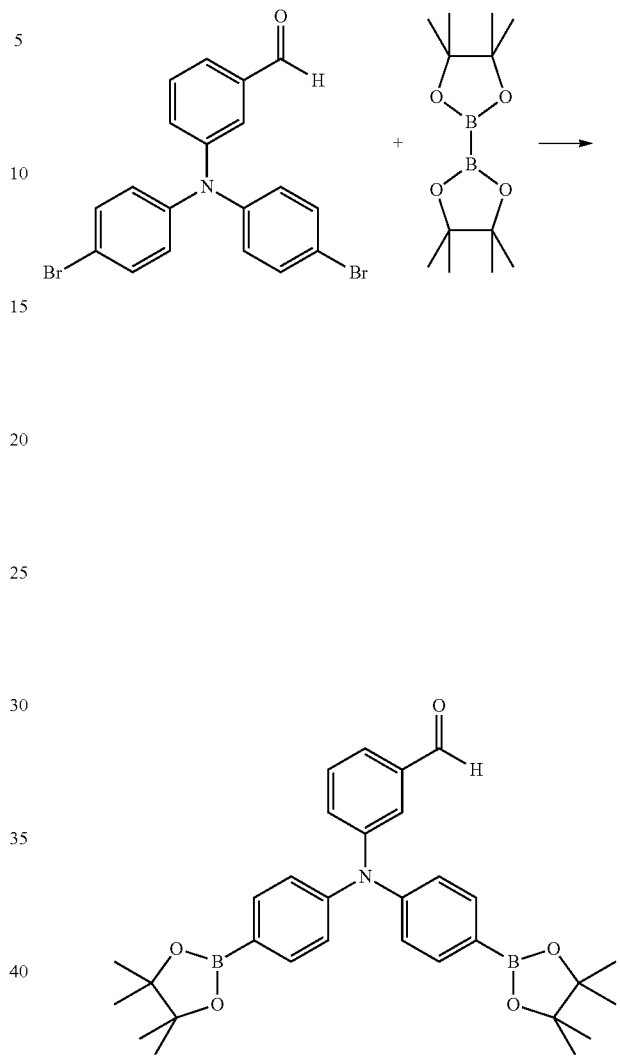

70.8 g (165 mmol) of 3-[bis-(4-bromophenyl)]benzonitrile are dissolved in 700 ml of dry dichloromethane and cooled to −78° C. 174 ml (174 mmol) of a 1M solution of diisobutylaluminium hydride in toluene are added dropwise at such a rate that the temperature does not exceed −50° C. The cooling is removed, the mixture is allowed to warm to 10° C. and re-cooled to −10° C. After addition of 175 ml of tetrahydrofuran, a mixture of 43 g of concentrated sulfuric acid and 175 ml of water is rapidly added, and the mixture is stirred without further cooling for 12 hours. The mixture is rendered neutral using aqueous sodium hydroxide solution. The organic phase is separated off, washed twice with about 350 ml of water and once with 350 ml of saturated sodium chloride solution and dried over magnesium sulfate. The solvent is removed in a rotary evaporator, leaving a yellow oil, which crystallises over the course of 24 hours. The solid is extracted with about 300 ml of heptane in a continuous hot extractor through a bed of aluminium oxide (basic, activity grade 1) and filtered off after cooling. It is recrystallised three times from isopropanol. Drying in vacuo gives 13.0 g (18% of theory) as a yellow solid.

13.0 g (30 mmol) of 3-[bis-(4-bromophenyl)amino]benzaldehyde, 33.7 g (137 mmol) of bis(pinacolato)diborane, 14.8 g (151 mmol) of potassium acetate, 0.27 g (1.2 mmol) of palladium acetate and 0.69 g (1.2 mmol) of bis(diphenylphosphino)ferrocene are heated under reflux in 500 ml of dioxane with vigorous stirring for 14 hours. The solvent is removed in vacuo, the solid remaining is taken up in as little ethyl acetate as possible and filtered through silica gel with a mixture of ethyl acetate and heptane (1:1). The solvent is removed in vacuo, and the oil remaining is stirred with about 100 ml for 2 hours. The resultant solid is filtered off, dried in vacuo and subsequently subjected to fractional sublimation at 200° C. and a pressure of $10^{-5}$ mbar, giving 3.5 g (22% of theory) of the product as a colourless powder having a purity of 99.8% according to HPLC.

Table 19 below shows the other monomers which are used for the preparation of the polymers according to the invention and whose preparation has already been described in the prior art.

TABLE 19

| Monomer | Structure | Synthesis in accordance with |
|---------|-----------|------------------------------|
| Mo1 | | WO 2010/097155 A1 |
| Mo2 | | WO 99/048160 A1 |
| Mo3 | | WO 2010/097155 A1 |
| Mo4 | | WO 2005/104263 A1 |

TABLE 19-continued

| Monomer | Structure | Synthesis in accordance with |
|---|---|---|
| Mo5 | | WO 02/077060 A1 |
| Mo7 | | WO 03/000773 A1 |
| Mo8 | | WO 2005/104263 A1 |
| Mo9 | | Macromolecules, 2000, 33, 2016 |

TABLE 19-continued

| Monomer | Structure | Synthesis in accordance with |
|---|---|---|
| Mo10 | | Macromolecules, 2000, 33, 2016 |
| Mo11 | | WO 02/077060 A1 |
| Mo12 | | WO 2004/041901 A1 |
| Mo13 | | WO 2004/041901 A1 |

TABLE 19-continued

| Monomer | Structure | Synthesis in accordance with |
|---|---|---|
| Mo14 | | WO 2005/104264 A1 |
| Mo15 | | WO 02/077060 A1 |
| Mo18 | | Tetrahedron, 2009, 50, 182 |
| Mo19 | | EP 1 491 568 A1 |

TABLE 19-continued

| Monomer | Structure | Synthesis in accordance with |
|---|---|---|
| Mo20 | [structure: 4-aminobenzocyclobutene linked via N to two 4-bromophenyl groups] | WO 2009/102027 |

Part B: Synthesis of the Polymers

Examples 7 to 47

Preparation of comparative polymers V1 and V2 and polymers according to the invention Po1 to Po39.

Comparative polymers V1 and V2 and polymers according to the invention Po1 to Po39 are prepared by SUZUKI coupling by the process described in WO 2010/097155 from the monomers in Examples 1 to 6 and the monomers depicted in Table 19.

Polymers V1 and V2 as well as Po1 to Po39 prepared in this way contain the structural units in the percentage proportions (percent data=mol %) indicated in Table 20 after removal of the leaving groups. In the case of the polymers which contain a crosslinkable vinyl group, this is obtained from the aldehyde group by WITTIG reaction by the process described in WO 2010/097155.

The palladium and bromine contents of the polymers are determined by ICP-MS. The values determined are below 10 ppm.

The molecular weights $M_w$ and the polydispersities D are determined by means of gel permeation chromatography (GPC) (model: Agilent HPLC system series 1100) (column: PL-RapidH from Polymer Laboratories; solvent; THF comprising 0.12% by vol. of o-dichlorobenzene; detection: UV and refractive index; temperature: 40° C.). The calibration is carried out using polystyrene standards.

The results are summarised in Table 20

TABLE 20

| Example | Polymer | Structural unit of the formula (I) | | | | Structural unit of the formula (II) | | | | Structural unit of the formula (III) | | | | Molecular wt. $M_w$ (g/mol) | Polydisp. D |
|---|---|---|---|---|---|---|---|---|---|---|---|---|---|---|---|
| 7 | V1 | Mo2 | 50% | | | | | | | Mo9 | 50% | | | 438 000 | 3.3 |
| 8 | V2 | Mo1 | 10% | Mo2 | 40% | | | | | Mo9 | 50% | | | 417 000 | 3.1 |
| 9 | Po1 | Mo1 | 10% | Mo2 | 40% | Mo4 | 50% | | | | | | | 240 000 | 1.9 |
| 10 | Po2 | Mo1 | 10% | | | Mo5 | 50% | | | Mo10 | 40% | | | 174 000 | 1.9 |
| 11 | Po3 | Mo1 | 20% | | | Mo6 | 30% | | | Mo9 | 50% | | | 196 000 | 2.7 |
| 12 | Po4 | Mo1 | 10% | Mo2 | 40% | Mo7 | 10% | | | Mo9 | 40% | | | 375 000 | 3.1 |
| 13 | Po5 | Mo1 | 10% | | | Mo6 | 40% | | | Mo9 | 50% | | | 126 000 | 2.3 |
| 14 | Po6 | Mo1 | 10% | | | Mo6 | 40% | | | Mo11 | 50% | | | 97 000 | 2.8 |
| 15 | Po7 | Mo1 | 10% | Mo2 | 40% | Mo8 | 50% | | | | | | | 193 000 | 1.7 |
| 16 | Po8 | Mo1 | 10% | | | Mo4 | 40% | | | Mo9 | 50% | | | 196 000 | 2.6 |
| 17 | Po9 | Mo1 | 10% | | | Mo8 | 40% | | | Mo9 | 50% | | | 190 000 | 2.5 |
| 18 | Po10 | Mo1 | 10% | | | Mo6 | 40% | | | Mo12 | 50% | | | 112 000 | 1.9 |
| 19 | Po11 | Mo3 | 10% | | | Mo5 | 40% | | | Mo13 | 50% | | | 126 000 | 2.1 |
| 20 | Po12 | Mo3 | 10% | | | Mo5 | 40% | | | Mo14 | 30% | Mo9 | 20% | 195 000 | 1.9 |
| 21 | Po13 | Mo1 | 10% | | | Mo4 | 50% | Mo6 | 40% | | | | | 74 000 | 1.5 |
| 22 | Po14 | Mo1 | 10% | Mo2 | 40% | Mo4 | 30% | | | Mo9 | 20% | | | 243 000 | 2.9 |
| 23 | Po15 | Mo1 | 10% | Mo2 | 10% | Mo6 | 30% | | | Mo9 | 50% | | | 161 000 | 2.5 |
| 24 | Po16 | Mo1 | 10% | Mo2 | 20% | Mo4 | 50% | | | Mo10 | 20% | | | 67 000 | 2.3 |
| 25 | Po17 | Mo3 | 10% | | | Mo15 | 40% | | | Mo10 | 50% | | | 189 000 | 2.5 |
| 26 | Po18 | Mo1 | 10% | | | Mo6 | 30% | | | Mo9 | 50% | M10 | 10% | 125 000 | 2.1 |
| 27 | Po19 | Mo1 | 20% | Mo2 | 30% | Mo4 | 50% | | | | | | | 89 000 | 1.6 |
| 28 | Po20 | Mo3 | 20% | | | Mo16 | 30% | | | Mo10 | 50% | | | 156 000 | 2.0 |
| 29 | Po21 | Mo1 | 20% | Mo2 | 30% | Mo16 | 50% | | | | | | | 101 000 | 3.1 |
| 30 | Po22 | Mo1 | 20% | | | Mo6 | 30% | Mo4 | 20% | Mo9 | 30% | | | 357 000 | 4.8 |
| 31 | Po23 | Mo3 | 20% | | | Mo4 | 30% | | | Mo10 | 50% | | | 169 000 | 3.7 |
| 32 | Po24 | Mo1 | 15% | | | Mo6 | 35% | | | Mo9 | 50% | | | 190 000 | 2.6 |
| 33 | Po25 | Mo17 | 20% | | | Mo6 | 30% | | | Mo9 | 50% | | | 358 000 | 3.8 |
| 34 | Po26 | Mo1 | 20% | | | Mo6 | 30% | | | Mo9 | 25% | Mo18 | 25% | 220 000 | 3.1 |
| 35 | Po27 | Mo1 | 20% | | | Mo6 | 30% | | | Mo19 | 50% | | | 390 000 | 5.9 |
| 36 | Po28 | Mo1 | 14% | Mo3 | 6% | Mo6 | 36% | | | Mo9 | 44% | Mo12 | 10% | 156 000 | 3.1 |
| 37 | Po29 | Mo1 | 20% | | | Mo6 | 36% | | | Mo9 | 40% | Mo12 | 20% | 150 000 | 3.8 |
| 38 | Po30 | Mo1 | 20% | | | Mo6 | 36% | | | Mo9 | 30% | | | 130 000 | 4.7 |
| 39 | Po31 | Mo20 | 10 | | | Mo16 | 40% | | | Mo13 | 50% | | | 210 000 | 2.9 |
| 40 | Po32 | Mo20 | 5% | Mo3 | 5% | Mo15 | 40% | | | Mo10 | 50% | | | 186 000 | 2.1 |
| 41 | Po33 | Mo20 | 8% | | | Mo8 | 42% | | | Mo10 | 50% | | | 175 000 | 3.2 |

TABLE 20-continued

| Example | Polymer | Structural unit of the formula (I) | | Structural unit of the formula (II) | | | | Structural unit of the formula (III) | | Molecular wt. M$_w$ (g/mol) | Polydisp. D |
|---|---|---|---|---|---|---|---|---|---|---|---|
| 42 | Po34 | Mo3 | 30% | Mo5 | 20% | | | Mo13 | 50% | 58 000 | 5.8 |
| 43 | Po35 | Mo1 | 50% | Mo15 | 50% | | | | | 74 000 | 3.6 |
| 44 | Po36 | Mo1 | 25% | Mo16 | 15% | Mo6 | 25% | Mo19 | 35% | 123 000 | 2.4 |
| 45 | Po37 | Mo1 | 10% | Mo21 | 40% | | | Mo9 | 50% | 190 000 | 1.9 |
| 46 | Po38 | Mo20 | 13% | Mo22 | 50% | | | Mo10 | 37% | 133 000 | 2.7 |
| 47 | Po39 | Mo1 | 17% | Mo23 | 33% | | | Mo9 | 50% | 194 000 | 2.5 |

Part C: Checking of the Layer Thicknesses

In the following experiments, it is checked whether the polymers according to the invention produce a completely insoluble layer after crosslinking. Similar experiments are also described in WO 2010/097155.

To this end, the polymers according to the invention are applied to glass supports in a layer thickness of 20 nm by spin coating. For the spin coating, the polymers are dissolved in toluene (concentration: 5 g/l). The layer thickness is measured and checked by scratching the polymer layer with a needle, with the scratch extending as far as the glass substrate. The depth of the scratch and thus the thickness of the polymer layer is subsequently measured twice at each of at least two points with the aid of a profilometer needle (Dektak, Bruker), and the average is formed. If the desired layer thickness has not been reached, the rotational speed of the spin coater is adapted.

For the layer thickness checking experiment, the polymers according to the invention are applied to glass supports which have been coated with 80 nm of PEDOT:PSS (poly (3,4-ethylenedioxy-2,5-thiophene): polystyrene sulfonate), with a layer thickness of 20 nm by spin coating. The PEDOT: PSS, purchased from Heraeus Precious Metals GmbH & Co. KG, Germany, is applied by spin coating from water and dried by heating at 180° C. for 10 minutes.

The polymer film is then crosslinked by heating at 180° C. or at 220° C. for one hour. The glass supports with the crosslinked polymer films are subsequently washed with toluene on the spin coater (rotational speed: 1000 rpm) for one minute. The film is then again dried by heating at 180° C. for 10 minutes in order to remove the solvent. The layer thickness is subsequently measured again as described above in order to check whether the layer thickness has changed.

Table 21 shows the remaining layer thickness of the original 20 nm after the washing process. If the layer thickness has not reduced, the polymer is insoluble and the crosslinking is thus adequate.

TABLE 21

Check of the residual layer thickness from originally 20 nm after washing test

| Polymer | Residual layer thickness after washing test [in nm] Crosslinking at 220° C. |
|---|---|
| V1 | 3.5 |
| V2 | 20 |
| Po3 | 20 |
| Po5 | 20 |
| Po7 | 20 |

As revealed by Table 21, comparative polymer V1, which carries no crosslinking group, undergoes virtually no crosslinking at all at 220° C. Comparative polymer V2 and polymers according to the invention P3, P5 and P7 crosslink completely at 220° C.

Part D: Production of the OLEDs

The polymers according to the invention can be processed from solution and result in OLEDs which can be produced significantly more simply compared with vacuum-processed OLEDs, with nevertheless good properties.

The production of solution-based OLEDs of this type has already been described many times in the literature, for example in WO 2004/037887 and WO 2010/097155. The process is adapted to the circumstances described below (layer-thickness variation, materials).

The polymers according to the invention are used in two different layer sequences:

Structure A is as follows:
substrate,
ITO (50 nm),
PEDOT (80 nm),
interlayer (IL) (20 nm),
emission layer (80 nm),
electron-injection layer (EIL),
cathode.

Structure B is as follows;
substrate,
ITO (50 nm),
PEDOT (80 nm),
interlayer (IL) (20 nm),
emission layer (EML) (60 nm),
hole-blocking layer (HBL) (10 nm)
electron-transport layer (ETL) (40 nm),
cathode.

The substrate used is glass plates coated with structured ITO (indium tin oxide) in a thickness of 50 nm. For better processing, these are coated with PEDOT:PSS. The spin coating is carried out from water in air. The layer is dried by heating at 180° C. for 10 minutes. PEDOT:PSS is purchased from Heraeus Precious Metals GmbH & Co. KG, Germany. The interlayer and the emission layer are applied to these coated glass plates.

The interlayer used serves for hole injection (HIL). The compounds according to the invention and comparative compounds are used. The interlayer according to the invention is dissolved in toluene. The typical solids content of such solutions is about 5 g/l if, as here, the typical layer thickness of 20 nm for a device is to be achieved by means of spin coating. The layers are applied by spin coating in an inert-gas atmosphere, in the present case argon, and dried by heating at 180° C. or 220° C. for 60 minutes.

The emission layer is always composed of at least one matrix material (host material) and an emitting dopant (emitter). Furthermore, mixtures of a plurality of matrix materials and co-dopants may occur. An expression such as TMM-A (92%): dopant (8%) here means that material TMM-A is present in the emission layer in a proportion by weight of 92% and the dopant is present in the emission layer in a proportion by weight of 8%. The mixture for the emission layer is dissolved in toluene. The typical solids content of such solutions is about 18 g/l, if, as here, the typical layer thickness of 60 nm or 80 nm for a device is to be achieved by means of spin coating. The layers are applied by spin coating in an inert-gas atmosphere, in the present case argon, and dried by heating at 180° C. for 10 minutes. The materials used in the present case are shown in Table 22.

TABLE 22

Structural formulae of the materials used in the emission layer

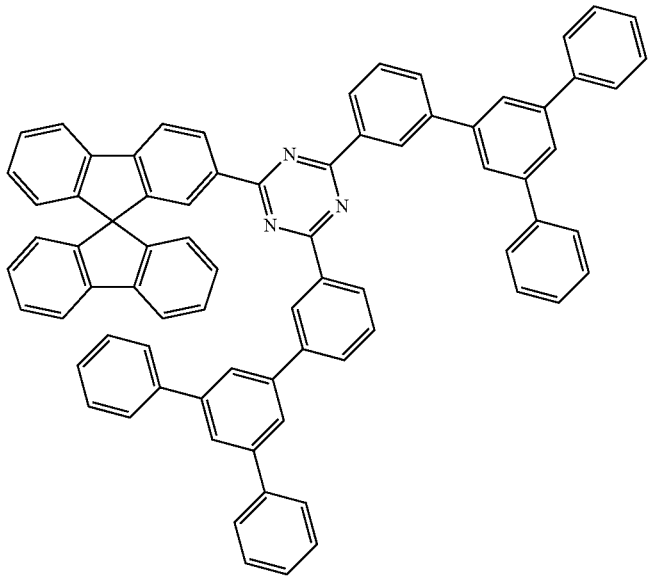 [SMILES: c1ccc(-c2cc(-c3ccccc3)cc(-c3cccc(-c4nc(-c5cccc(-c6cc(-c7ccccc7)cc(-c7ccccc7)c6)c5)nc(-c5ccc6c(c5)C5(c7ccccc7-c7ccccc75)c5ccccc5-6)n4)c3)c2)cc1]

TMM-A

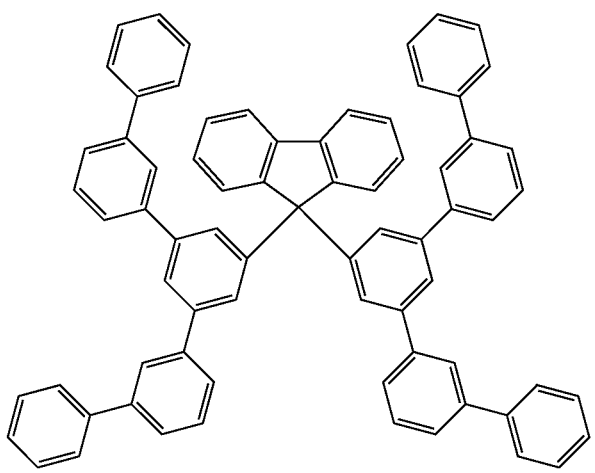 [SMILES: c1ccc(-c2cccc(-c3cc(-c4cccc(-c5ccccc5)c4)cc(C4(c5cc(-c6cccc(-c7ccccc7)c6)cc(-c6cccc(-c7ccccc7)c6)c5)c5ccccc5-c5ccccc54)c3)c2)cc1]

TMM-B

TABLE 22-continued
Structural formulae of the materials used in the emission layer
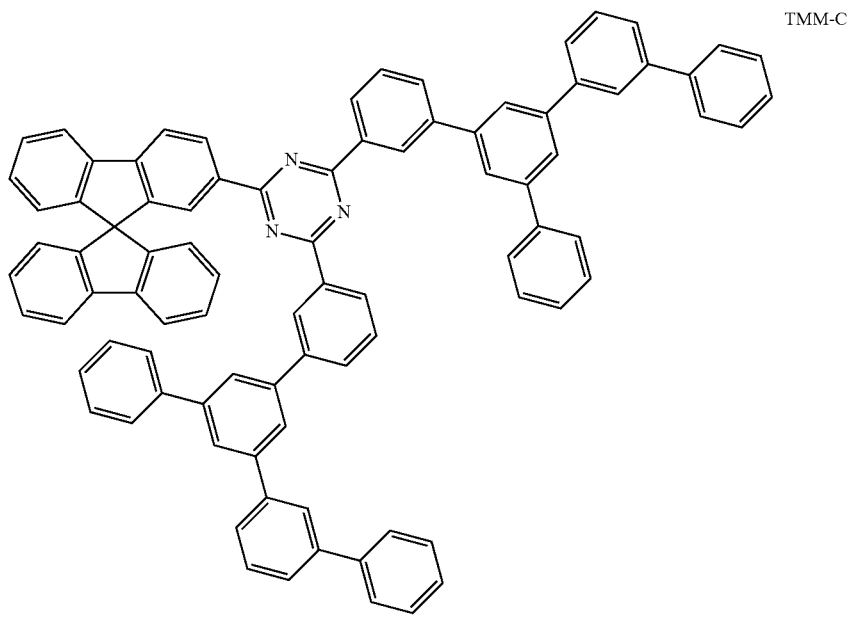
TMM-C
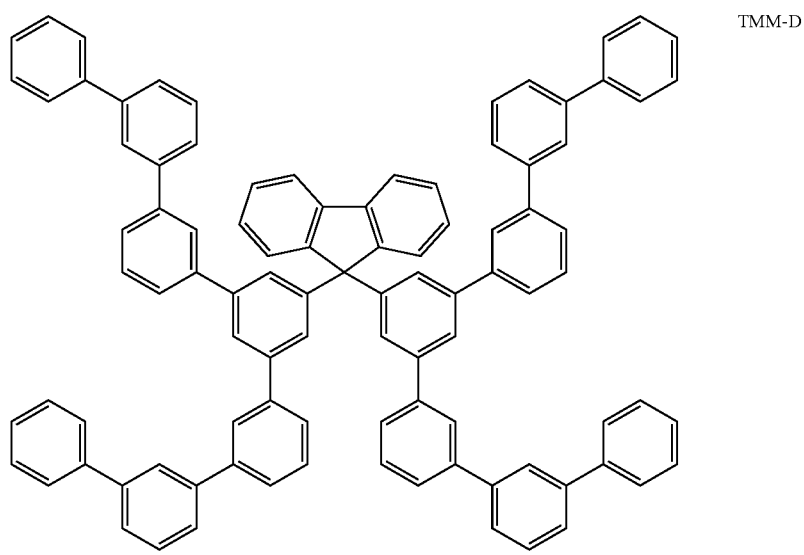
TMM-D
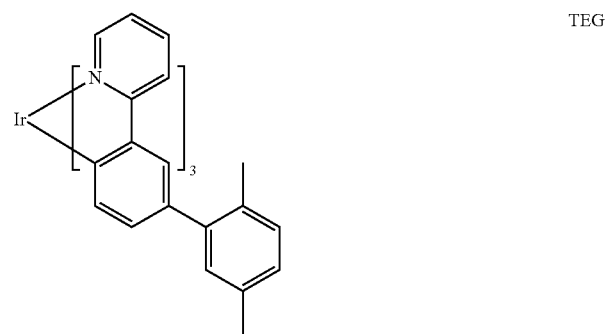
TEG TABLE 22-continued Structural formulae of the materials used in the emission layer

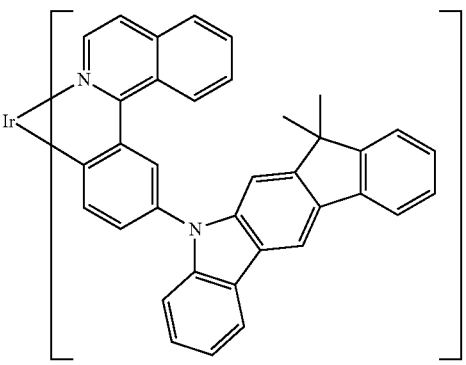

TER

In structure A, the electron-injection layer and the cathode are formed by a barium layer with a thickness of 3 nm and an aluminium layer with a thickness of 100 nm by thermal evaporation in a vacuum chamber.

The materials for the hole-blocking layer and electron-transport layer in structure B are likewise applied by thermal vapour deposition in a vacuum chamber. The electron-transport layer here can consist, for example, of more than one material which are admixed with one another in a certain proportion by volume by co-evaporation. An expression such as ETM1:ETM2 (50%:50%) here means that materials ETM1 and ETM2 are present in the layer in a proportion by volume of 50% each. The materials used in the present case are shown in Table 23.

TABLE 23

HBL and ETL materials used

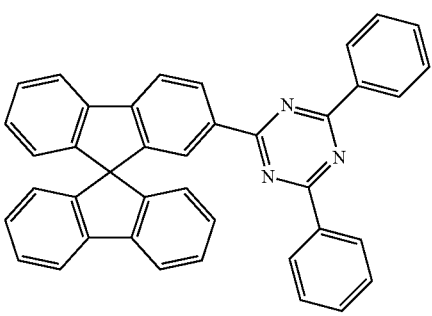 [SMILES: c1ccc(-c2nc(-c3ccccc3)nc(-c3ccc4c(c3)C3(c5ccccc5-c5ccccc53)c3ccccc3-4)n2)cc1] ETM1

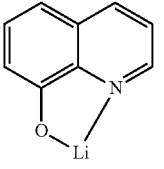 ETM2

The cathode is formed by thermal evaporation of an aluminium layer with a thickness of 100 nm.

The precise structure of the OLEDs is shown in Table 24. Column IL shows the polymer used, and the temperature at which the crosslinking is carried out.

TABLE 24

Structure of the OLEDs

| Example | IL Polymer | T [° C.] | EML Structure | Composition |
| --- | --- | --- | --- | --- |
| 48 | V2 | 180° C. | A | TMM-A 39%; TMM-B 39%; TEG 16%; TER 6% |
| 49 | Po1 | 220° C. | A | TMM-A 39%; TMM-B 39%; TEG 16%; TER 6% |
| 50 | Po7 | 220° C. | A | TMM-A 39%; TMM-B 39%; TEG 16%; TER 6% |
| 51 | Po5 | 220° C. | A | TMM-A 39%; TMM-B 39%; TEG 16%; TER 6% |
| 52 | Po2 | 220° C. | A | TMM-A 39%; TMM-B 39%; TEG 16%; TER 6% |
| 53 | Po3 | 180° C. | A | TMM-A 39%; TMM-B 39%; TEG 16%; TER 6% |
| 54 | V2 | 180° C. | B | TMM-C 30%; TMM-D 34%; TEG 30%; TER 6% |
| 55 | V2 | 180° C. | B | TMM-C 30%; TMM-D 55%; TEG 15% |
| 56 | Po3 | 180° C. | B | TMM-C 30%; TMM-D 34%; TEG 30%; TER 6% |
| 57 | Po20 | 180° C. | B | TMM-C 30%; TMM-D 34%; TEG 30%; TER 6% |
| 58 | Po21 | 220° C. | B | TMM-C 30%; TMM-D 34%; TEG 30%; TER 6% |
| 59 | Po5 | 220° C. | B | TMM-C 30%; TMM-D 55%; TEG 15% |
| 60 | Po23 | 220° C. | B | TMM-C 30%; TMM-D 34%; TEG 30%; TER 6% |
| 61 | Po25 | 180° C. | B | TMM-C 30%; TMM-D 55%; TEG 15% |
| 62 | Po26 | 220° C. | B | TMM-C 30%; TMM-D 55%; TEG 15% |
| 63 | Po33 | 220° C. | B | TMM-C 30%; TMM-D 34%; TEG 30%; TER 6% |
| 64 | Po22 | 180° C. | B | TMM-C 30%; TMM-D 55%; TEG 15% |
| 65 | Po24 | 180° C. | B | TMM-C 30%; TMM-D 55%; TEG 15% |
| 66 | Po37 | 180° C. | B | TMM-C 30%; TMM-D 34%; TEG 30%; TER 6% |
| 67 | Po38 | 180° C. | B | TMM-C 30%; TMM-D 55%; TEG 15% |
| 68 | Po39 | 180° C. | B | TMM-C 30%; TMM-D 34%; TEG 30%; TER 6% |

The OLEDs are characterised by standard methods. For this purpose, the electroluminescence spectra, current/voltage/luminous density characteristic lines (IUL characteristic lines) assuming Lambert emission characteristics and the (operating) lifetime are determined. From the IUL characteristic lines, characteristic numbers, such as the operating voltage (in V) and the efficiency (in cd/A) or the external quantum efficiency (in %) at a certain luminance, are determined. The electroluminescence spectra are measured at a luminous density of 1000 cd/m², and the CIE 1931 x and y colour coordinates are calculated therefrom.

LT50 @ 1000 cd/m² is the lifetime by which the OLED at a starting luminance of 1000 cd/m² has dropped to 50% of the initial intensity, i.e. to 500 cd/m². Correspondingly, LT80 @ 8000 cd/m² is the lifetime by which the OLED at a starting luminance of 8000 cd/m² has dropped to 80% of the initial intensity, i.e. to 6400 cd/m², and LT80 @ 10,000 cd/m² is the lifetime by which the OLED at a starting luminance of 10,000 cd/m² has dropped to 80% of the initial intensity, i.e. to 8000 cd/m².

The properties of the various OLEDs are summarised in Tables 25 a, b and c. Examples 48, 54 and 55 are comparative examples, all other examples show properties of OLEDs according to the invention.

Tables 25 a to c: Properties of the OLEDs

TABLE 25a

| Example | Efficiency at 1000 cd/m² [cd/A] | Voltage at 1000 cd/m² [V] | LT50 at 1000 cd/m² [h] |
|---|---|---|---|
| 48 | 10.82 | 6.32 | 13000 |
| 49 | 6.98 | 5.44 | 22000 |
| 50 | 8.13 | 5.44 | 21000 |
| 51 | 11.09 | 6.16 | 25000 |
| 52 | 11.01 | 6.05 | 24000 |
| 53 | 10.95 | 6.09 | 26000 |

TABLE 25b

| Example | Efficiency at 1000 cd/m² % EQE | Voltage at 1000 cd/m² [V] | LT80 at 8000 cd/m² [h] |
|---|---|---|---|
| 54 | 11.4 | 6.0 | 165 |
| 56 | 12.8 | 5.6 | 205 |
| 57 | 12.8 | 6.1 | 150 |
| 58 | 13.2 | 5.7 | 330 |
| 60 | 12.7 | 5.7 | 198 |
| 63 | 11.4 | 6.3 | 160 |
| 66 | 12.9 | 5.5 | 190 |
| 68 | 12.5 | 5.8 | 188 |

TABLE 25c

| Example | Efficiency at 1000 cd/m² % EQE | Voltage at 1000 cd/m² [V] | LT80 at 10 000 cd/m² [h] |
|---|---|---|---|
| 55 | 17.0 | 4.2 | 110 |
| 59 | 18.0 | 4.4 | 150 |
| 61 | 17.2 | 4.2 | 120 |
| 62 | 17.5 | 4.5 | 135 |
| 64 | 16.8 | 4.3 | 133 |
| 65 | 17.8 | 3.9 | 188 |
| 67 | 18.2 | 3.9 | 195 |

As shown by Tables 25 a to c, the polymers according to the invention give rise to improvements over the prior art, in particular with respect to lifetime and operating voltage, on use as interlayer (IL) in OLEDs. Red- and green-emitting OLEDs are produced with the materials according to the invention.

The invention claimed is:
1. A polymer comprising at least one structural unit of the following formula (I):

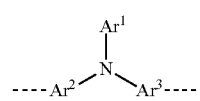

at least one structural unit of the following formula (II):

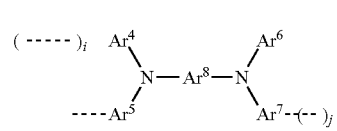

and at least one further structural unit of the following formula (III) which is different from structural units (I) and (II):

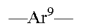

where $Ar^1$ to $Ar^8$ is on each occurrence, in each case identically or differently, a mono- or polycyclic, aromatic or heteroaromatic ring system, which may be substituted by one or more radicals R;

$Ar^9$ in formula (III) is selected from:

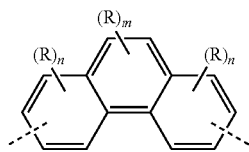

M7

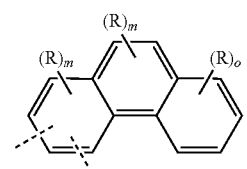

M8

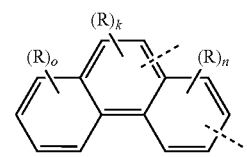

M9

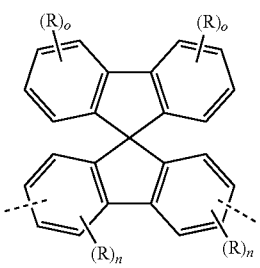

M12

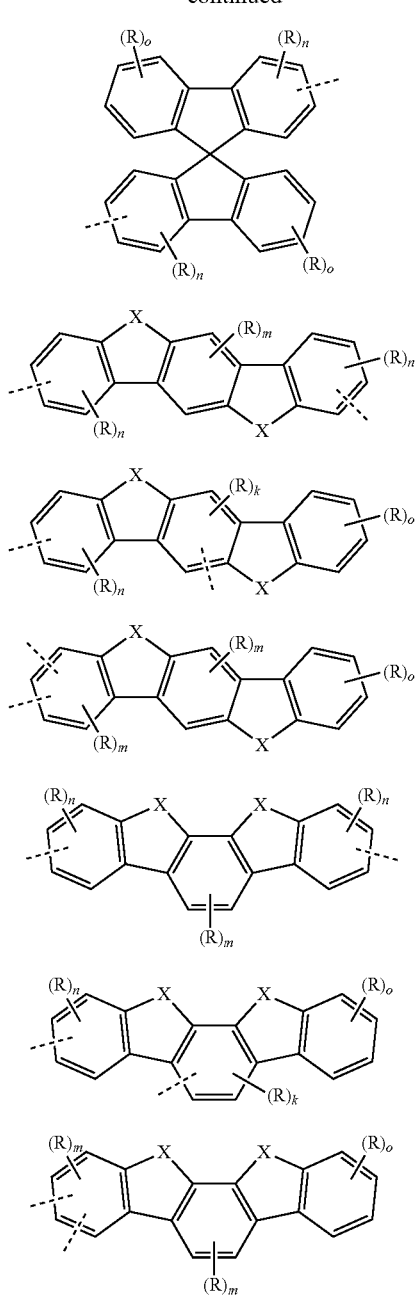

where,
X is $CR_2$, $SiR_2$, O or S,
and
the indices used have the following meaning:
k=0 or 1;
m=0, 1 or 2;
n=0, 1, 2 or 3; and
o=0, 1, 2, 3 or 4;
i and j is each 0 or 1, where the sum (i+j) =1;
R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may in each be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$; where two or more radicals R may also form a mono- or polycyclic, aliphatic, aromatic and/or benzo-fused ring system with one another;

$R^1$ is on each occurrence, identically or differently, H, D, F or an aliphatic, aromatic and/or heteroaromatic hydrocarbon radical having 1 to 20 C atoms, in which, in addition, one or more H atoms may be replaced by F; where two or more substituents $R^1$ may also form a mono- or polycyclic, aliphatic or aromatic ring system with one another; and the dashed lines represent bonds to adjacent structural units in the polymer and the dashed lines which are located in brackets represent possible bonds to adjacent structural units in the polymer;

characterised in that at least one of the structural units of the formula (I) and/or (II) contains at least one cross-linkable group Q.

2. The polymer according to claim 1, wherein the structural unit of the formula (II) corresponds either to the structural unit of the following formula (IIa):

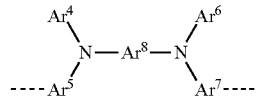
(IIa)

or to the structural unit of the following formula (IIb):

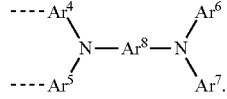
(IIb)

3. The polymer according to claim 1, wherein the proportion of structural units of the formulae (I) and (II) in the polymer is 100 mol %.

4. The polymer according to claim 1, wherein the proportion of structural units of the formulae (I) and (II) in the polymer is in the range from 25 to 75 mol %.

5. The polymer according to claim 1, wherein the polymer, besides structural units of the formulae (I), (II) and (III), also contains further structural units which are different from the structural units of the formulae (I), (II) and (III).

6. The polymer according to claim 1, wherein the mono- or polycyclic, aromatic or heteroaromatic groups Ar1 in formula (I), Ar4 and Ar6 in formula (IIa) and Ar6 and Ar7 in formula (IIb) are selected from:

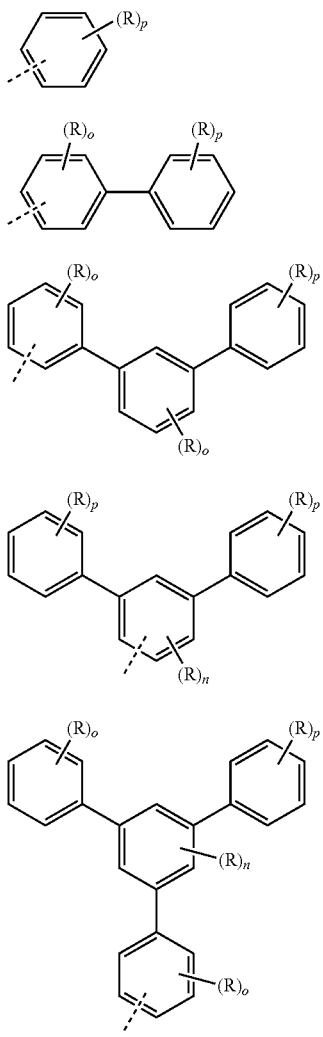
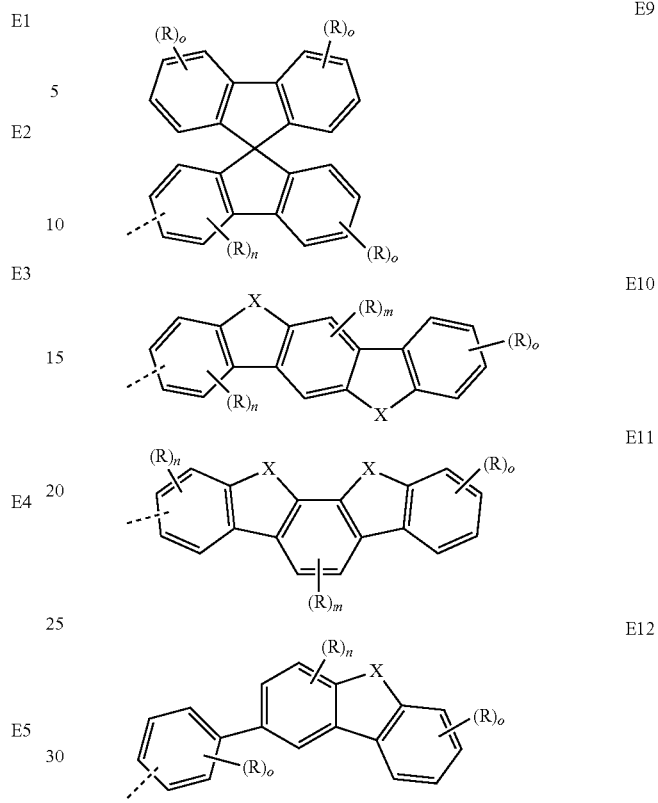
where
X is $CR_2$, $SiR_2$, NR, O or S, and
the indices used have the following meaning:
m=0, 1 or 2;
n=0, 1, 2 or 3;
o=0, 1, 2, 3 or 4; and
p=0, 1, 2, 3, 4 or 5.
7. The polymer according to claim 1, wherein the mono- or polycyclic, aromatic or heteroaromatic groups Ar2 and Ar3 in formula (I), Ar5, Ar7 and Ar8 in formula (IIa), Ar4, Ar5 and Ar8 in formula (IIb), are selected from:
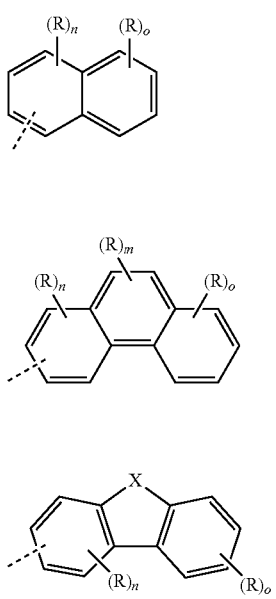
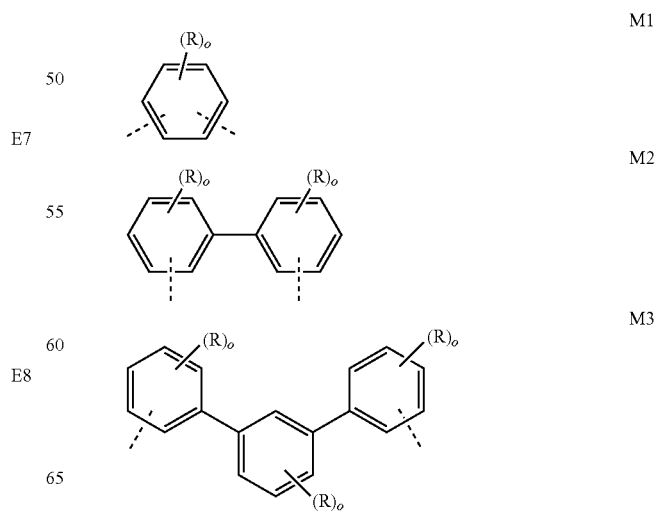

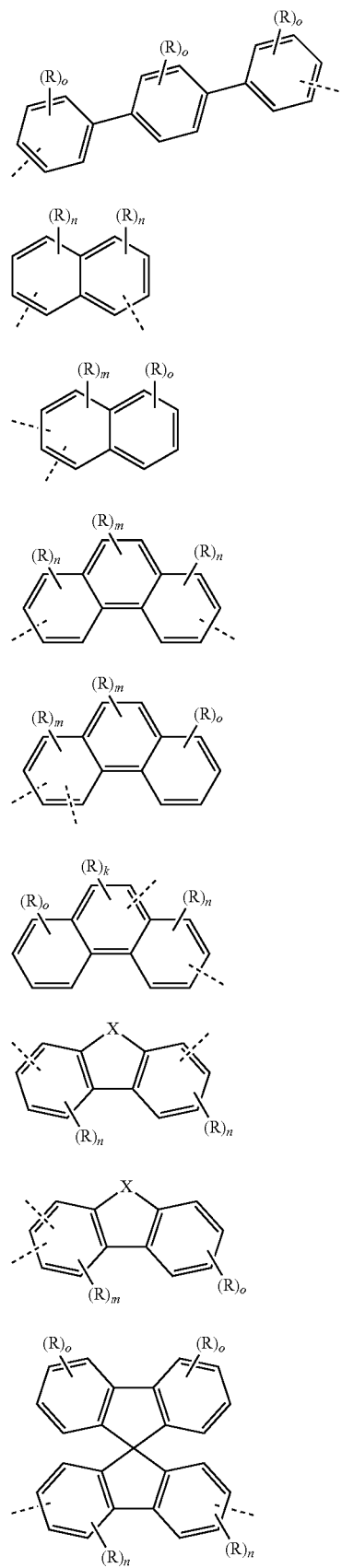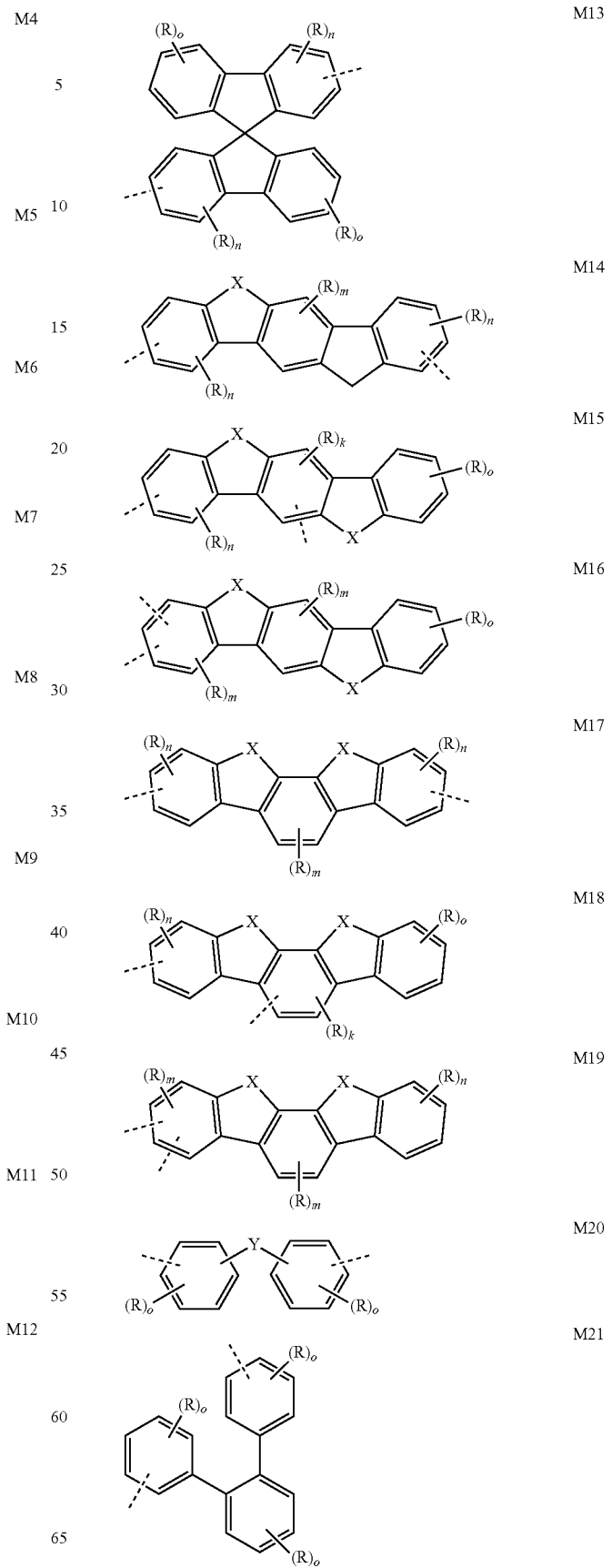

-continued

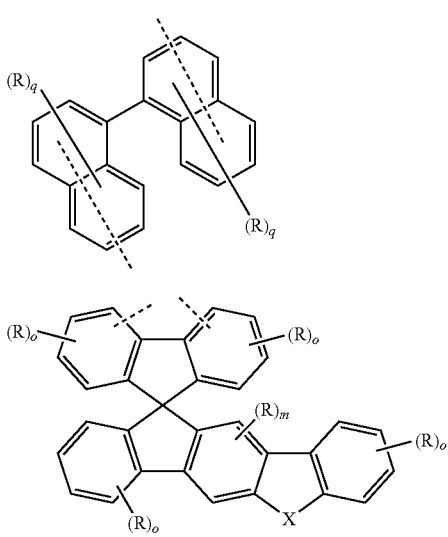 M22

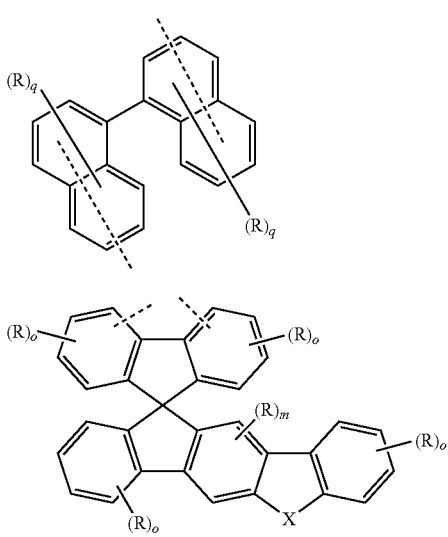 M23 where,

X is $CR_2$, $SiR_2$, O or S,

Y is $CR_2$, $SiR_2$, O, S or a straight-chain or branched alkyl group having 1 to 20 C atoms or an alkenyl or alkynyl group having 2 to 20 C atoms, each of which may be substituted by one or more radicals $R^1$, where one or more non-adjacent $CH_2$ groups, CH groups or C atoms of the alkyl, alkenyl or alkynyl groups may be replaced by $Si(R^1)_2$, C=O, C=S, C=$NR^1$, P(=O)($R^1$), SO, $SO_2$, $NR^1$, O, S, $CONR^1$, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, where here too the radicals R and $R^1$ can adopt the same meanings as the radicals R and $R^1$ in the formulae (I) and (II), and the indices used have the following meaning:

k=0 or 1;

m=0, 1 or 2;

n=0, 1, 2 or 3;

o=0, 1, 2, 3 or 4; and q=0, 1, 2, 3, 4, 5 or 6.

8. The polymer according to claim 1, wherein the cross-linkable group Q is selected from:

terminal or cyclic alkenyl or terminal dienyl and alkynyl groups, alkenyloxy, dienyloxy or alkynyloxy groups, acrylic acid groups, oxetane and oxirane groups, silane groups, and cyclobutane groups.

9. The polymer according to claim 8, wherein the cross-linkable group Q is selected from:

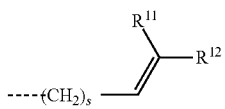 Q1

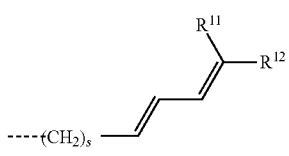 Q2

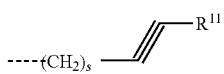 Q3

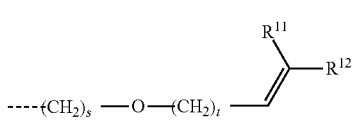 Q4

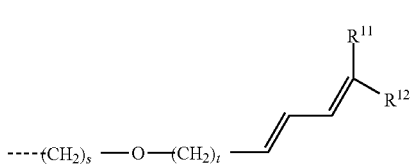 Q5

 Q6

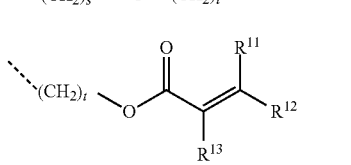 Q7

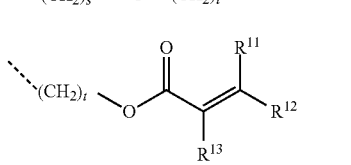 Q8

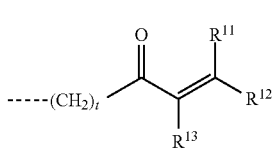 Q9

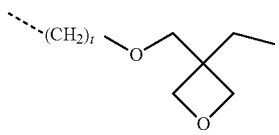 Q10

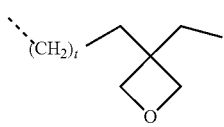 Q11

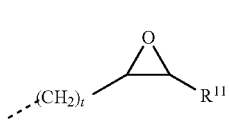 Q12

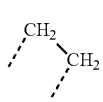 Q12

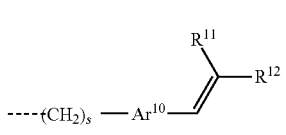 Q13

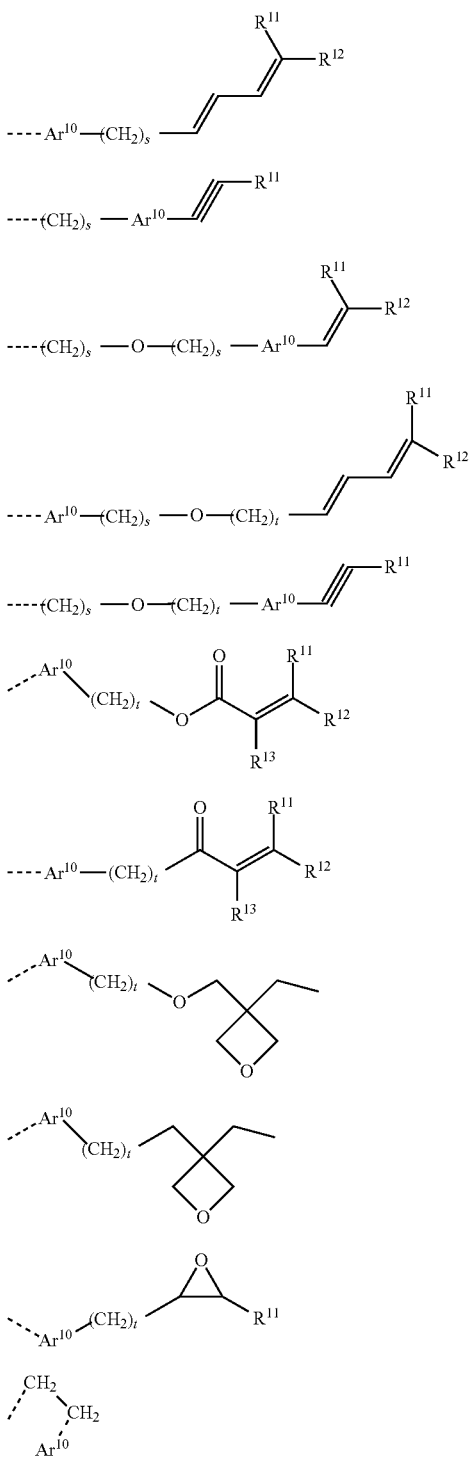

where
the radicals $R^{11}$, $R^{12}$ and $R^{13}$ in the formulae Q1 to Q8, Q11, Q13 to Q20 and Q23 are on each occurrence, identically or differently, H, a straight-chain or branched alkyl group having 1 to 6 C atoms;
the indices used have the following meaning:
$Ar^{10}$ is a mono- or polycyclic, aromatic or heteroaromatic ring system, which may be substituted by one or more radicals R;

s=0 to 8;
t=1 to 8; and
the dashed bond in the formulae Q1 to Q11 and Q13 to Q23 and the dashed bonds in the formulae Q12 and Q24 represent the linking of the crosslinkable group to one of the mono- or polycyclic, aromatic or heteroaromatic ring systems $Ar^1$ to $Ar^8$.

10. The polymer according to claim 1, wherein the proportion of structural units of the formula (I) in the polymer is in the range from 1 to 99 mol %, based on 100 mol% of all copolymerised monomers present as structural units in the polymer.

11. The polymer according to claim 1, wherein the proportion of structural units of the formula (II) in the polymer is in the range from 1 to 99 mol %, based on 100 mol % of all copolymerised monomers present as structural units in the polymer.

12. The polymer according to claim 1, wherein the proportion of structural units of the formula (I) and/or (II) which contain a crosslinkable group Q in the polymer is in the range from 0.1 to 50 mol %, based on 100 mol % of all copolymerised monomers present as structural units in the polymer.

13. A process for the preparation of a polymer according to claim 1 comprising preparing the polymer by SUZUKI polymerisation, YAMAMOTO polymerisation, STILLE polymerisation or HARTWIG-BUCHWALD polymerisation.

14. A polymer blend comprising one or more crosslinkable polymers according to claim 1 which comprising at least one structural unit of the formula (I), at least one structural unit of the formula (II) and at least one structural unit of the formula (III), where at least one structural unit of the formulae (I) and/or (II) contains at least one crosslinkable group Q, and one or more further polymeric, oligomeric, dendritic and/or low-molecular-weight substances.

15. A solutions or formulation comprising one or more crosslinkable poly-mers according to claim 1 in one or more solvents.

16. A solutions or formulation comprising one or more polymer blends according to claim 14 in one or more solvents.

17. A method for the preparation of a crosslinked polymer comprising utilizing a crosslinkable polymer according to claim 1 which comprises at least one structural unit of the formula (I), at least one structural unit of the formula (II) and at least one structural unit of the formula (III), where at least one structural unit of the formulae (I) and/or (II) contains at least one crosslinkable group Q.

18. A process for the preparation of a crosslinked polymer which comprises the following steps:
(a) providing the crosslinkable polymer according to claim 1 comprising at least one structural unit of the formula (I), at least one structural unit of the formula (II) and at least one structural unit of the formula (III), where at least one structural unit of the formulae (I) and/or (II) contains at least one crosslinkable group Q; and
(b) free-radical or ionic crosslinking of the crosslinkable polymer, which can be induced both thermally and also by radiation.

19. A crosslinked polymer, obtained by the process according to claim 17.

20. A method comprising utilizing the crosslinked polymer according to claim 18 in electronic or opto-electronic devices, preferably in organic electroluminescent devices (OLED), organic light-emitting electrochemical cells (OLEC), organic field-effect transistors (OFET), organic integrated circuits (O-IC), organic thin-film transistors (TFT), organic solar cells (O-SC), organic laser diodes (O-lasers), organic photovoltaic (OPV) elements or devices or organic photoreceptors (OPC), particularly preferably in organic electroluminescent devices (OLED).

21. An electronic or opto-electronic component comprising one or more active layers, wherein at least one of the active layers comprises one or more crosslinked polymers according to claim 18.

* * * * *